(12) United States Patent
Nakajiki et al.

(10) Patent No.: US 11,069,730 B2
(45) Date of Patent: Jul. 20, 2021

(54) SOLID-STATE IMAGING APPARATUS, METHOD FOR MANUFACTURING THE SAME, AND ELECTRONIC DEVICE

(71) Applicant: SONY SEMICONDUCTOR SOLUTIONS CORPORATION, Kanagawa (JP)

(72) Inventors: Sintaro Nakajiki, Kumamoto (JP); Yukihiro Sayama, Kumamoto (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/326,806

(22) PCT Filed: Aug. 31, 2017

(86) PCT No.: PCT/JP2017/031394
§ 371 (c)(1),
(2) Date: Feb. 20, 2019

(87) PCT Pub. No.: WO2018/043654
PCT Pub. Date: Mar. 8, 2018

(65) Prior Publication Data
US 2019/0206917 A1 Jul. 4, 2019

(30) Foreign Application Priority Data

Sep. 2, 2016 (JP) .............................. JP2016-171862
Aug. 24, 2017 (JP) .............................. JP2017-160855

(51) Int. Cl.
*H01L 27/146* (2006.01)
*H04N 9/07* (2006.01)
(Continued)

(52) U.S. Cl.
CPC ........ *H01L 27/14621* (2013.01); *G02B 5/201* (2013.01); *G02B 5/208* (2013.01);
(Continued)

(58) Field of Classification Search
None
See application file for complete search history.

(56) References Cited

U.S. PATENT DOCUMENTS

| 5,453,611 A | 9/1995 | Oozu et al. |
| 5,801,373 A | 9/1998 | Oozu et al. |

(Continued)

FOREIGN PATENT DOCUMENTS

| JP | H06-217079 | 8/1994 |
| JP | 2009-158944 | 7/2009 |

(Continued)

OTHER PUBLICATIONS

International Search Report prepared by the Japan Patent Office dated Sep. 26, 2017, for International Application No. PCT/JP2017/031394.

(Continued)

*Primary Examiner* — Xiaoming Liu
(74) *Attorney, Agent, or Firm* — Sheridan Ross P C.

(57) ABSTRACT

The present technology relates to a solid-state imaging apparatus capable of suppressing occurrence of color mixing, a method for manufacturing the solid-state imaging apparatus, and an electronic device. The solid-state imaging apparatus includes a plurality of pixels arranged in a pixel region. Each of the pixels has: a first optical filter layer disposed on a photoelectric conversion unit; a second optical filter layer disposed on the first optical filter layer; and a separation wall separating at least a part of the first optical filter layer for each of the pixels. Either the first optical filter layer or the second optical filter layer in at least one of the pixels is formed by an infrared cut filter, while the other is formed by a color filter. The present technology can be applied to a CMOS image sensor including a visible light pixel.

20 Claims, 66 Drawing Sheets

(51) Int. Cl.
  *G02B 5/20* (2006.01)
  *G02B 5/22* (2006.01)
  *H04N 5/374* (2011.01)

(52) U.S. Cl.
  CPC ............ *G02B 5/223* (2013.01); *H01L 27/146*
    (2013.01); *H01L 27/1463* (2013.01); ***H01L
    27/14627* (2013.01); *H01L 27/14643***
    (2013.01); *H01L 27/14689* (2013.01); ***H04N
    5/374* (2013.01); *H04N 9/07*** (2013.01)

(56) References Cited

U.S. PATENT DOCUMENTS

| | | | | |
|---|---|---|---|---|
| 6,010,824 | A * | 1/2000 | Komano | G03F 7/0295 |
| | | | | 430/281.1 |
| 9,425,227 | B1 * | 8/2016 | Wang | H01L 27/14649 |
| 2007/0237888 | A1 * | 10/2007 | Liu | H01L 27/14643 |
| | | | | 427/58 |
| 2011/0037854 | A1 | 2/2011 | Godaiin | |
| 2012/0243077 | A1 * | 9/2012 | Osawa | G02B 3/0056 |
| | | | | 359/356 |
| 2012/0262654 | A1 | 10/2012 | Moriwaki | |
| 2012/0267745 | A1 | 10/2012 | Tsuji | |
| 2012/0273906 | A1 * | 11/2012 | Mackey | H01L 31/02327 |
| | | | | 257/432 |
| 2015/0187826 | A1 | 7/2015 | Suzuki | |
| 2015/0293281 | A1 * | 10/2015 | Ezoe | C09D 201/00 |
| | | | | 359/360 |
| 2015/0311245 | A1 * | 10/2015 | Yamazaki | H01L 27/1225 |
| | | | | 257/43 |
| 2016/0056187 | A1 * | 2/2016 | Lin | H01L 27/14621 |
| | | | | 257/432 |
| 2016/0099272 | A1 | 4/2016 | Wang | |
| 2016/0099280 | A1 | 4/2016 | Huang et al. | |
| 2016/0104735 | A1 * | 4/2016 | Li | H01L 27/14627 |
| | | | | 257/432 |
| 2017/0005120 | A1 | 1/2017 | Wasaki | |
| 2017/0062498 | A1 | 3/2017 | Suzuki | |

FOREIGN PATENT DOCUMENTS

| | | |
|---|---|---|
| JP | 2012-226032 | 11/2012 |
| JP | 2012-227478 | 11/2012 |
| JP | 2015-046539 | 3/2015 |
| JP | 2016-076682 | 5/2016 |
| JP | 2016-146619 | 8/2016 |
| WO | WO 2014/021115 | 2/2014 |
| WO | WO 2016/080003 | 5/2016 |

OTHER PUBLICATIONS

Extended European Search Report for European Patent Application No. 17846658.7, dated Nov. 5, 2019, 10 pages.
Partial Supplementary European Search Report for European Patent Application No, 17848658.7, dated Jul. 31, 2019, 12 pages.

* cited by examiner

SOLID-STATE IMAGING APPARATUS, METHOD FOR MANUFACTURING THE SAME, AND ELECTRONIC DEVICE

CROSS REFERENCE TO RELATED APPLICATIONS

This application is a national stage application under 35 U.S.C. 371 and claims the benefit of PCT Application No. PCT/JP2017/031394 having an international filing date of 31 Aug. 2017, which designated the United States, which PCT application claimed the benefit of Japanese Patent Application Nos. 2016-171862 filed 2 Sep. 2016 and 2017-160855 filed 24 Aug. 2017, the entire disclosures of each of which are incorporated herein by reference.

TECHNICAL FIELD

The present technology relates to a solid-state imaging apparatus, a method for manufacturing the solid-state imaging apparatus, and an electronic device, and particularly to a solid-state imaging apparatus capable of suppressing occurrence of color mixing, a method for manufacturing the solid-state imaging apparatus, and an electronic device.

BACKGROUND ART

Conventionally, a solid-state imaging apparatus that performs imaging using visible light and imaging using infrared light is known.

In such a solid-state imaging apparatus, an infrared light pixel can be formed, for example, by overlapping red (R) and blue (B) color filters. In this case, all the pixels (visible light pixel and infrared light pixel) have substantia the same transmittance in an infrared light region with a wavelength of 700 nm or more. As a result, color mixing occurs between the visible light pixel and the infrared light pixel, and color separation and S/N deteriorate.

Meanwhile, for example, Patent Document 1 discloses forming an infrared cut filter below a color filter of a visible light pixel. This infrared cut filter is formed by a multilayer interference film obtained by alternately laminating a substance having a high refractive index and a substance having a low refractive index.

CITATION LIST

Patent Document

Patent Document 1: Japanese Patent Application Laid-Open No. 2009-18944

SUMMARY OF THE INVENTION

Problems to be Solved by the Invention

However, in the infrared cut filter of Patent Document 1, a transmission distribution of infrared light depends on an incident angle, or the number of steps increases to raise a difficulty level of a process.

The present technology has been achieved in view of such a situation, and suppresses occurrence of color mixing between pixels while a transmission distribution of infrared light does not depend on an incident angle, and the number of steps does not increase to raise a difficulty level of a process.

Solutions to Problems

A solid-state imaging apparatus of the present technology includes a plurality of pixels arranged in a pixel region. Each of the pixels has: a first optical filter layer disposed on a photoelectric conversion unit; a second optical filter layer disposed on the first optical filter layer; and a separation wall separating at least a part of the first optical filter layer for each of the pixels. Either the first optical filter layer or the second optical filter layer in at least one of the pixels is formed by an infrared cut filter, while the other is formed by a color filter.

A method for manufacturing a solid-state imaging apparatus according to the present technology is a method for manufacturing a solid-state imaging apparatus including a plurality of pixels arranged in a pixel region, each of the pixels having: a first optical filter layer disposed on a photoelectric conversion unit; a second optical filter layer disposed on the first optical filter layer; and a separation wall separating at least a part of the first optical filter layer for each of the pixels, the method including: forming the separation wall; forming the first optical filter layer; and forming the second optical filter layer, in which either the first optical filter layer or the second optical filter layer in at least one of the pixels is formed by an infrared cut filter, while the other is formed by a color filter.

An electronic device of the present technology includes a solid-state imaging apparatus including a plurality of pixels arranged in a pixel region, in which each of the pixels has: a first optical filter layer disposed on a photoelectric conversion unit; a second optical filter layer disposed on the first optical filter layer; and a separation wall separating at least a part of the first optical filter layer for each of the pixels, and either the first optical filter layer or the second optical filter layer in at least one of the pixels is formed by an infrared cut filter, while the other is formed by a color filter.

The present technology includes a plurality of pixels arranged in a pixel region. Each of the pixels has: a first optical filter layer disposed on a photoelectric conversion unit; a second optical filter layer disposed on the first optical filter layer; and a separation wall separating at least a part of the first optical filter layer for each of the pixels. Either the first optical filter layer or the second optical filter layer in at least one of the pixels is formed by an infrared cut filter, while the other is formed by a color filter.

Effects of the Invention

According to the present technology, occurrence of color mixing between pixels can be suppressed. Note that the effects described here are not necessarily limited, and may be any of the effects described in the present disclosure.

MODE FOR CARRYING OUT THE INVENTION

Figure 1:
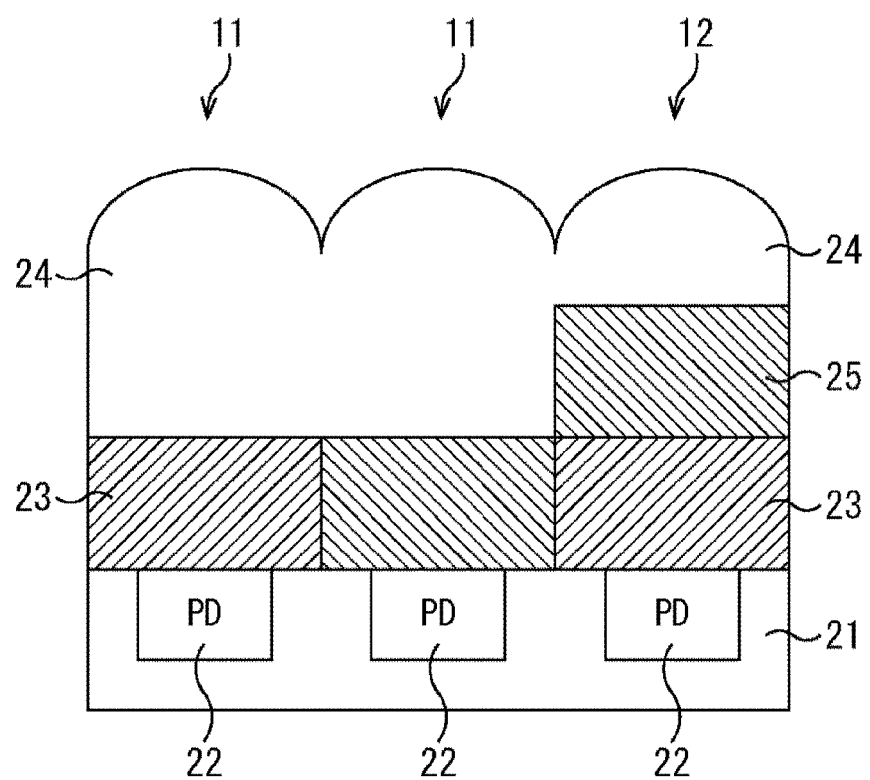
FIG. 1 is a cross-sectional view illustrating a configuration example of a pixel in a conventional solid-state imaging apparatus.

Hereinafter, embodiments of the present technology will be described with reference to the drawings. Note that in the present specification and the drawings, the same reference numerals are given to constituent elements having substantially the same functional configuration, and redundant explanation is omitted. Furthermore, description will be given in the following order.

1. Configuration of conventional solid-state imaging apparatus
2. Configuration example of solid-state imaging apparatus of the present technology
3. First embodiment (solid-state imaging apparatus including visible light pixel and infrared light pixel)
4. Second embodiment (solid-state imaging apparatus including only visible light pixel)
5. Application example of the present technology
6. Configuration example of electronic device
7. Use example of image sensor
8. Application example to endoscopic surgical system
9. Application example to mobile body

1. Configuration of Conventional Solid-State Imaging Apparatus

FIG. 1 is a cross-sectional view illustrating a configuration example of a pixel in a conventional solid-state imaging apparatus including a visible light pixel and an infrared light pixel. The solid-state imaging apparatus of FIG. 1 is constituted as, for example, a complementary metal oxide semiconductor (CMOS) image sensor.

FIG. 1 illustrates a cross-sectional view of a visible light pixel 11 and an infrared light pixel 12. The visible light pixel 11 is constituted as, for example, three types of pixels of a red (R) pixel, a green (G) pixel, and a blue (B) pixel.

In the visible light pixel 11, a photoelectric conversion unit 22 constituted by a photodiode (PD) that receives incident light and performs photoelectric conversion is formed in a semiconductor substrate 21. On the semiconductor substrate 21, an insulating layer (not illustrated) including SiO or the like, a wiring layer (not illustrated) including Cu or Al, and the like are formed. On the insulating layer, a color filter 23 having spectral characteristics corresponding to each of the visible light pixels 11 is formed. On the color filter 23, a microlens 24 is formed.

Meanwhile, also in the infrared light pixel 12, the semiconductor substrate 21, the photoelectric conversion unit 22, an insulating layer and a wiring layer (not illustrated), the color filter 23, and the microlens 24 are formed similarly to the visible light pixel 11. Moreover, in the infrared light pixel 12, a color filter 25 is formed between the color filter 23 and the microlens 24.

In this way, the infrared light pixel 12 is formed by overlapping two color filters of R and B, for example.

Figure 2:
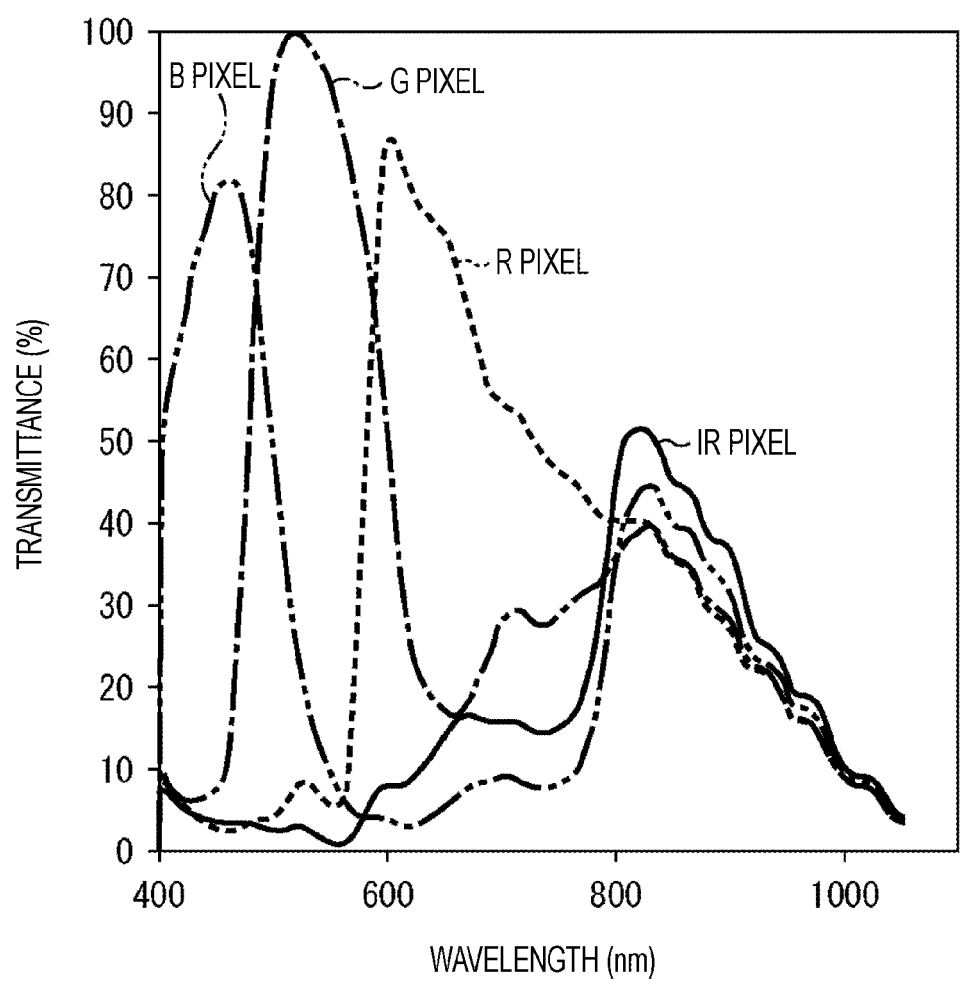
FIG. 2 is a diagram illustrating spectral characteristics of a visible light pixel and an infrared light pixel.

However, in such a configuration, as illustrated in FIG. 2, all the pixels (R pixel, G pixel, B pixel, and infrared light pixel (IR pixel)) have substantially the same transmittance in an infrared light region with a wavelength of 700 nm or more. As a result, color mixing occurs between the visible light pixel and the infrared light pixel, and color separation and S/N deteriorate.

Therefore, in the following description, a configuration of a solid-state imaging apparatus suppressing occurrence of color mixing between a visible light pixel and an infrared light pixel will be described.

Figure 3:
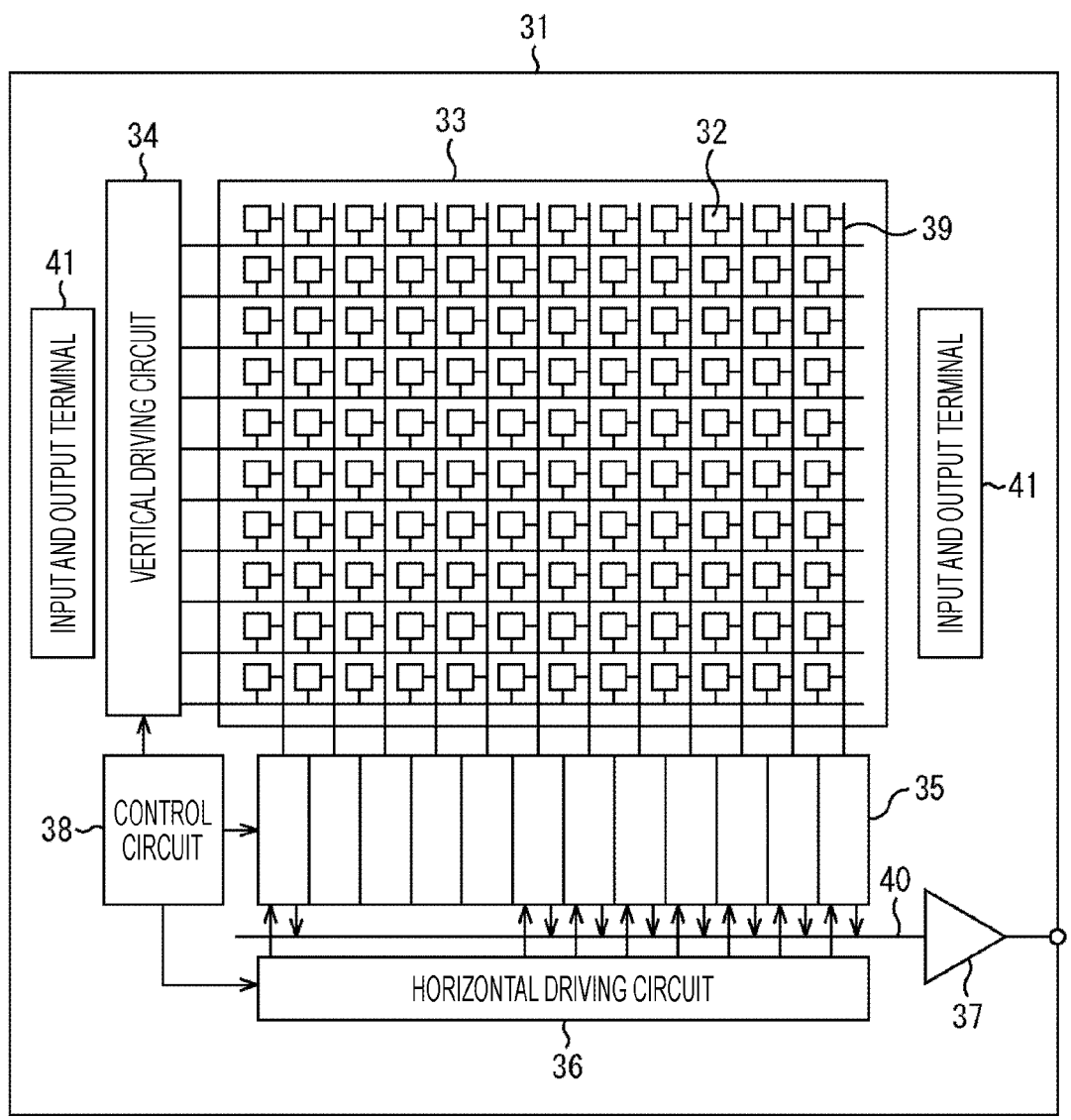
FIG. 3 is a block diagram illustrating a configuration example of a solid-state imaging apparatus of the present technology.

2. Configuration Example of Solid-State Imaging Apparatus of the Present Technology FIG. 3 is a block diagram illustrating a configuration example of a solid-state imaging apparatus of the present technology.

A solid-state imaging apparatus 31 is constituted as a CMOS image sensor. The solid-state imaging apparatus 31 includes a pixel region (pixel array) 33 in which a plurality of pixels 32 is regularly arranged in a two-dimensional array on a semiconductor substrate (for example, a Si substrate) (not illustrated) and a peripheral circuit unit.

Each of the pixels 32 includes a photoelectric conversion unit (for example, a photodiode), and a plurality of pixel transistors (MOS transistors). The plurality of pixel transistors can be constituted by, for example, three transistors of a transfer transistor, a reset transistor, and an amplification transistor. Furthermore, the plurality of pixel transistors can be constituted by four transistors obtained by adding a selection transistor. Note that an equivalent circuit of a unit pixel is similar to a general equivalent circuit, and therefore detailed description thereof will be omitted.

Furthermore, the pixels 32 can be constituted as one unit pixel or a shared pixel structure. In this pixel sharing structure, a plurality of photodiodes shares a floating diffusion and a transistor other than the transfer transistor.

The peripheral circuit unit includes a vertical driving circuit 34, a column signal processing circuit 35, a horizontal driving circuit 36, an output circuit 37, and a control circuit 38.

The control circuit 38 receives data giving a command of an input clock, an operation mode, or the like, and outputs data of internal information or the like of the solid-state imaging apparatus 31. Furthermore, the control circuit 38 generates a clock signal and a control signal serving as references for operations of the vertical driving circuit 34, the column signal processing circuit 35, the horizontal driving circuit 36, and the like on the basis of a vertical synchronization signal, a horizontal synchronization signal, and a master clock. Then, the control circuit 38 inputs these signals to the vertical driving circuit 34, the column signal processing circuit 35, the horizontal driving circuit 36, and the like.

The vertical driving circuit 34 is constituted by, for example, a shift register. The vertical driving circuit 34 selects pixel driving wiring, supplies a pulse for driving pixels to the selected pixel driving wiring, and drives the pixels in units of rows. In other words, the vertical driving circuit 34 sequentially selects and scans each of the pixels 32 in the pixel region 33 in a vertical direction in units of rows. Then, the vertical driving circuit 34 supplies a pixel signal based on a signal charge generated in accordance with the amount of light received in a photoelectric conversion unit of each of the pixels 32 to the column signal processing circuit 35 through a vertical signal line 39.

The column signal processing circuit 35 is disposed, for example, for each column of the pixels 32. The column signal processing circuit 35 performs signal processing such as removal of a noise for a signal output from the pixels 32 in one row for each of the pixel columns. Specifically, the column signal processing circuit 35 performs signal processing such as correlated double sampling (CDS) for removing a fixed pattern noise peculiar to the pixels 32, signal amplification, or analog/digital (A/D) conversion. In an output stage of the column signal processing circuit 35, a horizontal selection switch (not illustrated) is connected and disposed between the column signal processing circuit 35 and a horizontal signal line 40.

The horizontal driving circuit 36 is constituted by, for example, a shift register. The horizontal driving circuit 36 sequentially selects each of the column signal processing circuits 35 by sequentially outputting a horizontal scan pulse, and causes each of the column signal processing circuits 35 to output a pixel signal to the horizontal signal line 40.

The output circuit 37 performs signal processing on a signal sequentially supplied from each of the column signal processing circuits 35 through the horizontal signal line 40, and outputs the processed signal. For example, the output circuit 37 performs only buffering, or performs black level adjustment, column variation correction, various types of digital signal processing, and the like.

An input and output terminal 41 exchanges a signal with the outside.

3. First Embodiment

In a solid-state imaging apparatus 31 according to a first embodiment of the present technology, as a plurality of pixels 32 arranged in a pixel region 33, a visible light pixel and an infrared light pixel are disposed.

Figure 4:
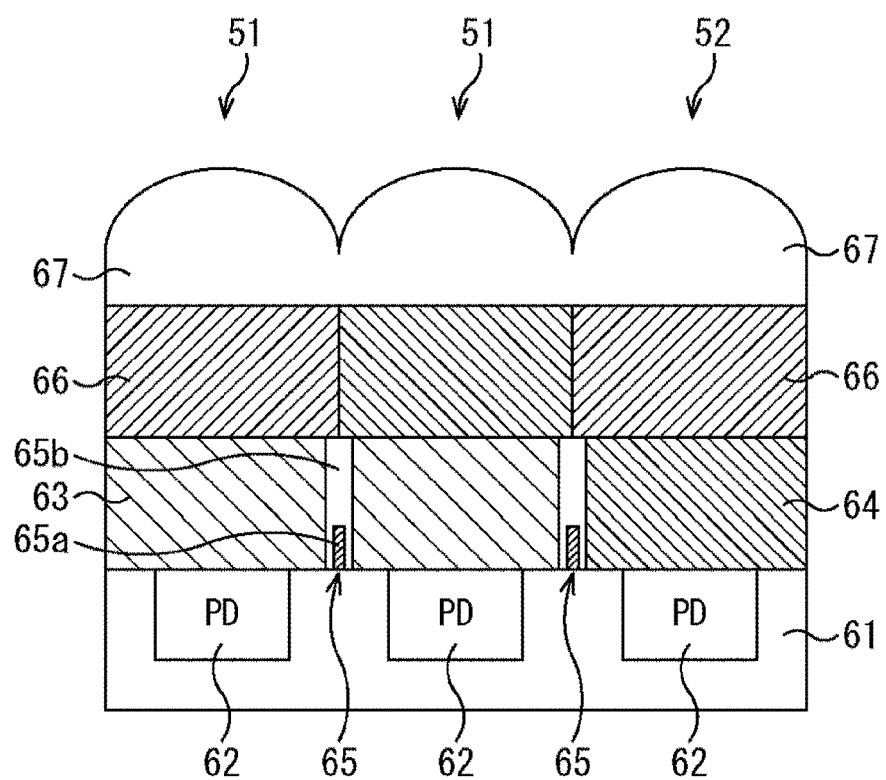
FIG. 4 is a cross-sectional view illustrating a configuration example of a pixel in a solid-state imaging apparatus according to a first embodiment of the present technology.

FIG. 4 is a cross-sectional view illustrating a configuration example of a pixel in the solid-state imaging apparatus 31 according to the first embodiment of the present technology. FIG. 4 illustrates a cross-sectional view of a visible light pixel 51 and an infrared light pixel 52 in the solid-state imaging apparatus 31. The visible light pixel 51 is constituted as, for example, three types of pixels of a red (R) pixel, a green (G) pixel, and a blue (B) pixel.

In the visible light pixel 51, a photoelectric conversion unit 62 constituted by a photodiode (PD) that receives incident light and performs photoelectric conversion is formed on a semiconductor substrate 61. On the semiconductor substrate 61, an insulating layer (not illustrated) including SiO or the like, a wiring layer (not illustrated) including Cu or Al, and the like are formed. On the insulating layer, an infrared cut filter 63 is formed as a first optical filter layer. On the infrared cut filter 63, a color filter 66 having spectral characteristics corresponding to each of the visible light pixels 51 is formed as a second optical filter layer. On the color filter 66, a microlens 67 is formed.

In the infrared light pixel 52, the photoelectric conversion unit 62 is formed on the semiconductor substrate 61. On the semiconductor substrate 61, an insulating layer, a wiring layer, and the like (not illustrated) are formed. On the insulating layer, for example, a blue (B) color filter 64 is formed as a first optical filter layer. On the color filter 64, for example, the red (R) color filter 66 is formed as a second optical filter layer. On the color filter 66, the microlens 67 is formed. Each of the color filter 64 and the color filter 66 is formed by a color filter that transmits infrared light, and a combination of the two color filters can reduce a transmittance of light in a visible light region.

Furthermore, each of the pixels (visible light pixel 51 and infrared light pixel 52) has a separation wall 65 separating the first optical filter layer for each of the pixels. The separation wall 65 includes a metal film 65a including W, Al, or the like, and a Si oxide film 65b including SiO2, SiN, or the like. In the example of FIG. 4, the height of the separation wall 65 is the same as the height of the first optical filter layer (infrared cut filter 63 or color filter 64).

Here, a planar arrangement of pixels will be described.

Figure 5:
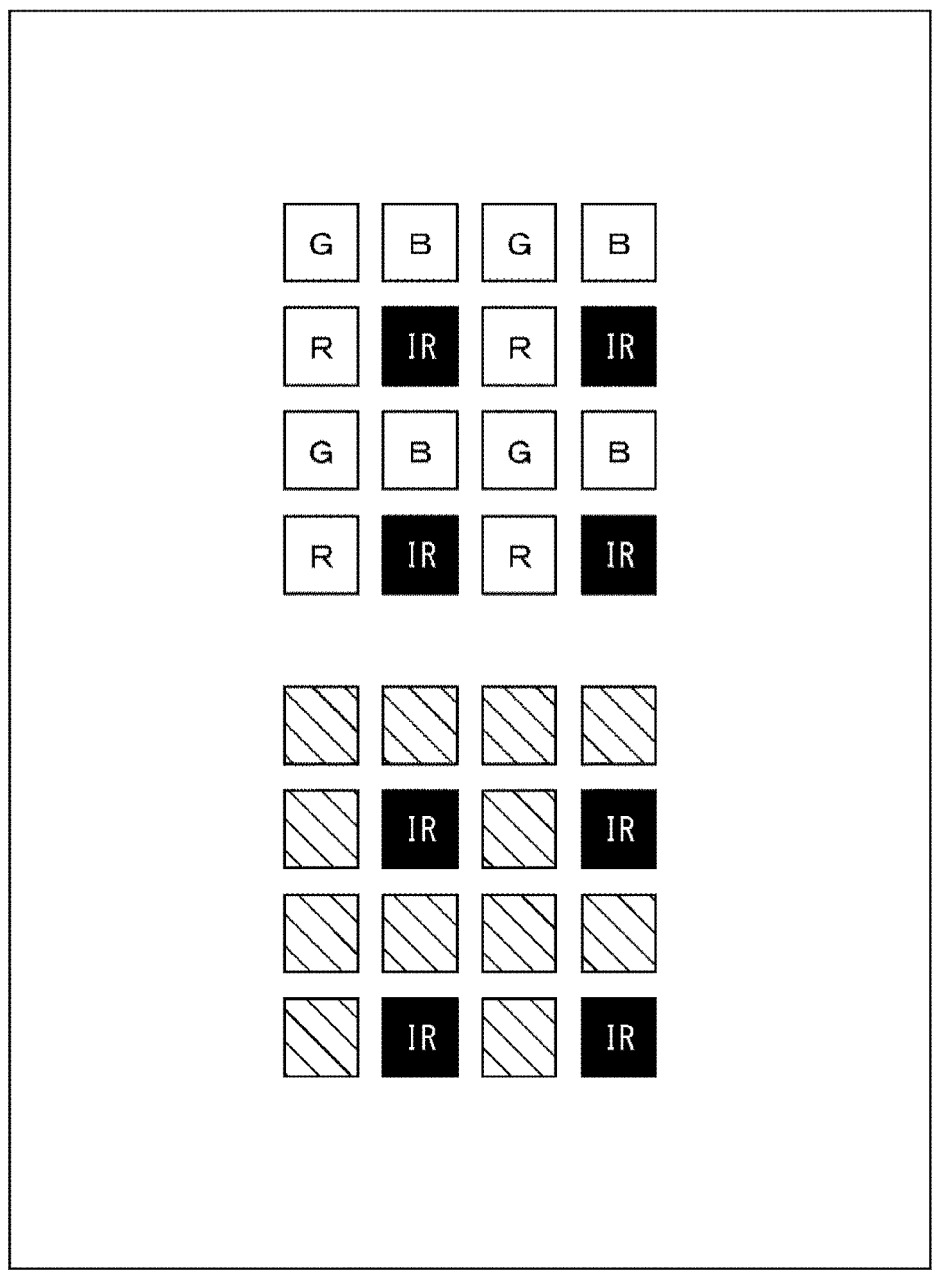
FIG. 5 is a view illustrating an example of a planar arrangement of an optical filter layer.

FIG. 5 is a diagram illustrating an example of planar arrangements of the first and second optical filter layers in the visible light pixel 51 and the infrared light pixel 52.

The lower part of FIG. 5 illustrates an arrangement of the first optical filter layer in the visible light pixel 51 and the infrared light pixel 52. The upper part of FIG. 5 illustrates an arrangement of the second optical filter layer in the visible light pixel 51 and the infrared light pixel 52.

The arrangement of the second optical filter layer indicates that one of the G pixels in the Bayer array is replaced by an infrared light pixel (IR pixel) in the example of FIG. 5. Note that the first optical filter layer other than the IR pixel is an infrared cut filter in the lower part of FIG. 5 and that the second optical filter layer other than the IR pixel is a color filter of an R, G, or B pixel in the upper part of FIG. 5.

Figure 6:
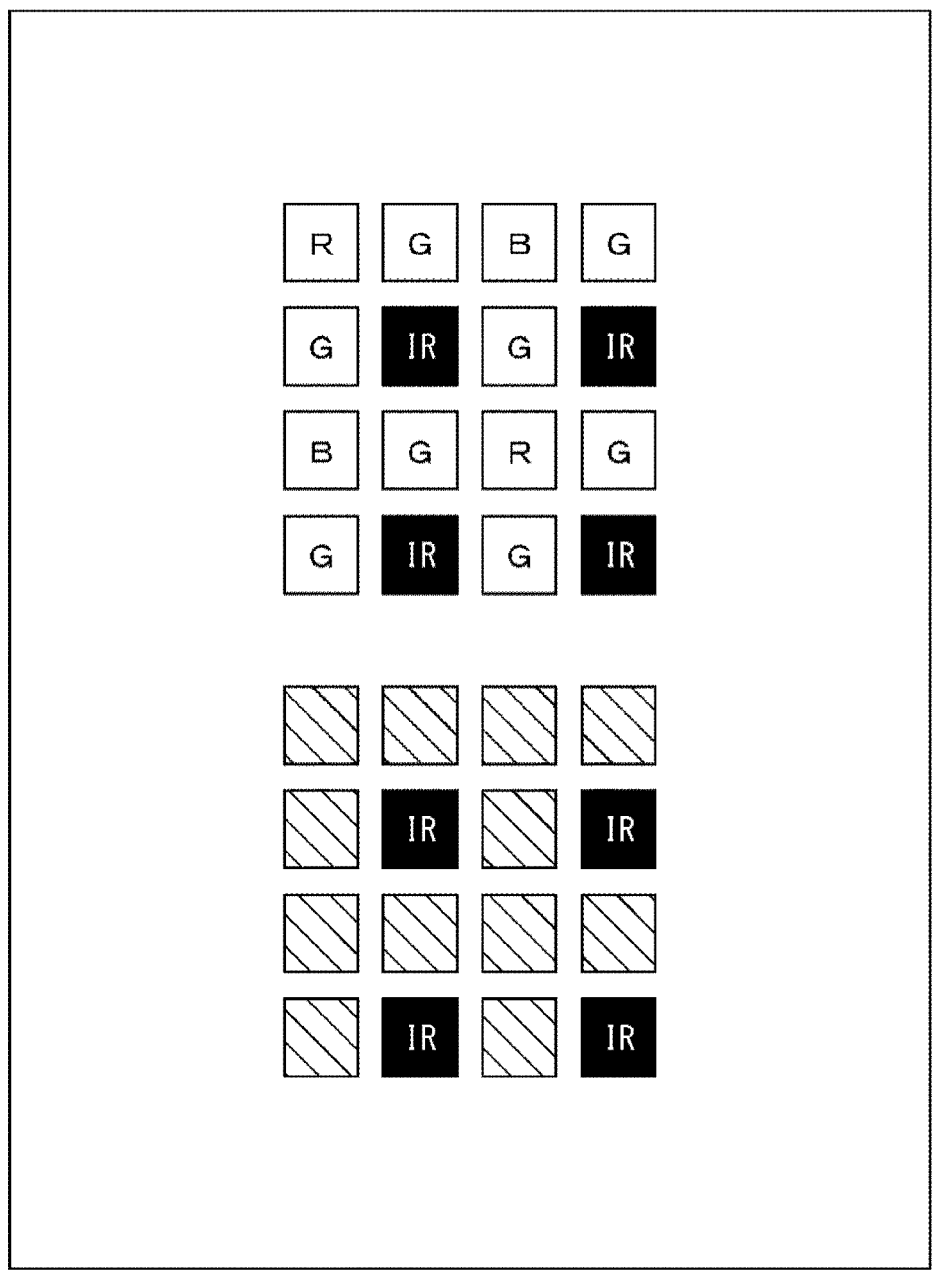
FIG. 6 is a view illustrating another example of the planar arrangement of the optical filter layer.

FIG. 6 is a diagram illustrating another example of the planar arrangements of the first and second optical filter layers in the visible light pixel 51 and the infrared light pixel 52.

Similarly to the example of FIG. 5, the lower part of FIG. 6 illustrates an arrangement of the first optical filter layer in the visible light pixel 51 and the infrared light pixel 52. The upper part of FIG. 6 illustrates an arrangement of the second optical filter layer in the visible light pixel 51 and the infrared light pixel 52.

In the example of FIG. 6, G pixels are arranged in a checkerboard pattern, and G pixels, B pixels, and infrared light pixels (IR pixels) are regularly arranged in the remaining areas.

According to the planar arrangements of FIG. 6, resolution can be improved as compared with the planar arrangements of FIG. 5.

Furthermore, the infrared cut filter 63 of the visible light pixel 51 includes an organic material to which a near infrared absorptive dye is added as an organic color material. Examples of the near infrared absorptive dye include a pyrrolopyrrole dye, a copper compound, a cyanine-based dye, a phthalocyanine-based compound, an imonium-based compound, a thiol complex-based compound, a transition metal oxide-based compound, a squarylium-based dye, a naphthalocyanine-based dye, a quaterrylene-based dye, a dithiol metal complex-based dye, a croconium compound, and the like. In the present embodiment, the pyrrolopyrrole dye illustrated in the chemical formula of FIG. 7 is preferably used.

Figure 7:
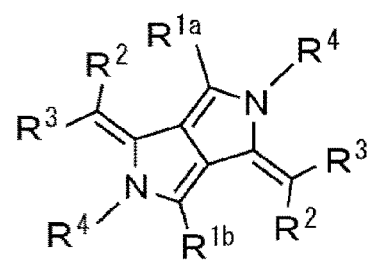
FIG. 7 is a diagram illustrating an example of a color material of an infrared cut filter.

In FIG. 7, R1a and R1b each independently represent an alkyl group, an aryl group, or a heteroaryl group. R2 and R3 each independently represent a hydrogen atom or a substituent, and at least one of these groups represents an electron withdrawing group. R2 and R3 may be bonded to each other to form a ring. R4 represents a hydrogen atom, an alkyl group, an aryl group, a heteroaryl group, a substituted boron atom, or a metal atom and may be bonded covalently or coordinately to at least one of R1a, R1b, and R3.

Figure 8:
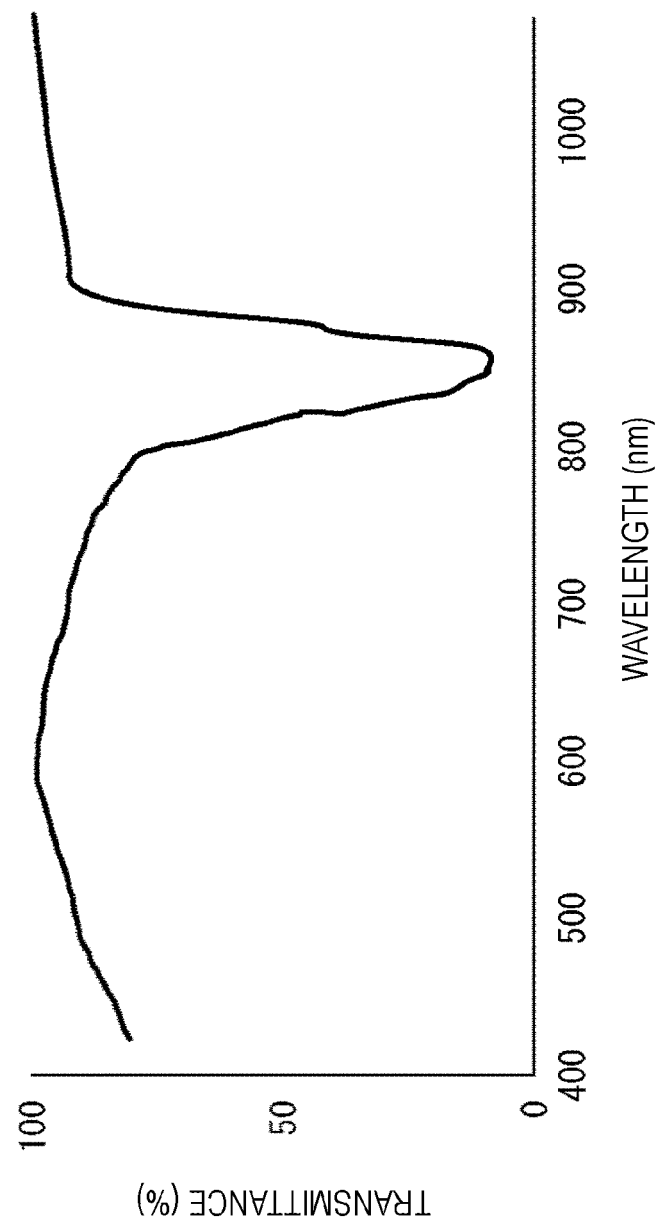
FIG. 8 is a diagram illustrating an example of spectral characteristics of the infrared cut filter.

FIG. 8 is a diagram illustrating an example of spectral characteristics of the infrared cut filter 63.

As illustrated in FIG. 8, the infrared cut filter 63 has such spectral characteristics that the transmittance is 20% or less in a wavelength region of 700 nm or more, and particularly has an absorption maximum wavelength in a wavelength region near 850 nm.

Note that the infrared cut filter 63 of the visible light pixel 51 may include an organic material to which an inorganic color material is added instead of an organic color material.

(Regarding Flow of Pixel Formation)

Figure 9:
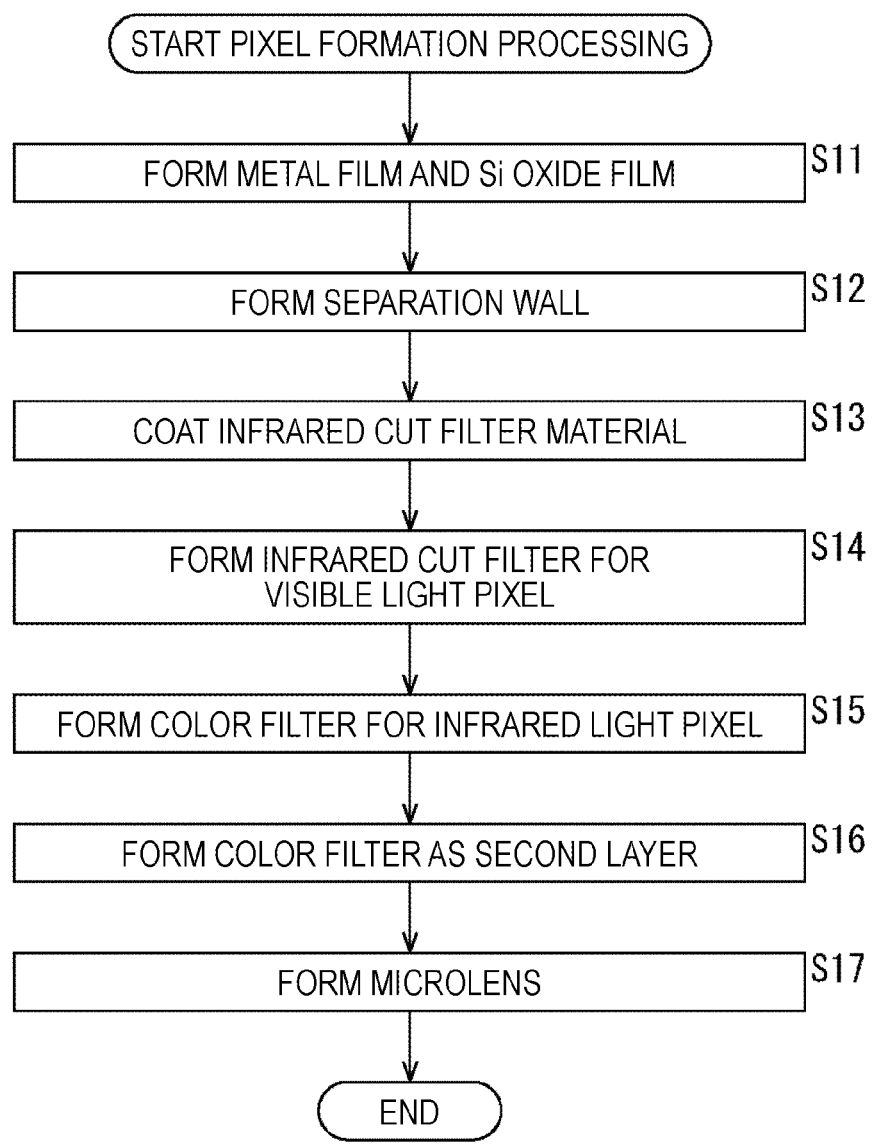
FIG. 9 is a flowchart for explaining pixel formation processing.
Figure 11:
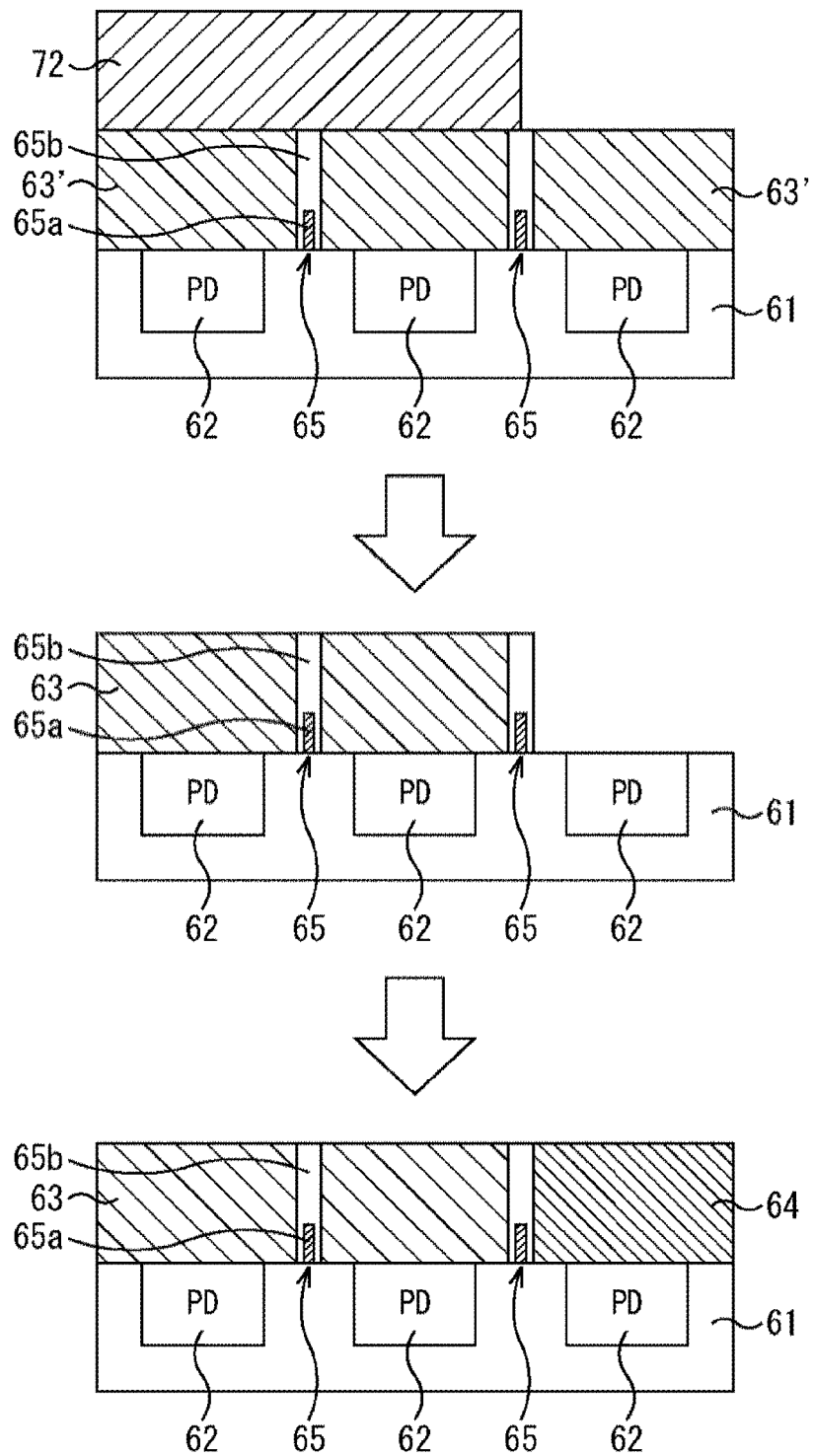
FIG. 11 is a diagram for explaining a step of pixel formation.
Figure 12:
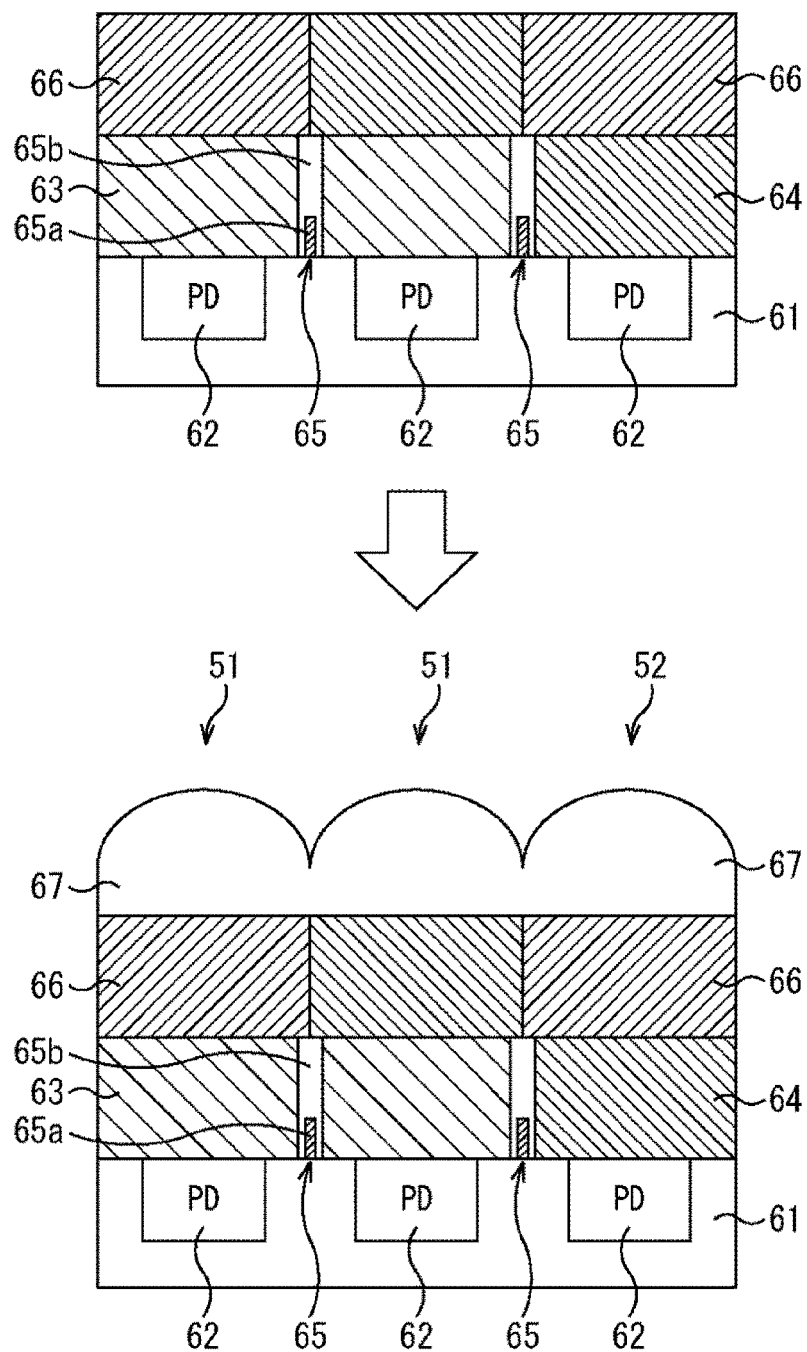
FIG. 12 is a diagram for explaining a step of pixel formation.

Next, a flow of pixel formation according to the present embodiment will be described with reference to FIGS. 9 to 12. FIG. 9 is a flowchart for explaining pixel formation processing, and FIGS. 10 to 12 are cross-sectional views illustrating steps of pixel formation.

Hereinafter, processing after the photoelectric conversion unit 62 is formed on the semiconductor substrate 61 will be described.

Figure 10:
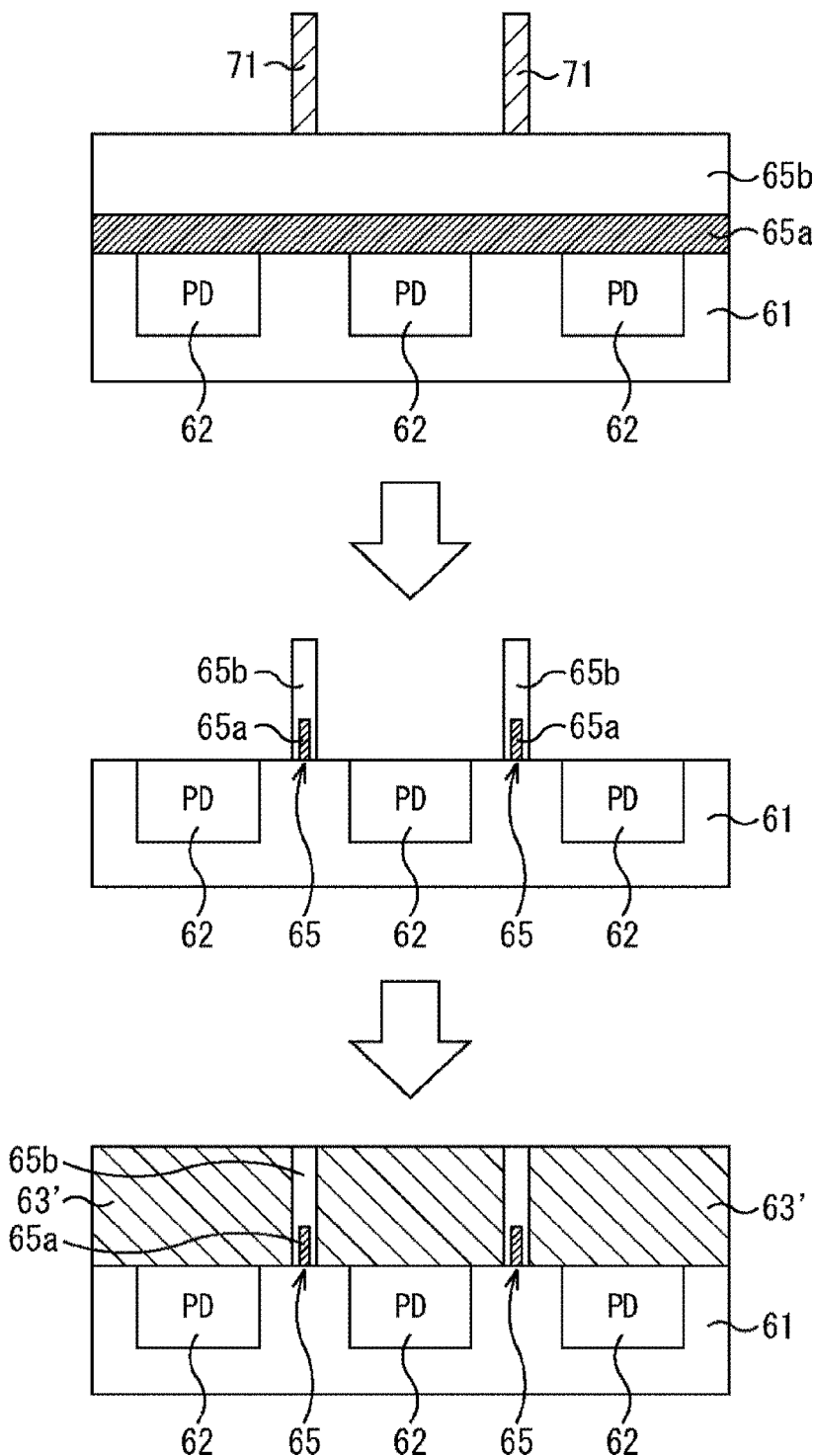
FIG. 10 is a diagram for explaining a step of pixel formation.

In step S11, as illustrated in the upper part of FIG. 10, a metal film 65a' and a Si oxide film 65b' are formed on the semiconductor substrate 61.

In step S12, the separation wall 65 is formed. Specifically, as illustrated in the upper part of FIG. 10, a photoresist 71 is applied to a region where the separation wall 65 is to be formed, exposed and developed by photolithography, and further dry etched to form the separation wall 65 as illustrated in the middle part of FIG. 10.

At this time, a Si oxide film may be further formed on surfaces of the semiconductor substrate 61 and the separation wall 65.

In step S13, coating is performed with an infrared cut filter material 63' by spin coating. As a result, as illustrated in the lower part of FIG. 10, a film of the infrared cut filter material 63' is formed (embedded) in a region surrounded by the separation wall 65.

In step S14, the infrared cut filter 63 is formed as the first optical filter layer of the visible light pixel 51. For example, in a case where the infrared cut filter material 63' does not have photolithography performance, a photoresist 72 is applied onto the infrared cut filter material 63', and as illustrated in the upper part of FIG. 11, the photoresist 72 is removed from the region of the infrared light pixel 52. In addition, by performing dry etching, the infrared cut filter material 63' is removed from the region of the infrared light pixel 52. Furthermore, in a case where the infrared cut filter material 63' has photolithography performance, the photoresist 72 is not applied onto the infrared cut filter material 63', and the infrared cut filter material 63' is directly exposed and developed to remove the infrared cut filter material 63' from the region of the infrared light pixel 52. As a result, as illustrated in the middle part of FIG. 11, the infrared cut filter 63 of the visible light pixel 51 is formed.

In step S15, as illustrated in the lower part of FIG. 11, for example, a blue (B) color filter is formed as a first optical filter layer of the infrared light pixel 52.

In step S16, as illustrated in the upper part of FIG. 12, the color filter 66 is formed as a second layer as a second optical filter layer for each of the pixels. For example, a red (R) color filter is formed as the second optical filter layer of the infrared light pixel 52.

Then, in step S17, as illustrated in the lower part of FIG. 12, the microlens 67 is uniformly formed for each of the pixels.

In this way, the visible light pixel 51 and the infrared light pixel 52 are formed.

Figure 13:
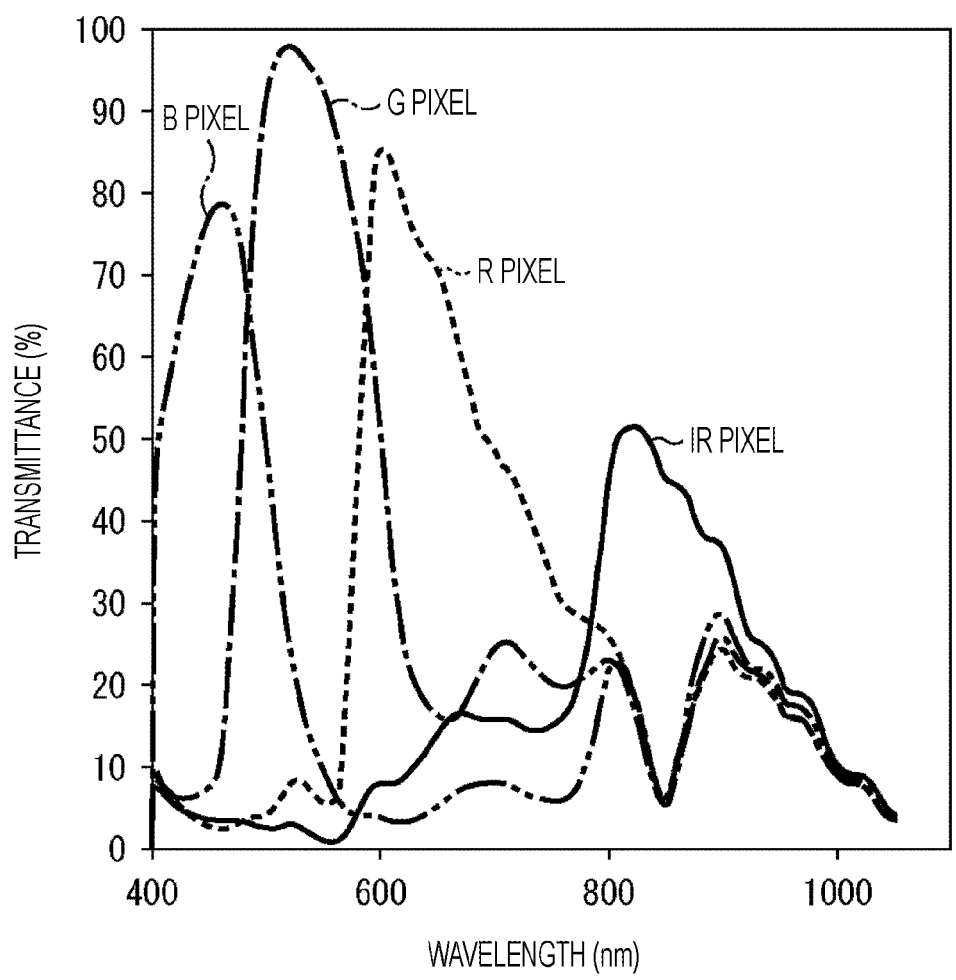
FIG. 13 is a diagram illustrating spectral characteristics of a visible light pixel and an infrared light pixel.

According to the above configuration and processing, the infrared cut filter 63 is formed as the first optical filter layer in the visible light pixel 51, and the color filter 66 is formed as the second optical filter layer. As a result, as illustrated in FIG. 13, an R pixel, a G pixel, and a B pixel have such spectral characteristics that a transmittance is low in an infrared light region at a wavelength of about 850 nm, while an infrared light pixel (IR pixel) has such spectral characteristics that a high transmittance is maintained in the infrared light region. As a result, occurrence of color mixing between the visible light pixel and the infrared light pixel can be suppressed, and color separation and deterioration of S/N can be suppressed.

Furthermore, the separation wall 65 separating the first optical filter layer for each of the pixels is formed in each of the pixels, and therefore occurrence of color mixing between the visible light pixel and the infrared light pixel can be more reliably suppressed.

Conventionally, an infrared cut filter including an organic material is liable to be damaged on a side surface thereof during processing, and variation in shape may be large. Meanwhile, in the present embodiment, the infrared cut filter 63 is processed while being surrounded by the separation walls 65, and therefore processing can be performed without damaging the side surface of the infrared cut filter 63.

Moreover, when the first optical filter is formed, the first optical filter can be formed so as to have a desired thickness due to the height of the separation wall 65.

Furthermore, the infrared cut filter 63 includes an organic material to which an organic or inorganic color material is added, and therefore the infrared cut filter 63 can uniformly contain the color material. As a result, unlike the infrared cut filter of Patent Document 1, the transmission distribution of infrared light does not depend on the incident angle, and a constant transmittance can be obtained regardless of the incident angle of infrared light. Furthermore, the number of steps does not increase, and therefore an increase in difficulty of the process can be avoided.

Moreover, two optical filter layers are formed in each of the pixels. Therefore, the height of the entire optical filter layers is easily equalized, and occurrence of application unevenness can be suppressed when a microlens material is applied.

(Another Example of Spectral Characteristics of Infrared Cut Filter)

Note that, in the above-described example, the infrared cut filter 63 may have such spectral characteristics that an absorption maximum wavelength is present in a wavelength region around 850 nm. However, the transmittance only needs to be 20% or less in a wavelength region of 700 nm or more.

Figure 14:
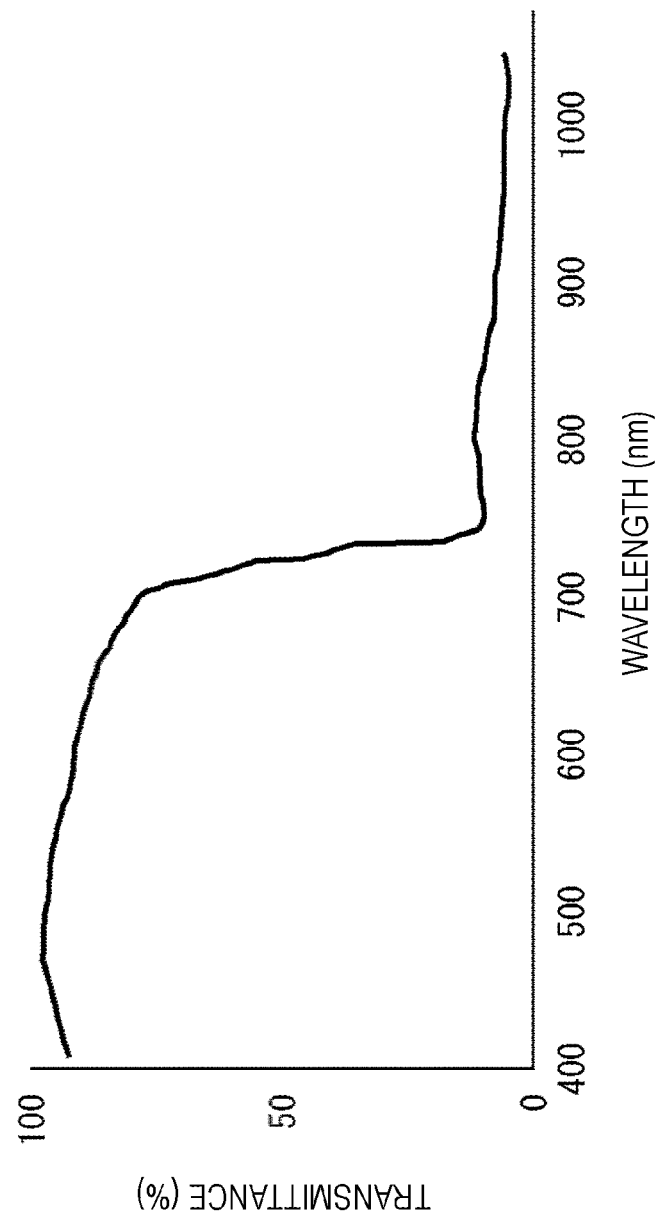
FIG. 14 is a diagram illustrating another example of the spectral characteristics of the infrared cut filter.
Figure 15:
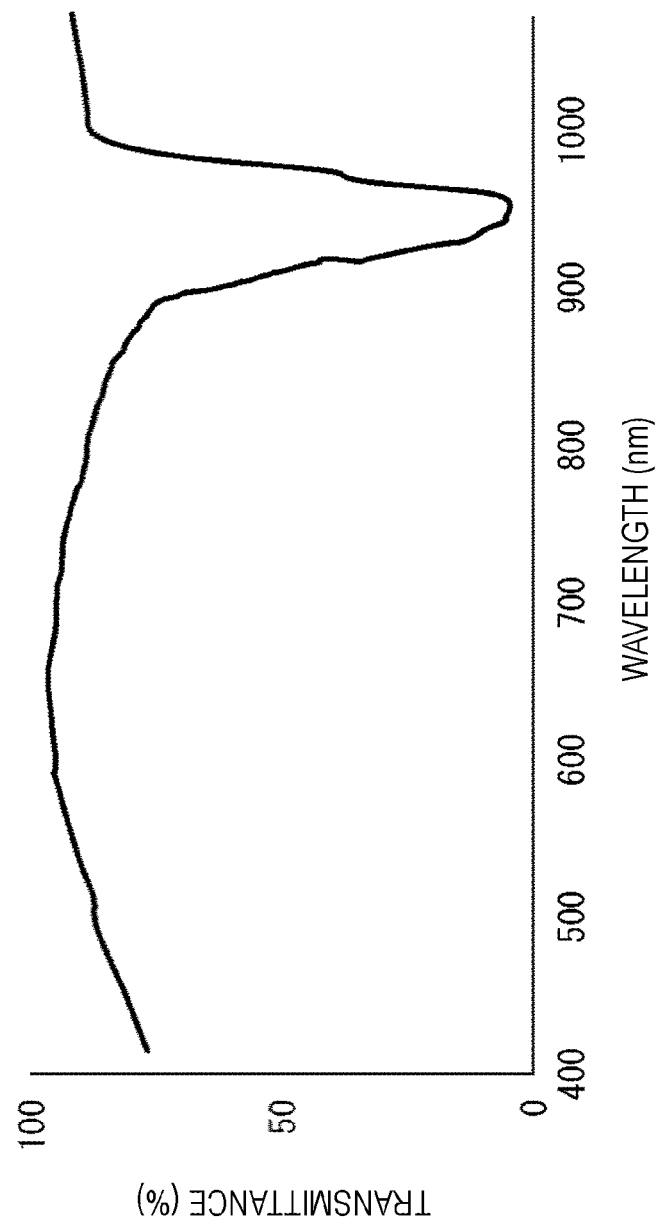
FIG. 15 is a diagram illustrating still another example of the spectral characteristics of the infrared cut filter.

For example, as illustrated in FIG. 14, the infrared cut filter 63 may have such spectral characteristics that the transmittance is 20% or less in the entire wavelength region of 750 nm or more. Alternatively, as illustrated in FIG. 15, an absorption maximum wavelength may be present in a wavelength region around 950 nm.

Particularly, by determining the absorption maximum wavelength depending on a color material to be added to the infrared cut filter 63, the infrared cut filter 63 can be an optical filter that selectively absorbs infrared light in a predetermined wavelength region in the visible light pixel

51. The absorption maximum wavelength can be determined depending on a use of a solid-state imaging apparatus 1.

(Measures Against Flare and Ghost Caused by Reflection of Infrared Light)

In a camera system including a solid-state imaging apparatus having a visible light pixel and an infrared light pixel, infrared light in a specific wavelength region needs to be incident on a chip constituting the solid-state imaging apparatus. Therefore, in such a camera system, a dual band pass filter having spectral characteristics illustrated in FIG. 16 is disposed between a camera lens and the solid-state imaging apparatus as an infrared cut filter.

Figure 16:
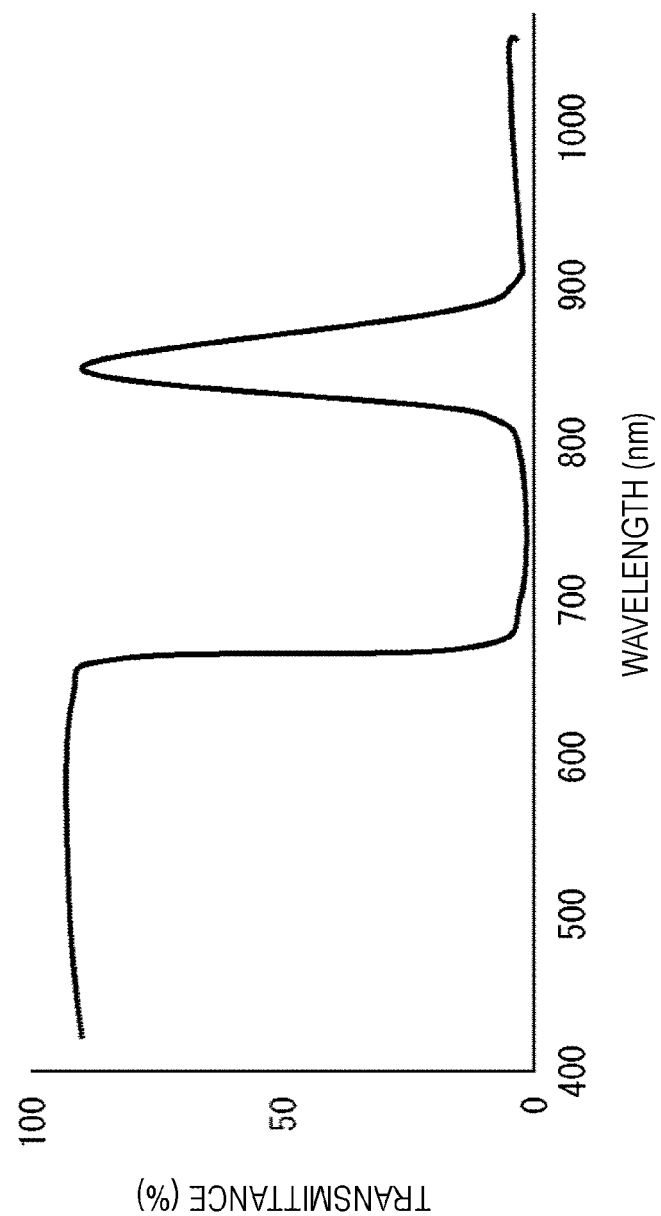
FIG. 16 is a diagram illustrating an example of spectral characteristics of a dual band pass filter.

The infrared cut filter having spectral characteristics illustrated in FIG. 16 transmits infrared light having a wavelength of 800 to 900 nm in addition to visible light.

In a camera system including a solid-state imaging apparatus having no infrared light pixel, a filter that cuts infrared light in all wavelength regions is used as an infrared cut filter. Therefore, infrared light is not incident on a chip. Meanwhile, in a camera system including a solid-state imaging apparatus having an infrared light pixel, infrared light in a specific wavelength region is incident on a chip. Therefore, the infrared light is reflected by a portion other than the pixel, and lare and ghost thereby occur to deteriorate S/N.

Figure 17:
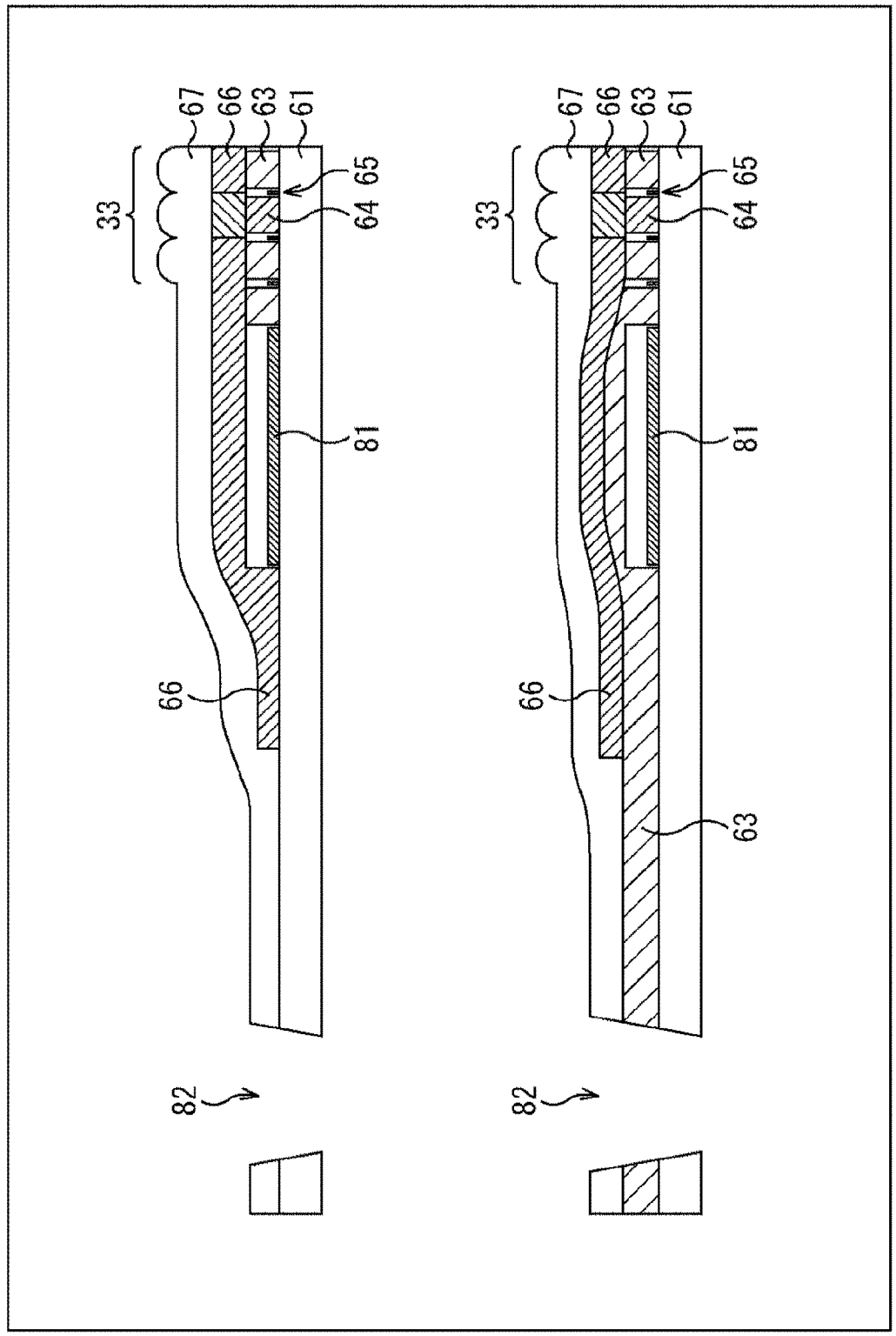
FIG. 17 is a cross-sectional view illustrating a configuration example of the entire solid-state imaging apparatus.
Figure 18:
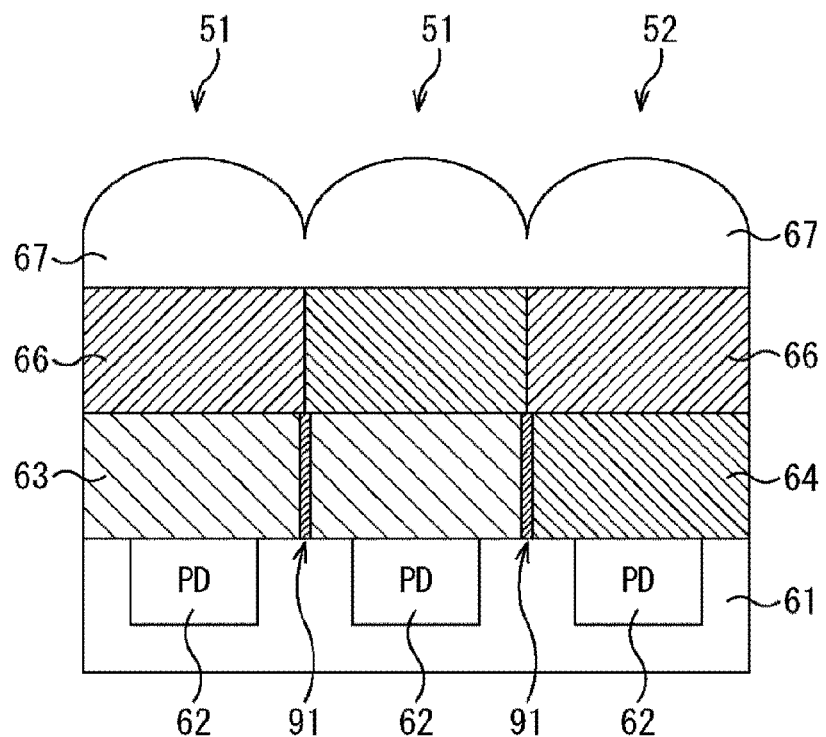
FIG. 18 is a cross-sectional view illustrating another configuration example of the pixel.

FIG. 17 is a cross-sectional view illustrating a configuration example of the entire solid-state imaging apparatus 31.

A first configuration example of the solid-state imaging apparatus 31 is illustrated in the upper part of FIG. 17, and a second configuration example of the solid-state imaging apparatus 31 is illustrated in the lower part of FIG. 17.

On the right side of the drawing, a part of the pixel region 33 in which pixels are arranged is illustrated. In FIG. 17, the right direction is a direction toward the center of the pixel region 33, and the left direction is a direction toward the outside (end portion) of the entire chip.

In the drawing, on the left side of the pixel region 33 (around the pixel region 33), a circuit unit 81 constituting a peripheral circuit is disposed. Furthermore, in the drawing, on the left end (end portion of the chip), a connection hole 82 in which a conductor to be connected to an electrode pad formed on the chip is embedded is disposed.

Here, in the first configuration example in the upper part of FIG. 17, the color filter 66 is formed even in a region other than the pixel region 33, specifically, even in a region outside the circuit unit 81. As a result, it is possible to suppress reflection of visible light corresponding to a predetermined color and transmission of the light to the circuit unit 81.

However, in the first configuration example, in a case where infrared light in a specific wavelength region is incident on the chip, flare and ghost may occur by reflection of the infrared light by a portion other than the pixel, and S/N may deteriorate.

Meanwhile, in the second configuration example in the lower part of FIG. 17, the infrared cut filter 63 is formed even in a region other than the pixel region 33, specifically, even in the entire chip region. As a result, it is possible to suppress reflection of the infrared light by a portion other than the pixel. Therefore, occurrence of flare and ghost can be suppressed, and deterioration of S/N can be further suppressed.

Moreover, a step outside the pixel region 33 can be reduced by forming the infrared cut filter 63 in the entire chip region. Therefore, occurrence of application unevenness can be suppressed when a color filter material or a microlens material is applied.

(Another Configuration of Separation Wall)

In the above-described example, the separation wall separating the first optical filter layer for each of the pixels includes the metal film 65*a* including W, Al, or the like, and the Si oxide film 65*b* including SiO2, SiN, or the like.

Figure 19:
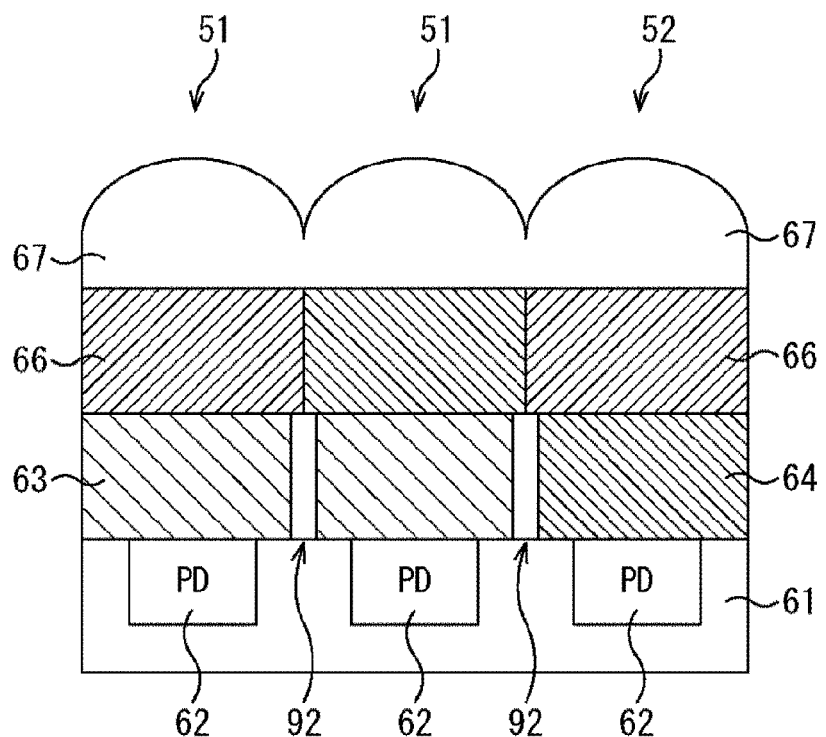
FIG. 19 is a cross-sectional view illustrating still another configuration example of the pixel.

However, the material of the separation wall is not limited thereto. For example, as illustrated in FIG. 15, a separation wall 91 may include only a metal film including W, Al, or the like. Alternatively, as illustrated in FIG. 19, a separation wall 92 may include only a Si oxide film including SiO2, SiN, or the like.

Figure 20:
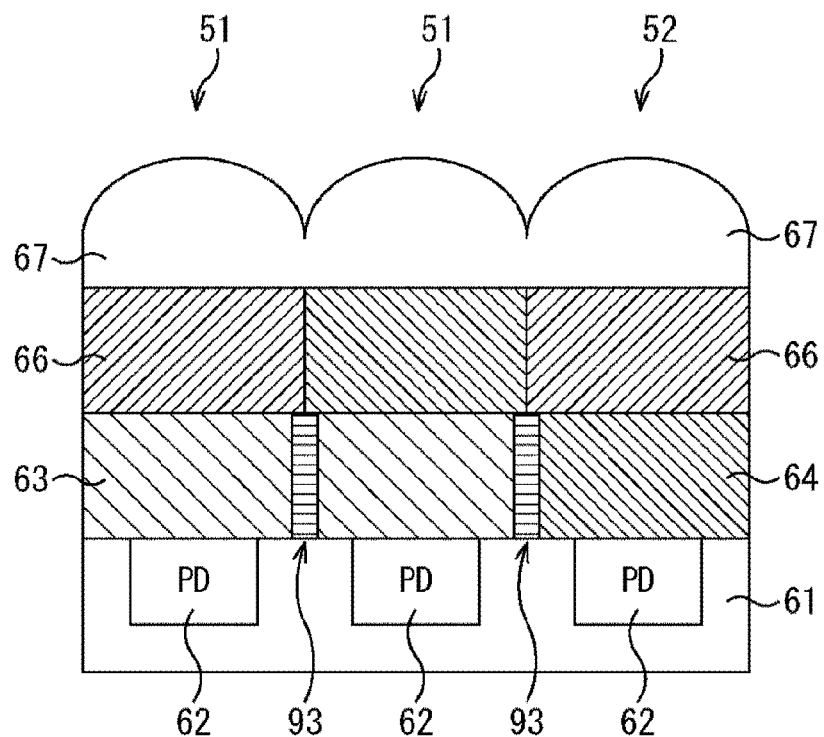
FIG. 20 is a cross-sectional view illustrating still another configuration example of the pixel.

Furthermore, as illustrated in FIG. 20, a separation wall 93 may include an organic resin having a refractive index equal to or lower than that of each of the color filters 64 and 66. The separation wall 93 may include an organic resin containing a filler. The separation wall 93 desirably has a refractive index of 1.5 or less.

Furthermore, in the above-described example, the height of the separation wall separating the first optical filter layer for each of the pixels is the same as the height of the first optical filter layer (infrared cut filter 63 or color filter 64).

Figure 21:
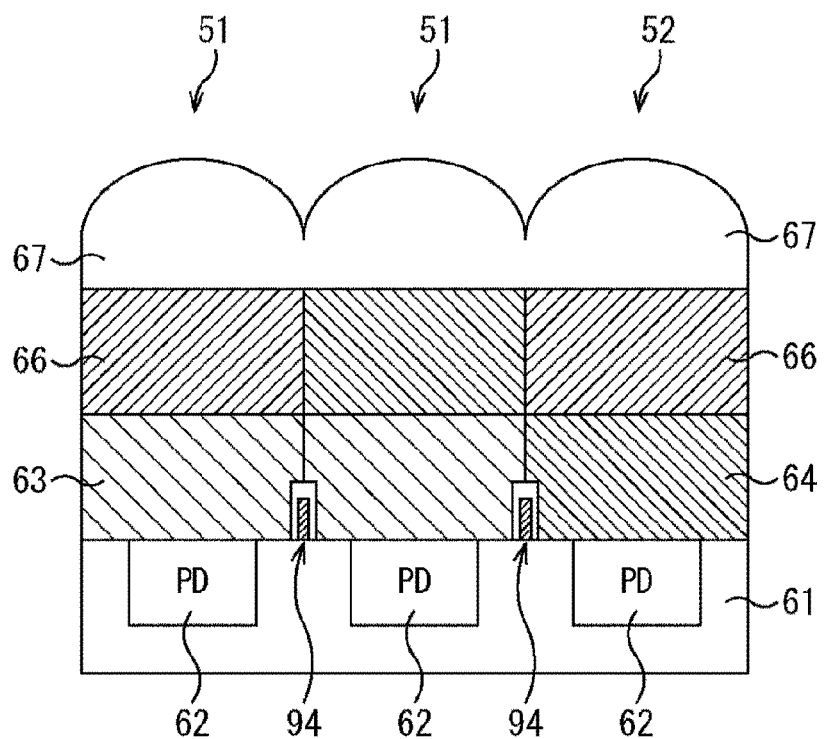
FIG. 21 is a cross-sectional view illustrating still another configuration example of the pixel.

However, the height of the separation wall is not limited thereto. For example, as illustrated in FIG. 21, the height of a separation wall 94 may be about ⅓ to ¼ of the height of the first optical filter layer. In this case, the height of the separation wall 94 is desirably at least 100 nm or more.

Figure 22:
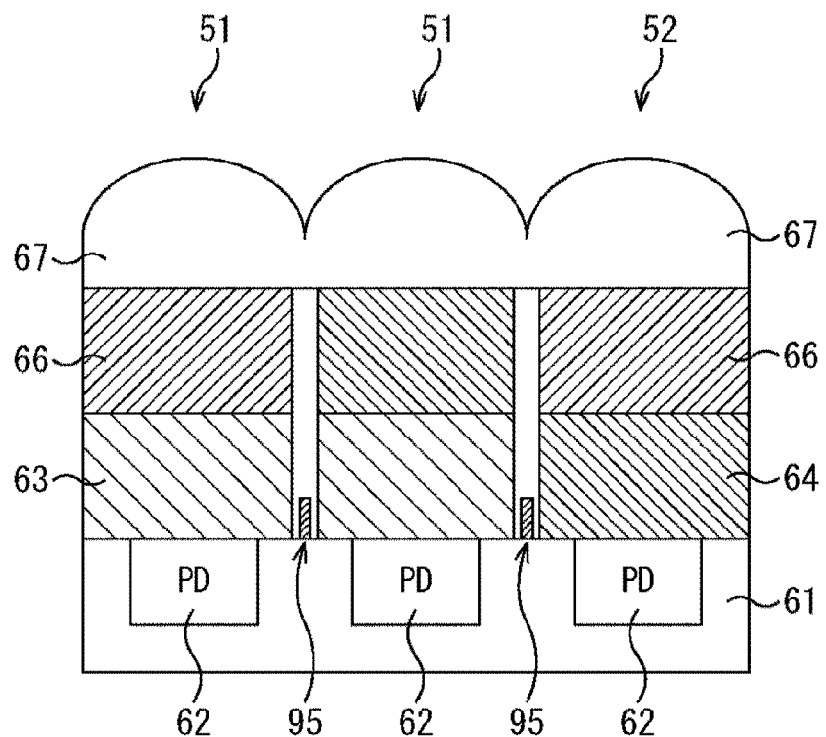
FIG. 22 is a cross-sectional view illustrating still another configuration example of the pixel.
Figure 23:
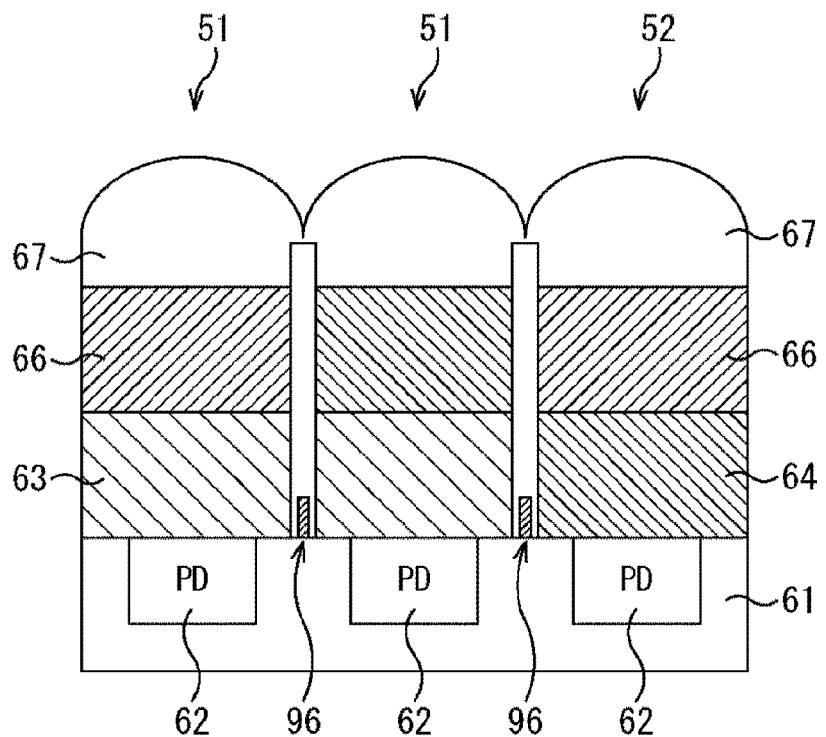
FIG. 23 is a cross-sectional view illustrating still another configuration example of the pixel.

Furthermore, as illustrated in FIG. 22, the height of a separation wall 95 may be the same as the total height of the first optical filter layer and the second optical filter layer (color filter 66). Alternatively, as illustrated in FIG. 23, the height of a separation wall 96 may be higher than the total height of the first optical filter layer and the second optical filter layer to reach the microlens 67.

Moreover, in addition to the above-described configuration, each of the pixels may have a PD separation wall separating the photoelectric conversion unit 62 for each of the pixels. In this case, the PD separation wall can be formed integrally with the separation wall 65 and the like in the above-described configuration.

Figure 24:
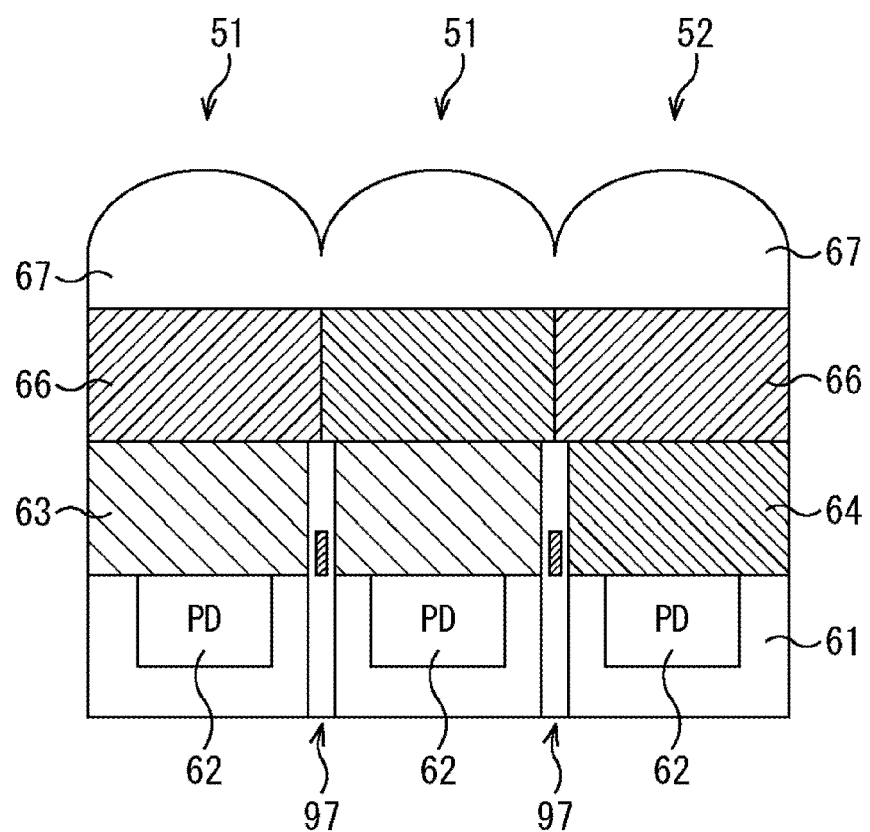
FIG. 24 is a cross-sectional view illustrating still another configuration example of the pixel.

For example, as illustrated in FIG. 24, a separation wall 97 separating the photoelectric conversion unit 62 and the first optical filter layer for each of the pixels is disposed. A portion of the separation wall 97 corresponding to the PD separation wall includes a Si oxide film including SiO2, SiN, or the like.

Figure 25:
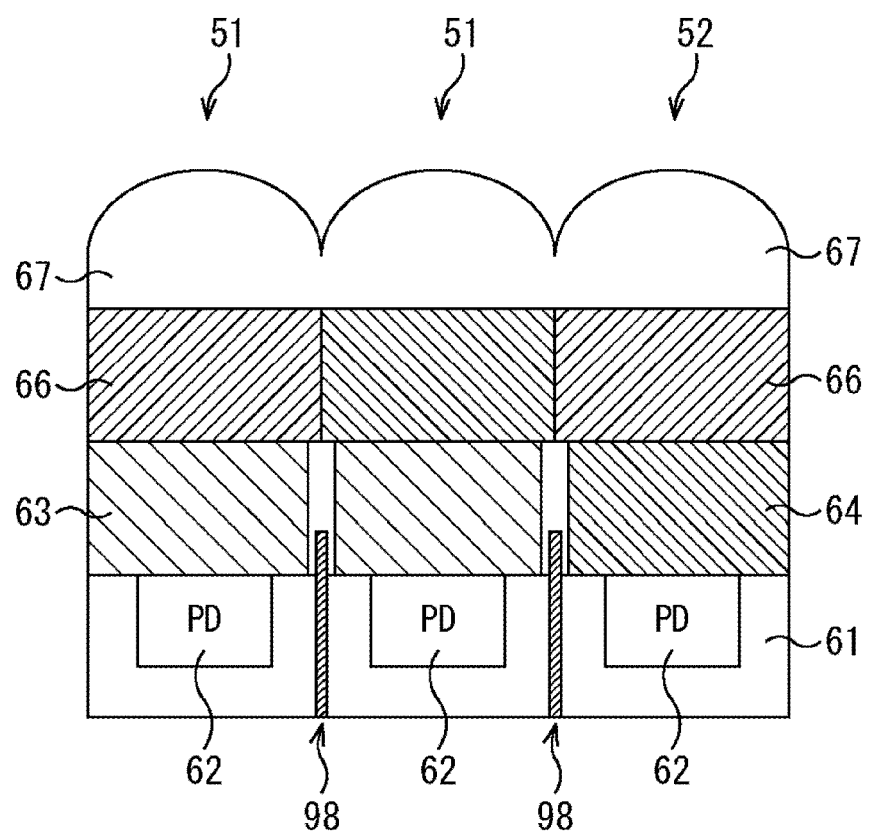
FIG. 25 is a cross-sectional view illustrating still another configuration example of the pixel.

Furthermore, as illustrated in FIG. 25, a separation wall 98 separating the photoelectric conversion unit 62 and the first optical filter layer for each of the pixels is disposed. A portion of the separation wall 98 corresponding to the PD separation wall includes a metal film including W, Al, or the like.

In this way, by further disposing the PD separation wall separating the photoelectric conversion unit 62 for each of the pixels, occurrence of color mixing between the pixels can be more reliably suppressed.

(Another Configuration of Optical Filter Layer)

In the above-described example, in the visible light pixel 51, the infrared cut filter 63 is formed as the first optical filter layer, and the color filter 66 is formed as the second optical filter layer.

Figure 26:
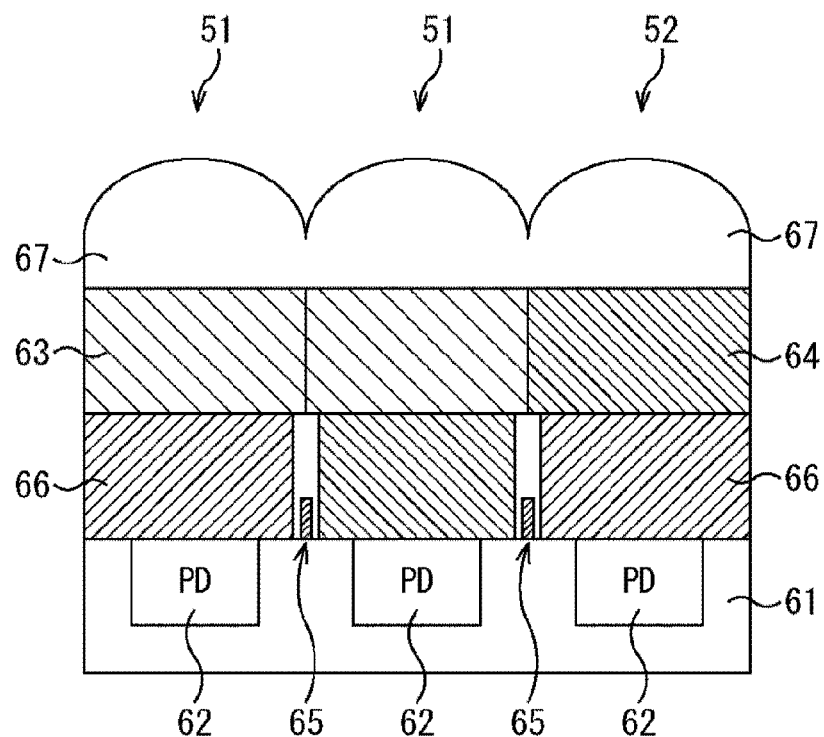
FIG. 26 is a cross-sectional view illustrating still another configuration example of the pixel.

Such a configuration is preferable in a case where the infrared cut filter 63 is processed by dry etching. However, conversely, as illustrated in FIG. 26, of course, the color filter 66 can be formed as the first optical filter layer, and the infrared cut filter 63 can be formed as the second optical filter layer.

Furthermore, in the above-described example, in the infrared light pixel 52, the first optical filter layer and the second optical filter layer are formed by overlapping color filters of different types (different colors).

Figure 27:
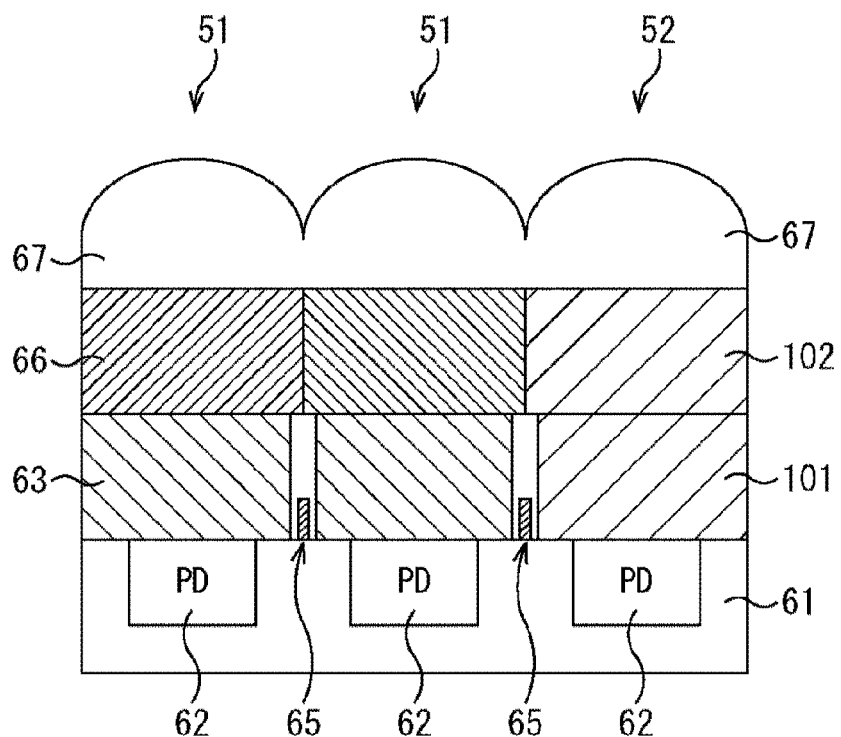
FIG. 27 is a cross-sectional view illustrating still another configuration example of the pixel.

Each of the two color filters (first optical filter layer and second optical filter layer) in the infrared light pixel 52 only needs to have such spectral characteristics that the transmittance is 20% or less in a wavelength region of 400 to 700 nm and 80% in a wavelength region of 700 nm or more. As illustrated in FIG. 27, the two color filters may be formed by overlapping color filters 101 and 102 of the same type (same color).

Modification Example

In the above-described example, the color filter 66 as the second optical filter layer is formed directly on the first optical filter layer.

Figure 28:
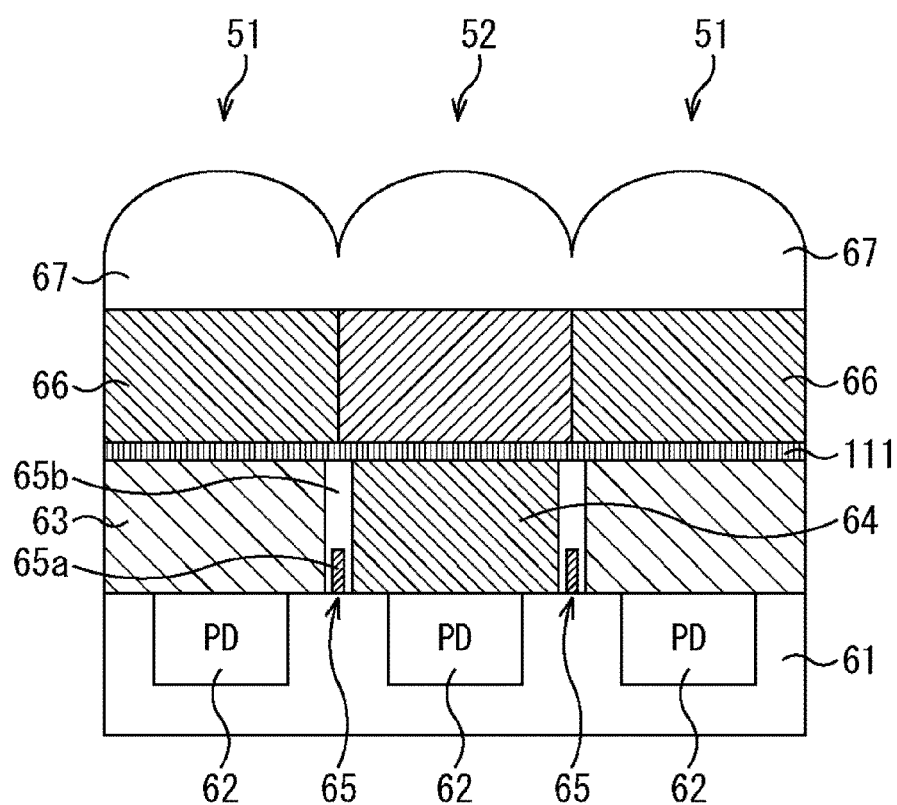
FIG. 28 is a cross-sectional view illustrating still another configuration example of the pixel.
Figure 29:
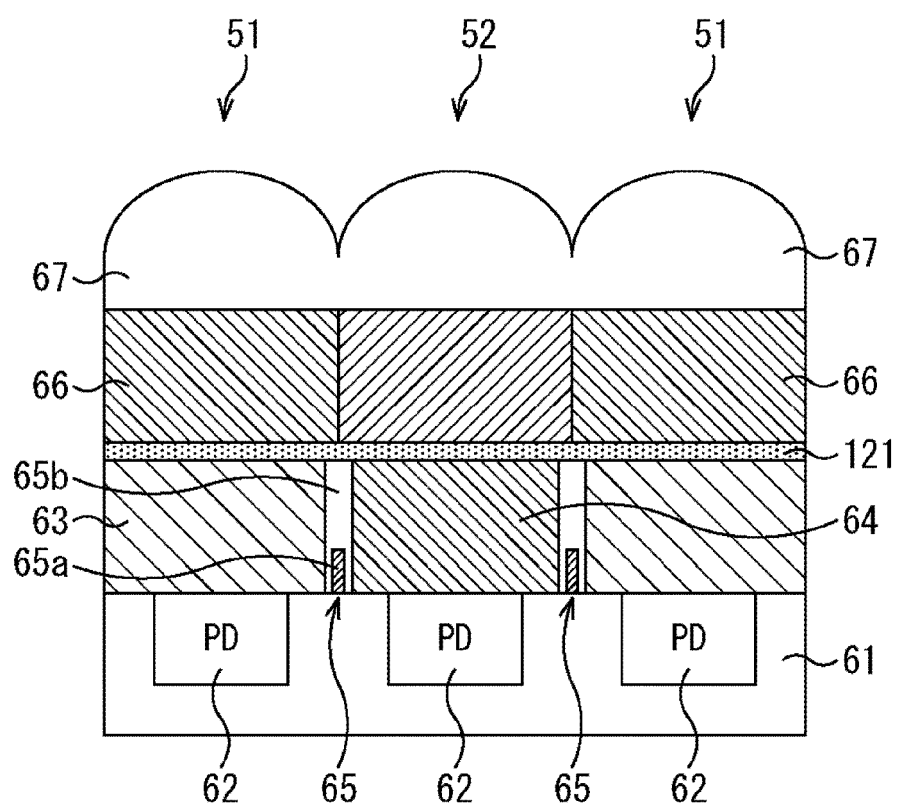
FIG. 29 is a cross-sectional view illustrating still another configuration example of the pixel.

The present invention is not limited thereto. As illustrated in FIG. 28, an organic film 111 may be formed between the first optical filter layer (infrared cut filter 63 and color filter 64) and the second optical filter layer (color filter 66). The organic film 111 includes, for example, an acrylic resin, a styrene resin, siloxane, or the like. Similarly, as illustrated in FIG. 29, an inorganic film 121 may be formed between the first optical filter layer (infrared cut filter 63 and color filter 64) and the second optical filter layer (color filter 66). The organic film 111 includes, for example, SiO2 or the like.

The organic film 111 of FIG. 28 and the inorganic film 121 of FIG. 29 function as planarizing films of the first optical filter layer and also function as protective layers of the infrared cut filter 63.

Figure 30:
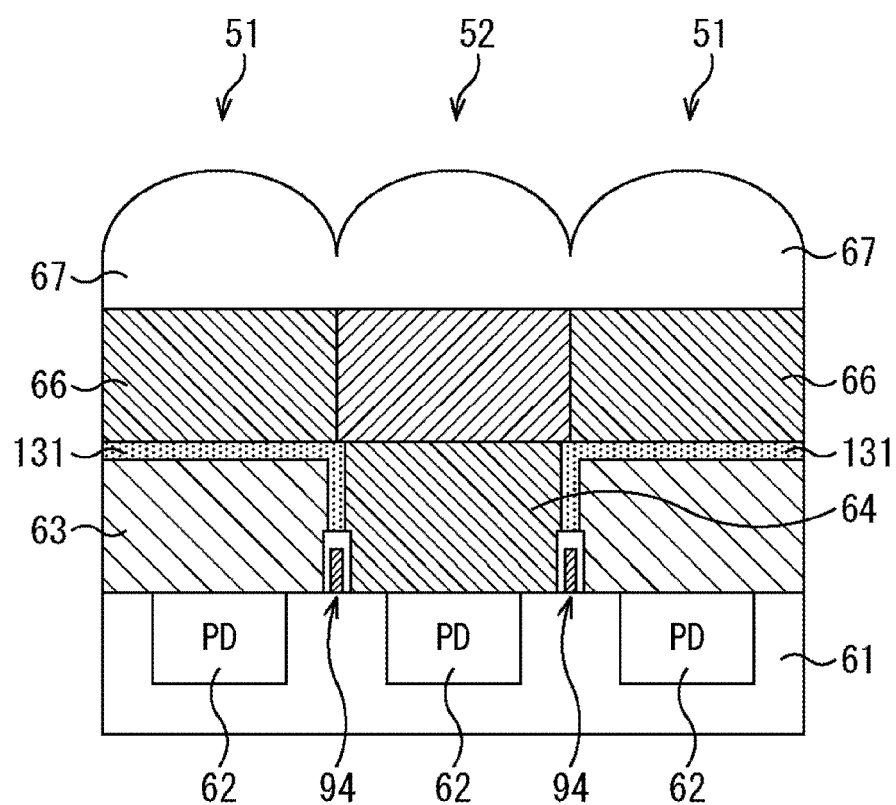
FIG. 30 is a cross-sectional view illustrating still another configuration example of the pixel.

Furthermore, in a case where an inorganic film is formed between the first optical filter layer and the second optical filter layer, the inorganic film 131 may be formed in such a manner as illustrated in FIG. 30 from a viewpoint of protection of the infrared cut filter 63. The inorganic film 131 is formed so as to cover an upper surface and a side surface of the infrared cut filter 63 in the first optical filter layer.

Figure 31:
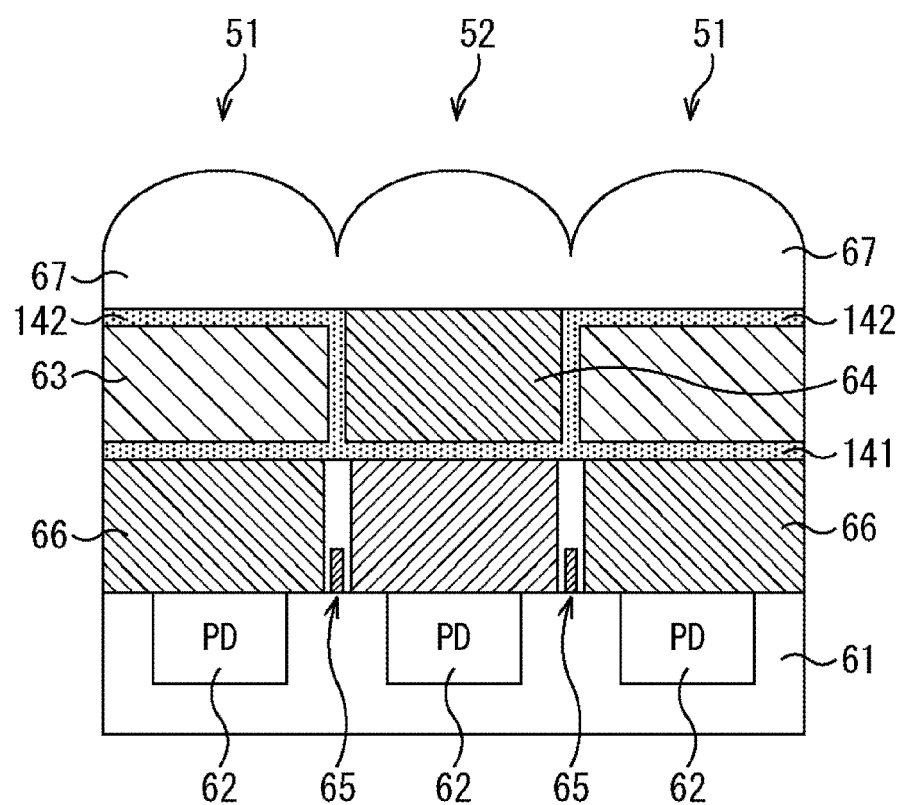
FIG. 31 is a cross-sectional view illustrating still another configuration example of the pixel.

Moreover, as described with reference to FIG. 26, in a case where the color filter 66 is formed as the first optical filter layer and the infrared cut filter 63 or the color filter 64 is formed as the second optical filter layer, such a structure as illustrated in FIG. 31 may be adopted. In FIG. 31, an inorganic film 141 is formed as the first optical filter layer on an upper surface of the color filter 66 (between the first optical filter layer and the second optical filter layer). Moreover, an inorganic film 142 is formed so as to cover an upper surface and a side surface of the infrared cut filter 63 in the second optical filter layer.

Figure 32:
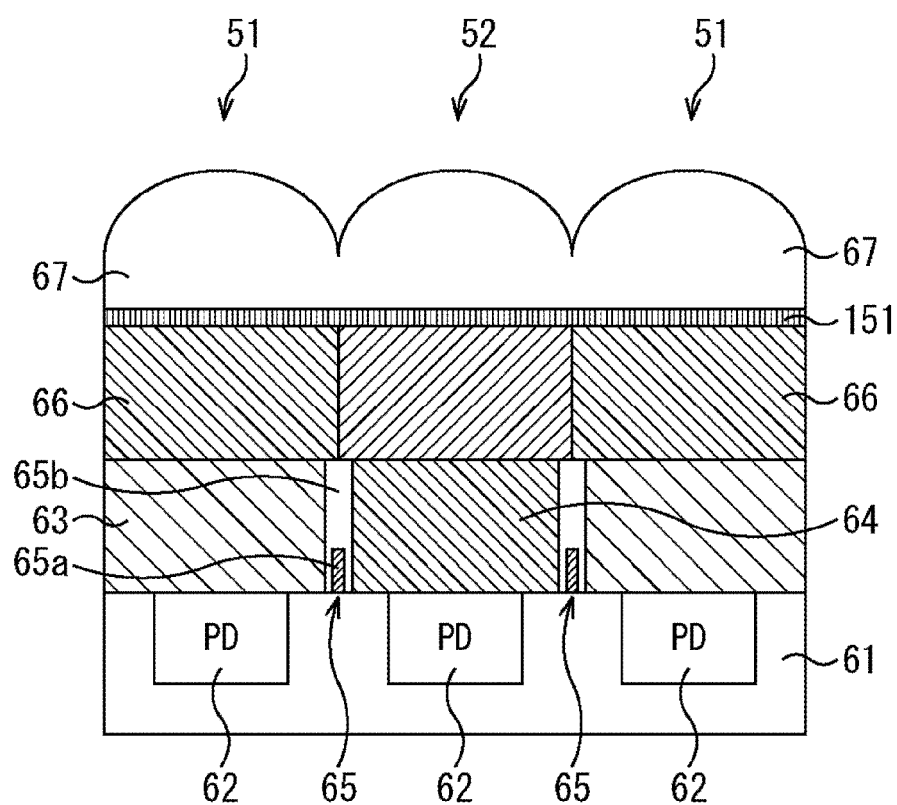
FIG. 32 is a cross-sectional view illustrating still another configuration example of the pixel.
Figure 33:
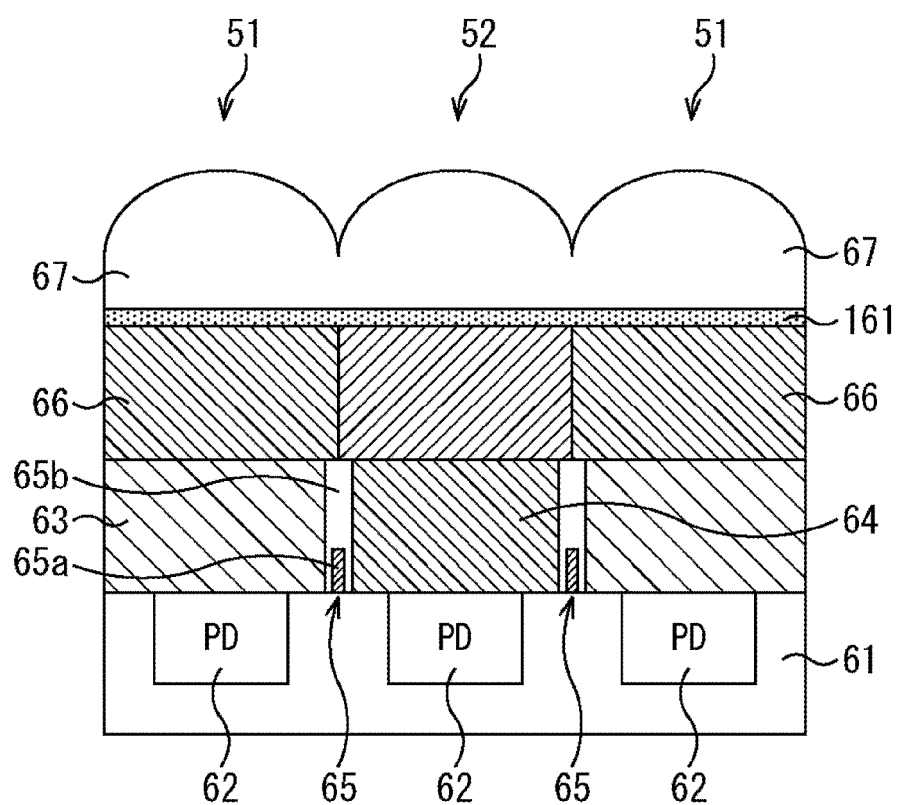
FIG. 33 is a cross-sectional view illustrating still another configuration example of the pixel.

Furthermore, as illustrated in FIG. 32, an organic film 151 may be formed between the second optical filter layer (color filter 66) and the microlens 67. The organic film 151 includes, for example, an acrylic resin, a styrene resin, siloxane, or the like. Similarly, as illustrated in FIG. 33, an inorganic film 161 may be formed between the second optical filter layer (color filter 66) and the microlens 67. The inorganic film 161 includes, for example, SiO2 or the like.

Note that it is also possible to combine the structure of FIG. 32 or 33 with each of the structures of FIGS. 28 to 31.

(Configuration Example of Image Processing Apparatus)

Next, a configuration example of an image processing apparatus including the solid-state imaging apparatus of the present technology will be described with reference to FIG. 34.

Figure 34:
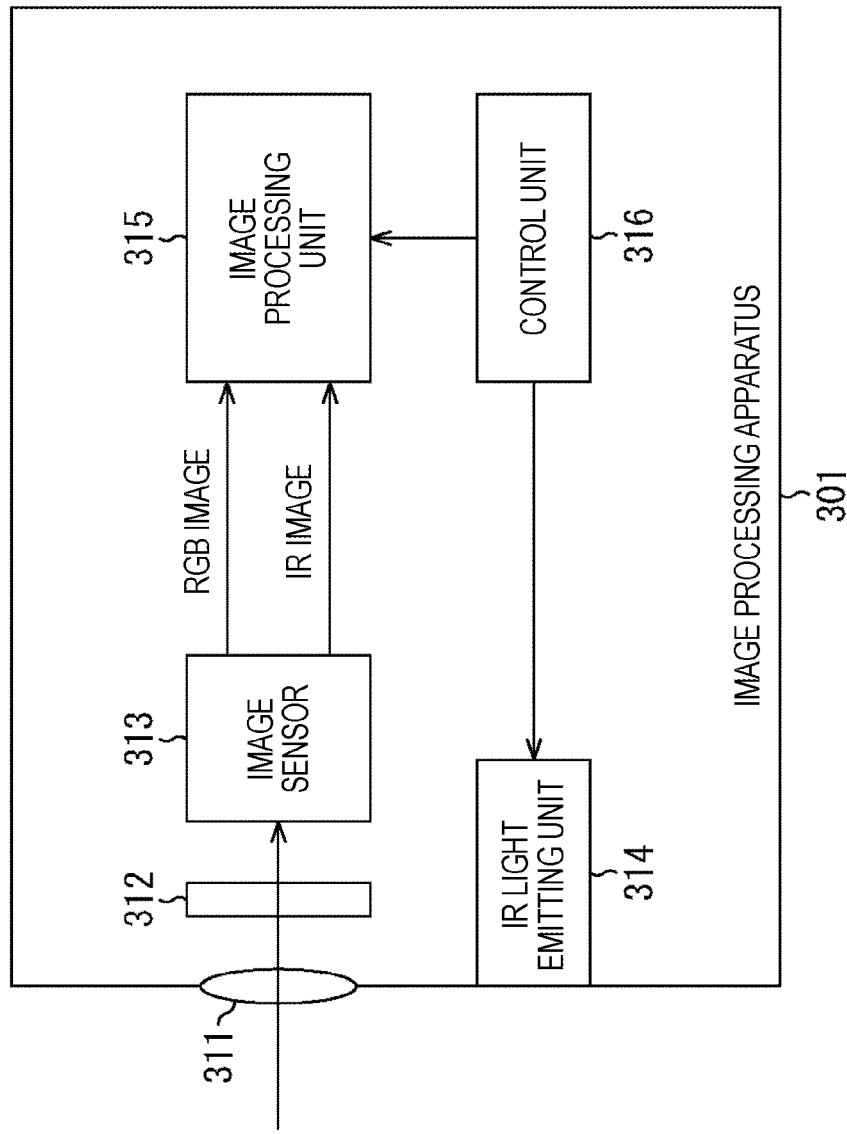
FIG. 34 is a block diagram illustrating a configuration example of an image processing apparatus.

An image processing apparatus 301 illustrated in FIG. 34 includes an optical lens 311, a filter 312, an image sensor 313, an IR light emitting unit 314, an image processing unit 315, and a control unit 316. FIG. 34 illustrates an embodiment in a case where the above-described solid-state imaging apparatus 31 of the present technology is disposed in the image processing apparatus as the image sensor 313.

The optical lens 311 is constituted as a monocular single focal lens, condenses light from a subject, and causes the condensed light to be incident on the image sensor 313 via the filter 312. The filter 312 has such spectral characteristics that a transmission band is present in a wavelength region of near infrared light together with in a visible light region. The image sensor 313 images a subject and supplies a visible light image (RGB image) and an infrared light image (IR image) to the image processing unit 315 at the same time.

The RGB image is an image generated by pixel output of the visible light pixel included in the image sensor 313. The IR image is an image generated by pixel output of the infrared light pixel included in the image sensor 313.

The IR light emitting unit 314 emits infrared light at a timing when the image sensor 313 performs imaging, thereby irradiating a subject with infrared light.

The image processing unit 315 performs predetermined image processing using the RGB image and IR image supplied from the image sensor 313.

The control unit 316 controls the overall operation of the image processing apparatus 301, such as light emission of the IR light emitting unit 314 and image processing of the image processing unit 315.

Examples of the image processing using the RGB image and the IR image include face authentication, iris authentication, motion capture, and the like.

In a case where face authentication is performed, authentication is performed using not only a face appearing on the RGB image but also a face appearing on the IR image. Therefore, highly accurate face authentication can be achieved without being affected by a lighting environment.

In a case where iris authentication is performed, an iris pattern obtained by reflection of light emitted from the IR light emitting unit 314 by an iris is acquired as the IR image, and the IR image is registered/verified to achieve iris authentication.

In a case where motion capture is performed, light emitted from the IR light emitting unit 314 and reflected by a reflection marker is acquired as the IR image, and coordinates of the reflection marker are calculated to achieve motion capture.

As described above, the image sensor to which the present technology is applied can be applied to various applications using the IR image.

In the above, the configuration of the solid-state imaging apparatus including a visible light pixel and an infrared light pixel has been described.

By the way, in a case where infrared light is incident on a solid-state imaging apparatus including only a visible light pixel, photoelectric conversion is also performed, and therefore S/N deteriorates due to color mixing of infrared light. Therefore, generally, an infrared cut filter that cuts infrared light is disposed on a sealing glass of a package.

However, in a case where light that has passed through the infrared cut filter is reflected by a light receiving surface and returns to the infrared cut filter side, the light may be further reflected by the infrared cut filter and may be incident on a peripheral pixel. As a result, ghost may occur in an obtained image.

Therefore, in the following description, a configuration of a solid-state imaging apparatus that suppresses occurrence of ghost while cutting infrared light will be described.

4. Second Embodiment

In a solid-state imaging apparatus 31 according to a second embodiment of the present technology, only visible light pixels are disposed as a plurality of pixels 32 arranged in a pixel region 33.

Figure 35:
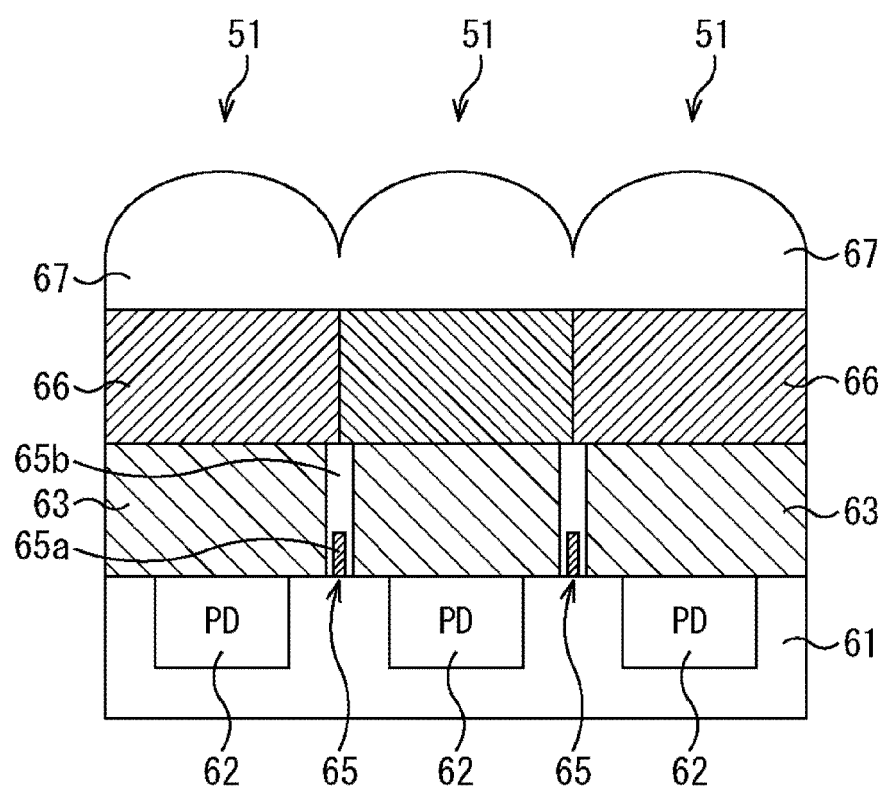
FIG. 35 is a cross-sectional view illustrating a configuration example of a pixel in a solid-state imaging apparatus according to a second embodiment of the present technology.

FIG. 35 is a cross-sectional view illustrating a configuration example of a pixel in the solid-state imaging apparatus 31 according to the second embodiment of the present technology. FIG. 35 illustrates a cross-sectional view of a visible light pixel 51 in the solid-state imaging apparatus 31. The visible light pixel 51 is constituted as, for example, three types of pixels of a red (R) pixel, a green (G) pixel, and a blue (B) pixel.

As in the first embodiment, in the visible light pixel 51, a photoelectric conversion unit 62 constituted by a photodiode (PD) that receives incident light and performs photoelectric conversion is formed on a semiconductor substrate 61. On the semiconductor substrate 61, an insulating layer (not illustrated) including SiO or the like, a wiring layer (not illustrated) including Cu or Al, and the like are formed. On the insulating layer, an infrared cut filter 63 is formed as a first optical filter layer. On the infrared cut filter 63, a color filter 66 having spectral characteristics corresponding to each of the visible light pixels 51 (R, G, and B pixels) is formed as a second optical filter layer. On the color filter 66, a microlens 67 is formed.

Furthermore, each of the pixels (visible light pixels 51) has a separation wall 65 separating the first optical filter layer for each of the pixels. The separation wall 65 includes a metal film 65a including W, Al, or the like, and a Si oxide film 65b including SiO2, SiN, or the like. In the example of FIG. 35, the height of the separation wall 65 is the same as the height of the first optical filter layer (infrared cut filter 63).

Here, a planar arrangement of pixels will be described.

Figure 36:
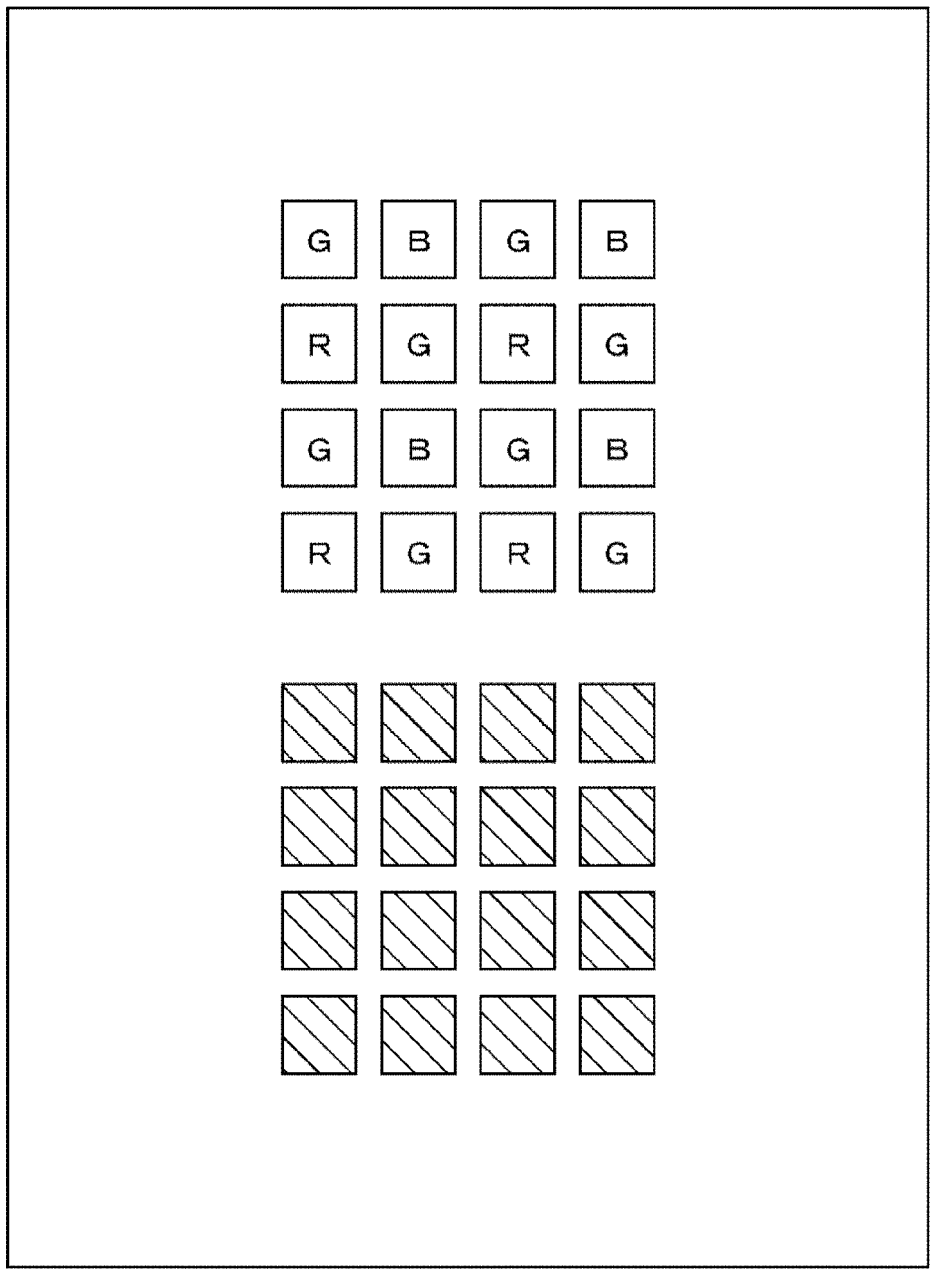
FIG. 36 is a view illustrating an example of a planar arrangement of an optical filter layer.

FIG. 36 is a diagram illustrating an example of planar arrangements of the first and second optical filter layers in the visible light pixel 51.

The lower part of FIG. 36 illustrates an arrangement of the first optical filter layer in the visible light pixel 51. The upper part of FIG. 36 illustrates an arrangement of the second optical filter layer in the visible light pixel 51.

The arrangement of the second optical filter layer indicates that the R, G, and B pixels are arranged in a Bayer array in the example of FIG. 36. In other words, in the lower part of FIG. 36, the first optical filter layer is an infrared cut filter, and in the upper part of FIG. 36, the second optical filter layer is a color filter of R, G, and B pixels.

Note that a color filter of any color other than the above-described three colors of R, G, and B may be used as a color filter of the visible light pixel 51. For example, a cyan, magenta, or yellow color filter may be used, or a transparent color filter may be used.

Furthermore, also in the present embodiment, as in the first embodiment, the infrared cut filter 63 of the visible light pixel 51 preferably includes an organic material to which a near infrared absorptive dye is added as an organic color material, and the pyrrolopyrrole dye illustrated in the chemical formula of FIG. 7 is preferably used.

Moreover, in the present embodiment, the spectral characteristics of the infrared cut filter 63 are also similar to those in the first embodiment.

(Regarding Flow of Pixel Formation)

Figure 37:
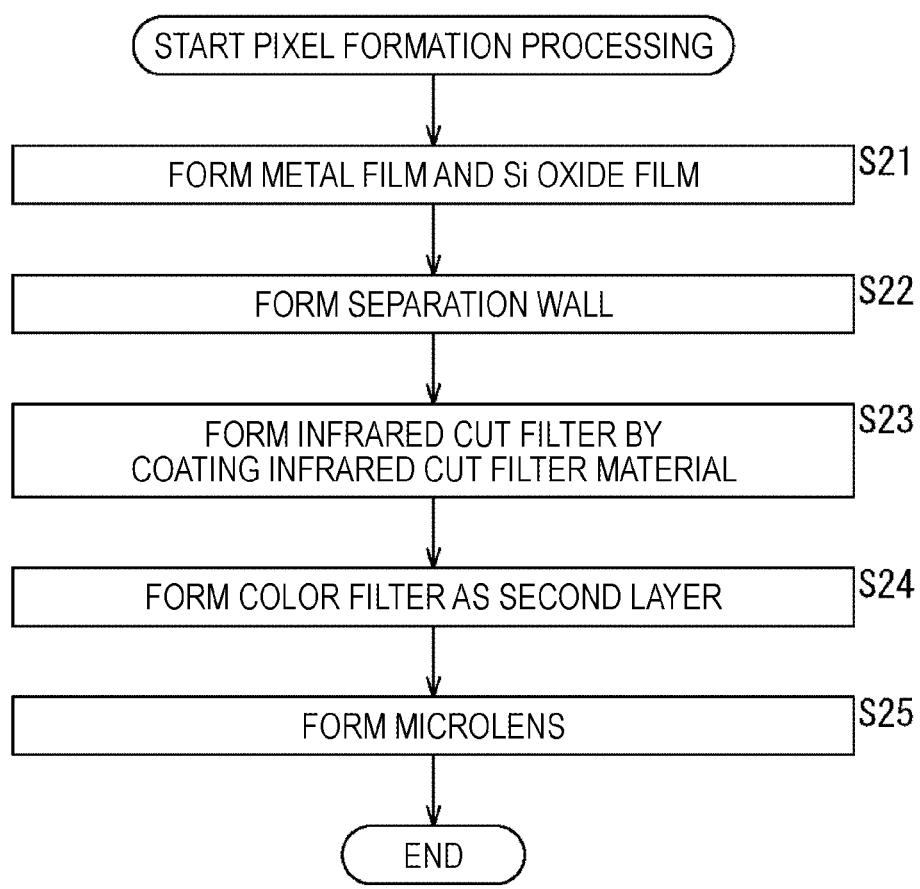
FIG. 37 is a flowchart for explaining pixel formation processing.
Figure 38:
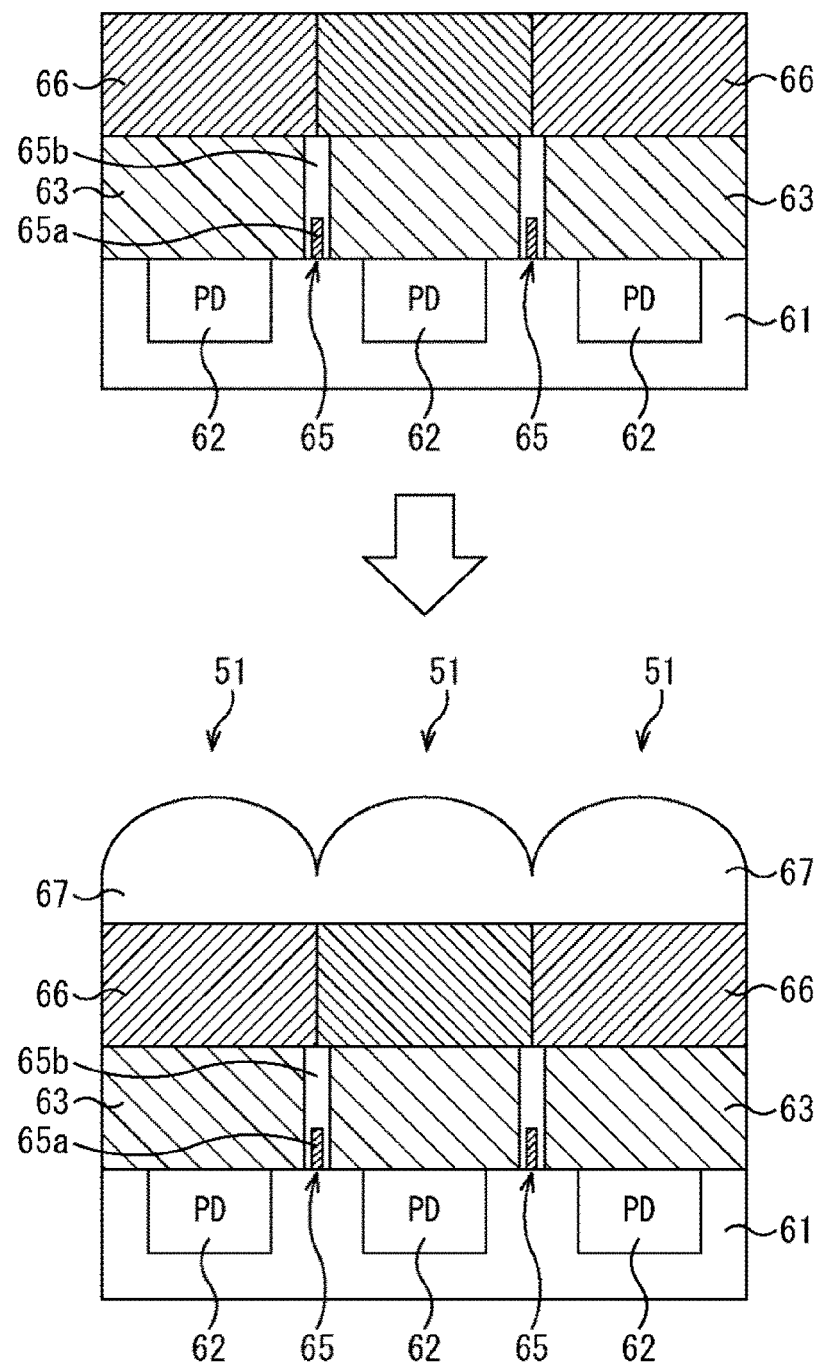
FIG. 38 is a diagram for explaining a step of pixel formation.

Next, a flow of pixel formation according to the present embodiment will be described with reference to FIGS. 37 and 38. FIG. 37 is a flowchart for explaining pixel formation processing, and FIG. 38 is a cross-sectional view illustrating steps of pixel formation.

Note that processing in steps S21 and S22 in the flowchart of FIG. 37 is similar to processing in steps S11 and S12 in the flowchart of FIG. 9 (steps in the upper and middle parts of FIG. 10), and therefore description thereof will be omitted.

In step S23, coating is performed with an infrared cut filter material 63' (FIG. 10) by spin coating. As illustrated in the lower part of FIG. 10, a film of the infrared cut filter material 63' is formed (embedded) in a region surrounded by the separation wall 65. As a result, the infrared cut filter 63 is formed as the first optical filter layer of the visible light pixel 51.

Subsequently, in step S24, as illustrated in the upper part of FIG. 38, the color filter 66 as a second layer is formed as a second optical filter layer for each of the pixels.

Then, in step S25, as illustrated in the lower part of FIG. 38, the microlens 67 is uniformly formed for each of the pixels.

In this way, the visible light pixel 51 is formed.

According to the above configuration and processing, the infrared cut filter 63 is formed as the first optical filter layer in the visible light pixel 51, and the color filter 66 is formed as the second optical filter layer. As a result, as illustrated in FIG. 13, an R pixel, a G pixel, and a B pixel have such spectral characteristics that the transmittance is low in an infrared light region at a wavelength of about 850 nm.

As a result, it is possible not to dispose an infrared light cut filter on a sealing glass of a package, and as a result, the height of the package can be reduced. Moreover, by disposing no infrared light cut filter on the sealing glass of the package, occurrence of ghost due to further reflection of light reflected on a light receiving surface by the infrared cut filter can be suppressed.

Furthermore, the separation wall 65 separating the first optical filter layer for each or the pixels is formed in each of the pixels. Therefore, occurrence of color mixing between visible light pixels can be suppressed more reliably.

In addition, in the present embodiment, the infrared cut filter 63 is processed while being surrounded by the separation walls 65, and therefore processing can be performed without damaging the side surface of the infrared cut filter 63.

Moreover, when the first optical filter is formed, the first optical filter can be formed so as to have a desired thickness due to the height of the separation wall 65.

Furthermore, the infrared cut filter 63 includes an organic material to which an organic or inorganic color material is added, and therefore the infrared cut filter 63 can uniformly contain the color material. As a result, unlike the infrared cut filter of Patent Document 1, the transmission distribution of infrared light does not depend on the incident angle, and a constant transmittance can be obtained regardless of the incident angle of infrared light. Furthermore, the number of steps does not increase, and therefore an increase in difficulty of the process can be avoided.

Moreover, two optical filter layers are formed in each of the pixels. Therefore, the height of the entire optical filter layers is easily equalized, and occurrence of application unevenness can be suppressed when a microlens material is applied.

(Measures Against Flare and Ghost Caused by Reflection of Infrared Light)

The configuration of the entire solid-state imaging apparatus 31 of the present embodiment can also adopt a similar configuration to that of the first embodiment.

Figure 39:
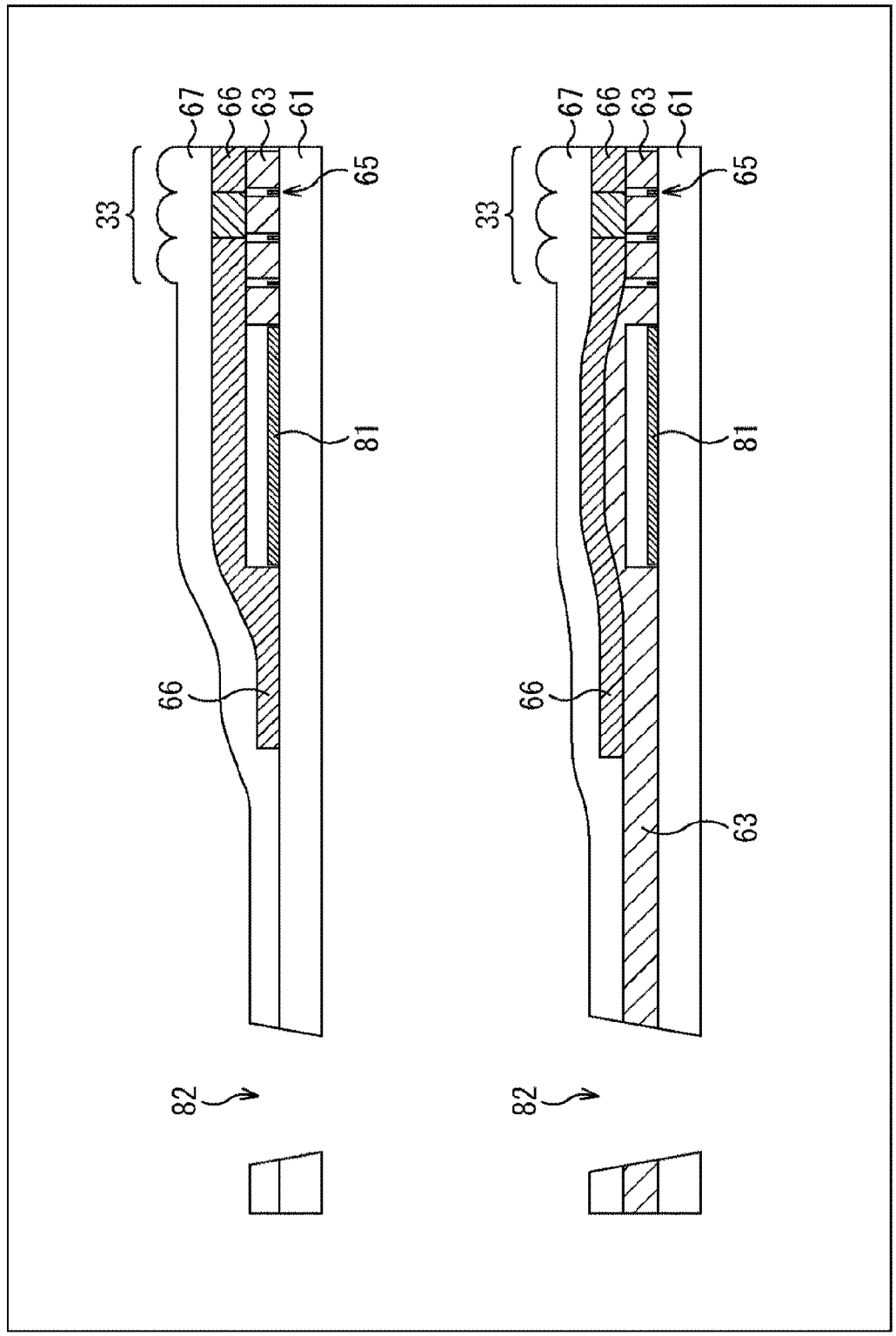
FIG. 39 is a cross-sectional view illustrating a configuration example of the entire solid-state imaging apparatus.

FIG. 39 is a cross-sectional view illustrating a configuration example of the entire solid-state imaging apparatus 31.

A first configuration example of the solid-state imaging apparatus 31 is illustrated in the upper part of FIG. 39, and a second configuration example of the solid-state imaging apparatus 31 is illustrated in the lower part of FIG. 39.

On the right side of the drawing, a part of the pixel region 33 in which pixels are arranged is illustrated. In FIG. 39, the right direction is a direction toward the center of the pixel region 33, and the left direction is a direction toward the outside (end portion) of the entire chip.

In the drawing, on the left side of the pixel region 33 (around the pixel region 33), a circuit unit 81 constituting a peripheral circuit is disposed. Furthermore, in the drawing, on the left end (end portion of the chip), a connection hole 82 in which a conductor to be connected to an electrode pad formed on the chip is embedded is disposed.

Here, in the first configuration example in the upper part of FIG. 39, the color filter 66 is formed even in a region other than the pixel region 33, specifically, even in a region outside the circuit unit 81. As a result, it is possible to suppress reflection of visible light corresponding to a predetermined color and transmission of the light to the circuit unit 81.

However, in the first configuration example, in a case where infrared light in a specific wavelength region is incident on the chip, flare and ghost may occur by reflection of the infrared light by a portion other than the pixel, and S/N may deteriorate.

Meanwhile, in the second configuration example in the lower part of FIG. 39, the infrared cut filter 63 is formed even in a region other than the pixel region 33, specifically, even in the entire chip region. As a result, it is possible to suppress reflection of the infrared light by a portion other than the pixel. Therefore, occurrence of flare and ghost can be suppressed, and deterioration of S/N can be further suppressed.

Moreover, a step outside the pixel region 33 can be reduced by forming the infrared cut filter 63 in the entire chip region. Therefore, occurrence of application unevenness can be suppressed when a color filter material or a microlens material is applied.

(Another Configuration of Separation Wall)

As in the first embodiment, also in the present embodiment, the separation wall separating the first optical filter layer for each of the pixels includes the metal film 65*a* including W, Al, or the like, and the Si oxide film 65*b* including SiO2, SiN, or the like.

Figure 40:
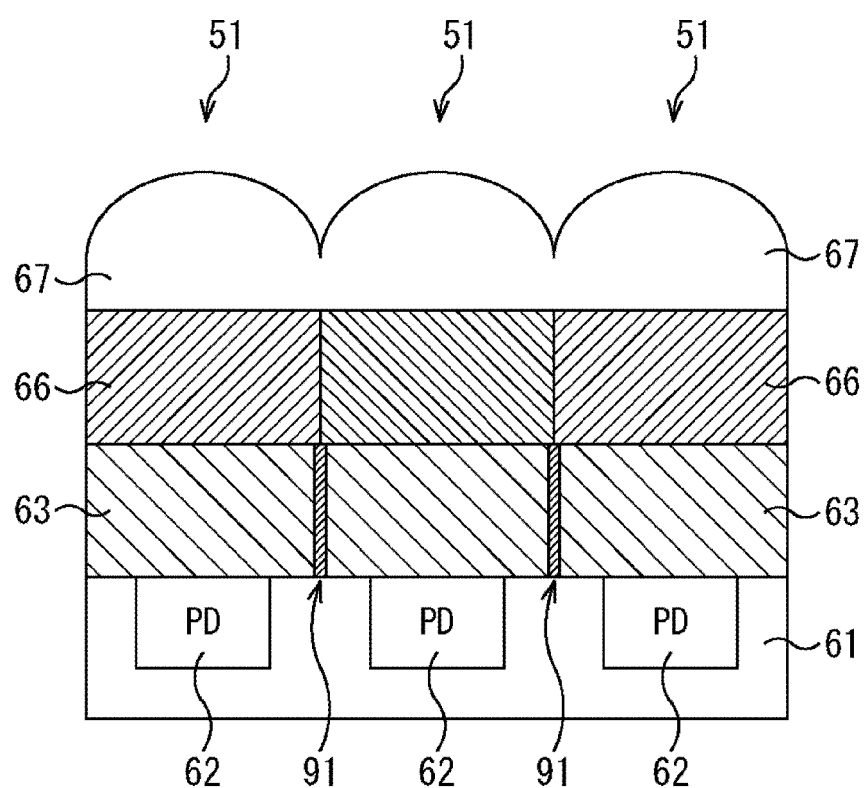
FIG. 40 is a cross-sectional view illustrating another configuration example of the pixel.
Figure 41:
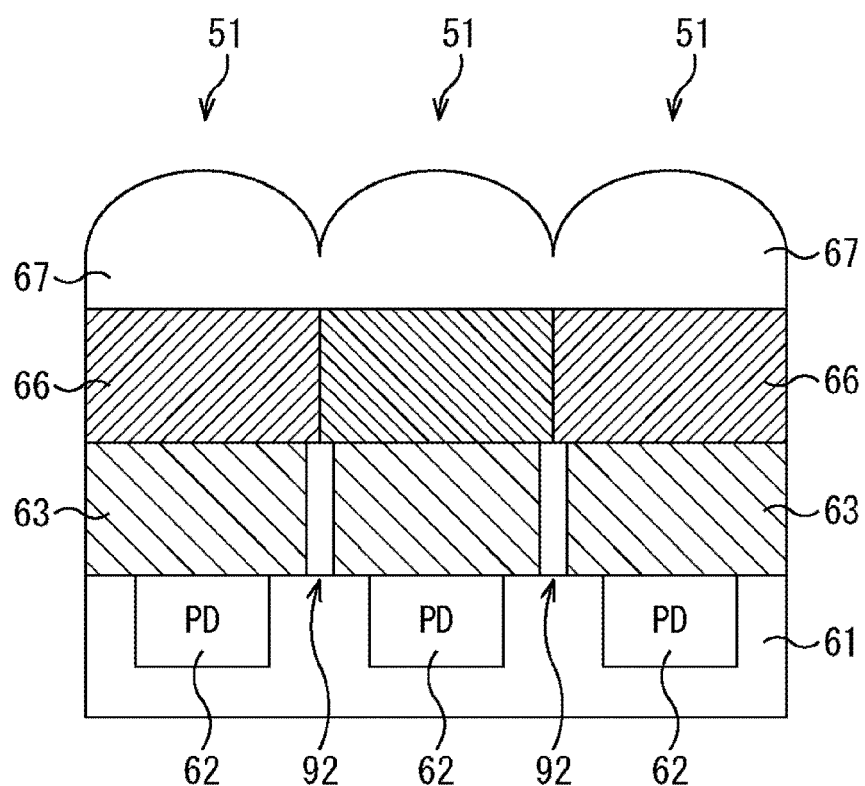
FIG. 41 is a cross-sectional view illustrating still another configuration example of the pixel.

However, the material of the separation wall is not limited thereto. For example, as illustrated in FIG. 40, the separation wall 91 may include only a metal film including N, Al, or the like. Alternatively, as illustrated in FIG. 41, the separation wall 92 may include only a Si oxide film including SiO2, SiN, or the like.

Figure 42:
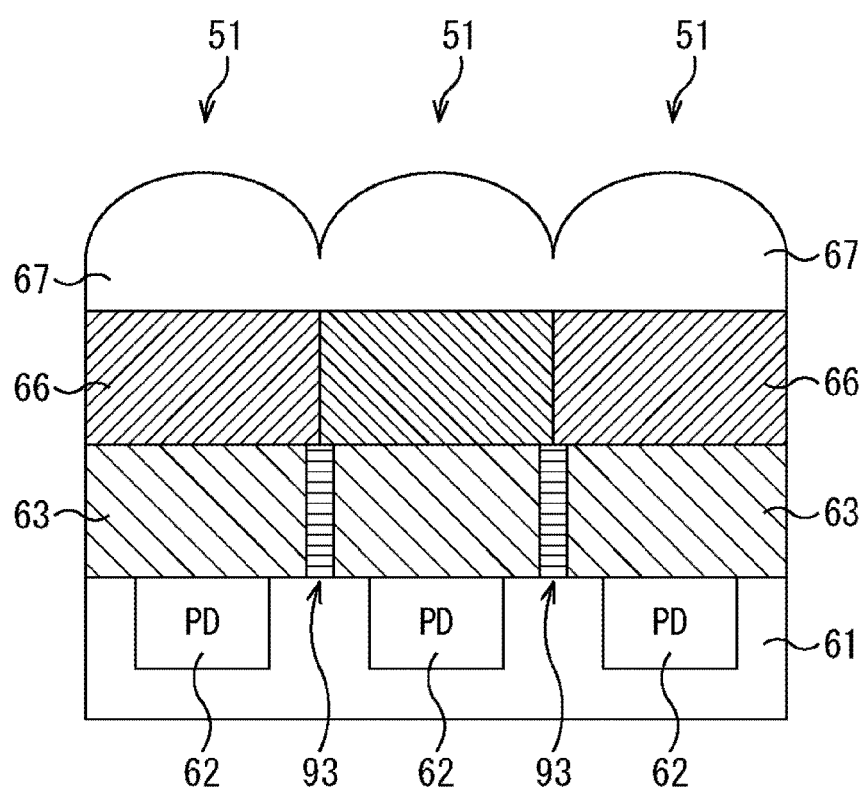
FIG. 42 is a cross-sectional view illustrating still another configuration example of the pixel.

Furthermore, as illustrated in FIG. 42, the separation wall 93 may include an organic resin having a refractive index equal to or lower than that of the color filter 66. The separation wall 93 may include an organic resin containing a filler. The separation wall 93 desirably has a refractive index of 1.5 or less.

Furthermore, in the above-described example, the height of the separation wall separating the first optical filter layer for each of the pixels is the same as the height of the first optical filter layer (infrared cut filter 63).

Figure 43:
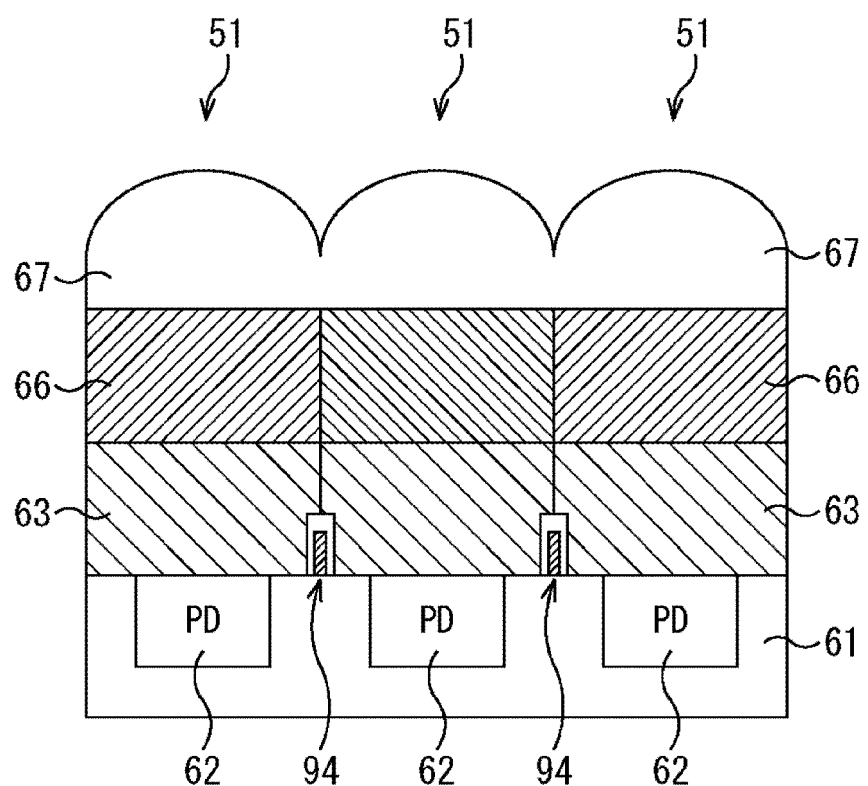
FIG. 43 is a cross-sectional view illustrating still another configuration example of the pixel.

However, the height of the separation wall is not limited thereto. For example, as illustrated in FIG. 43, the height of a separation wall 94 may be about ⅓ to ¼ of the height of the first optical filter layer. In this case, the height of the separation wall 94 is desirably at least 100 nm or more.

Figure 44:
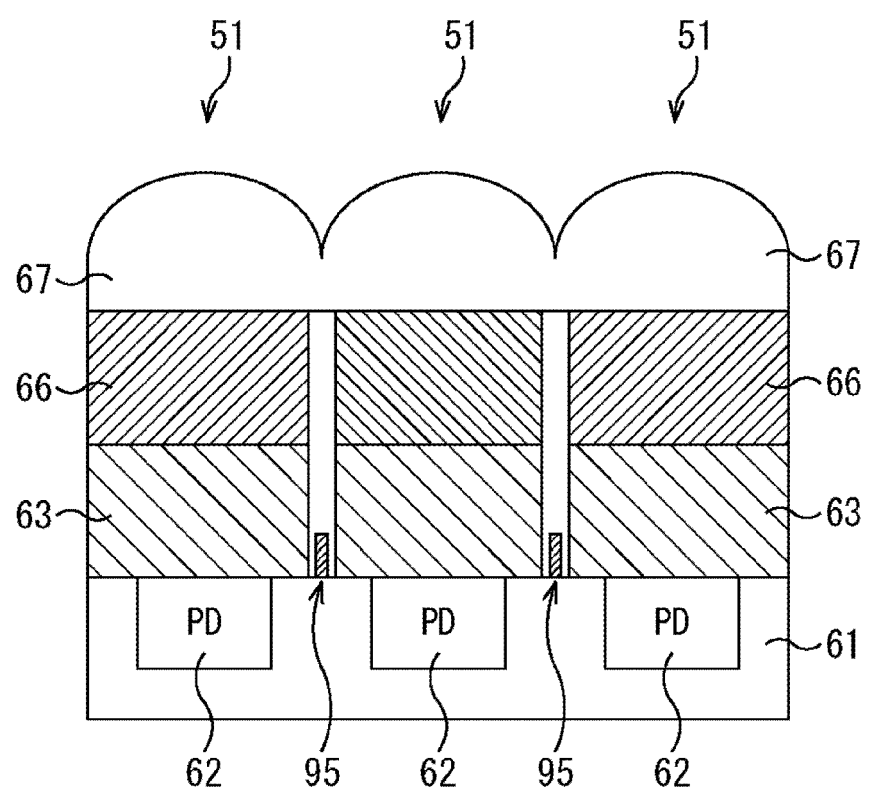
FIG. 44 is a cross-sectional view illustrating still another configuration example of the pixel.
Figure 45:
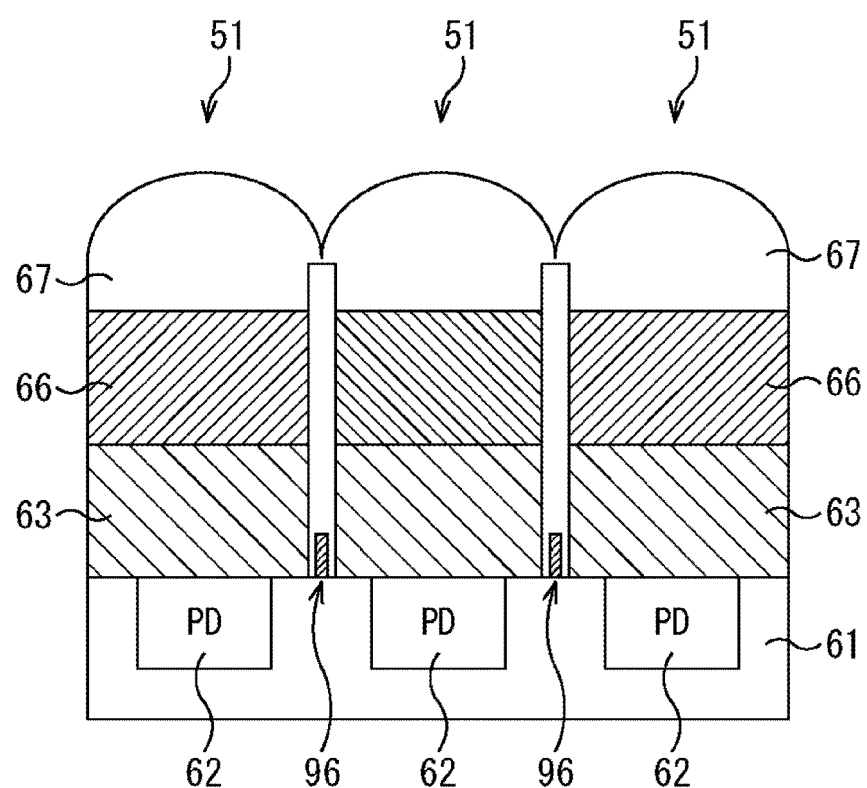
FIG. 45 is a cross-sectional view illustrating still another configuration example of the pixel.

Furthermore, as illustrated in FIG. 44, the height of a separation wall 95 may be the same as the total height of the first optical filter layer and the second optical filter layer (color filter 66). Alternatively, as illustrated in FIG. 45, the height of a separation wall 96 may be higher than the total height of the first optical filter layer and the second optical filter layer to reach the microlens 67.

Moreover, in addition to the above-described configuration, each of the pixels may have a PD separation wall separating the photoelectric conversion unit 62 for each of the pixels. In this case, the PD separation wall can be formed integrally with the separation wall 65 and the like in the above-described configuration.

Figure 46:
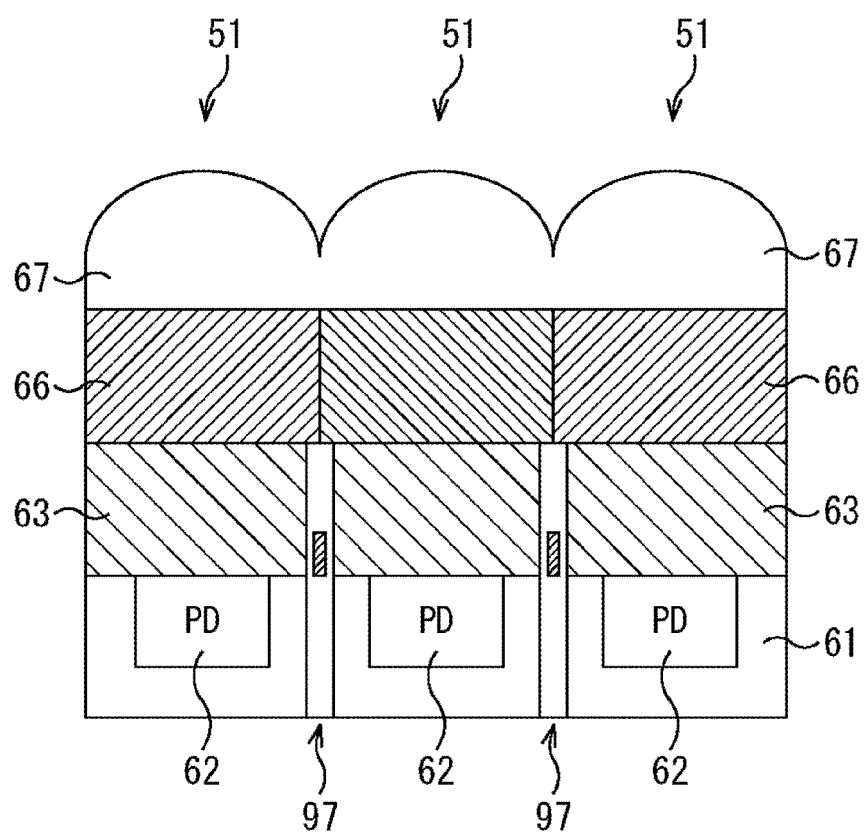
FIG. 46 is a cross-sectional view illustrating still another configuration example of the pixel.

For example, as illustrated in FIG. 46, a separation wall 97 separating the photoelectric conversion unit 62 and the first optical filter layer for each of the pixels is disposed. A portion of the separation wall 97 corresponding to the PD separation wall includes a Si oxide film including SiO2, SiN, or the like.

Figure 47:
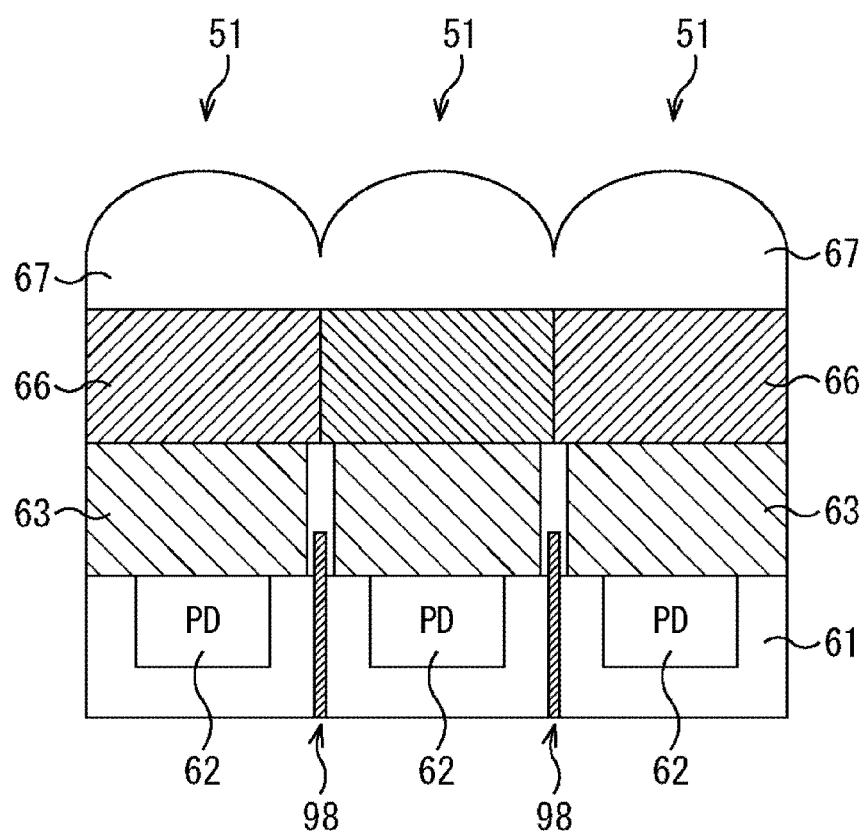
FIG. 47 is a cross-sectional view illustrating still another configuration example of the pixel.

Furthermore, as illustrated in FIG. 47, a separation wall 98 separating the photoelectric conversion unit 62 and the first optical filter layer for each of the pixels is disposed. A portion of the separation wall 98 corresponding to the PD separation wall includes a metal film including W, Al, or the like.

In this way, by further disposing the PD separation wall separating the photoelectric conversion unit 62 for each of the pixels, occurrence of color mixing between the pixels can be more reliably suppressed.

(Another Configuration of Optical Filter Layer)

As in the first embodiment, also in the present embodiment, in the visible light pixel 51, the infrared cut filter 63 is formed as the first optical filter layer, and the color filter 66 is formed as the second optical filter layer.

Figure 48:
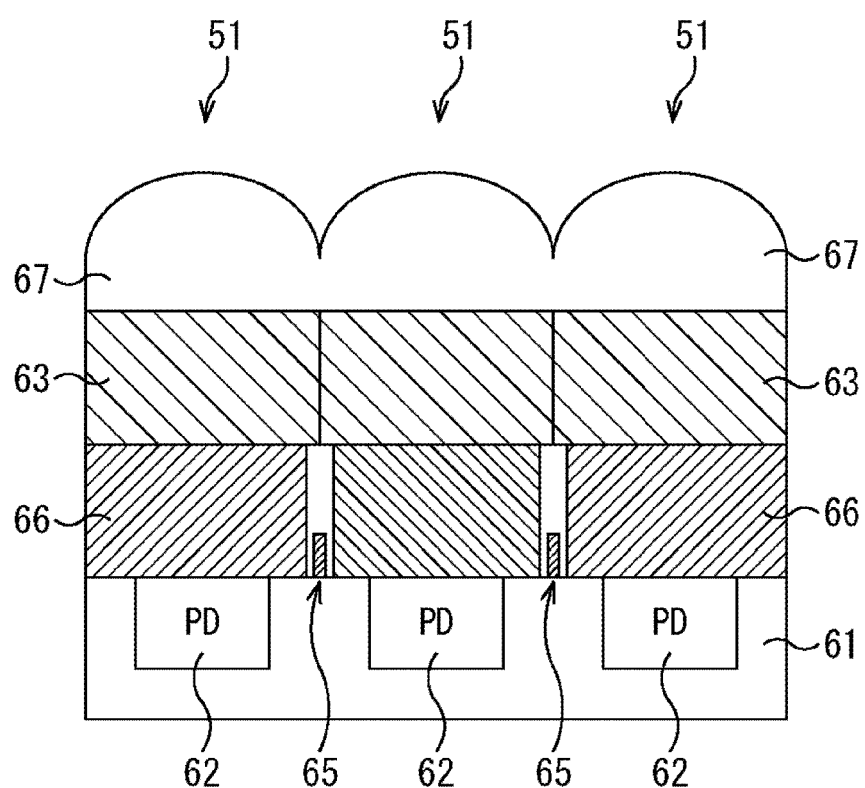
FIG. 48 is a cross-sectional view illustrating still another configuration example of the pixel.

However, conversely, as illustrated in FIG. 48, of course, the color filter 66 can be formed as the first optical filter layer, and the infrared cut filter 63 can be formed as the second optical filter layer.

Modification Example

As in the first embodiment, also in the present embodiment, the color filter 66 as the second optical filter layer is formed directly on the first optical filter layer.

Figure 49:
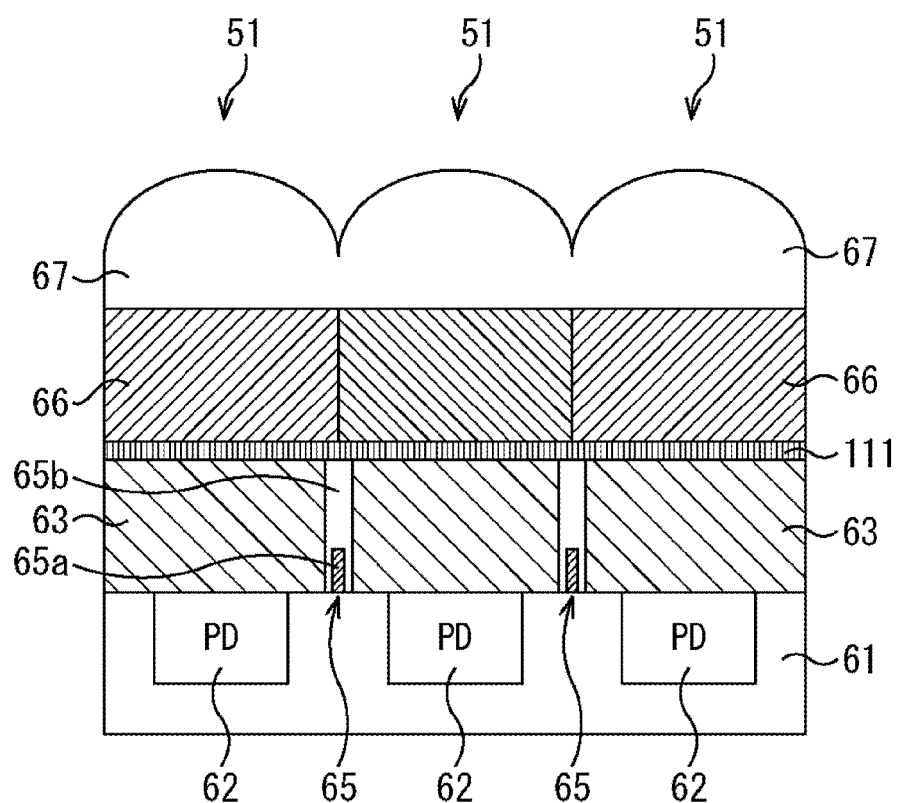
FIG. 49 is a cross-sectional view illustrating still another configuration example of the pixel.

The present invention is not limited thereto. As illustrated in FIG. 49, an organic film 111 may be formed between the first optical filter layer (infrared cut filter 63) and the second optical filter layer (color filter 66). Similarly, as illustrated in FIG. 50, an inorganic film 121 may be formed between the first optical filter layer (infrared cut filter 63) and the second optical filter layer (color filter 66).

Figure 51:
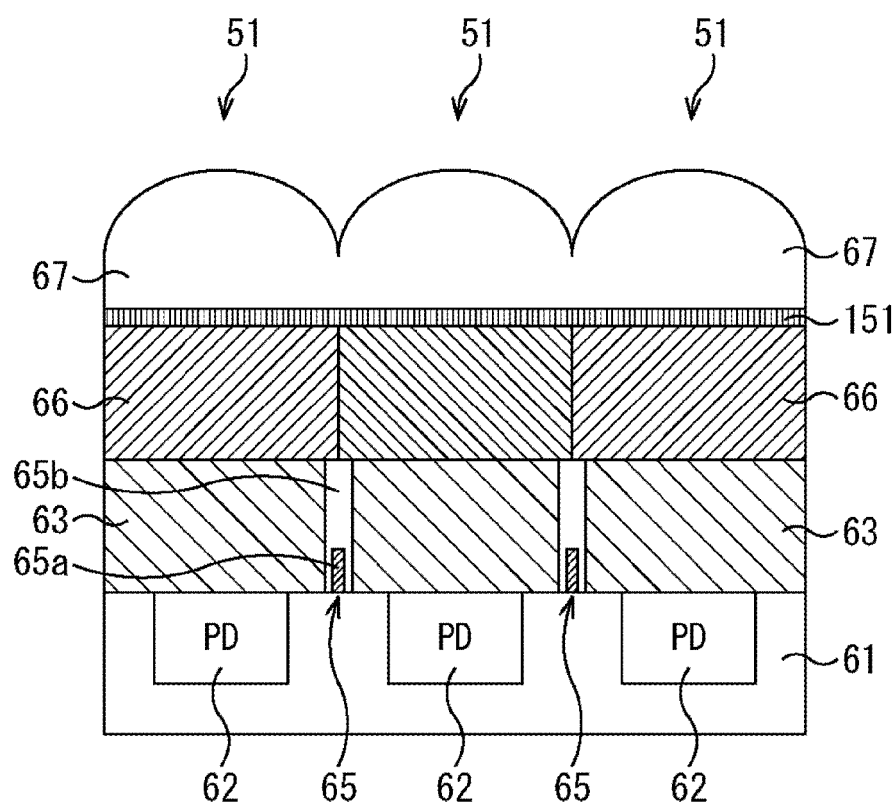
FIG. 51 is a cross-sectional view illustrating still another configuration example of the pixel.

Moreover, as illustrated in FIG. 51, an organic film 151 may be formed between the second optical filter layer (color filter 66) and the microlens 67. Similarly, as illustrated in FIG. 52, an inorganic film 161 may be formed between the second optical filter layer (color filter 66) and the microlens 67.

Figure 50:
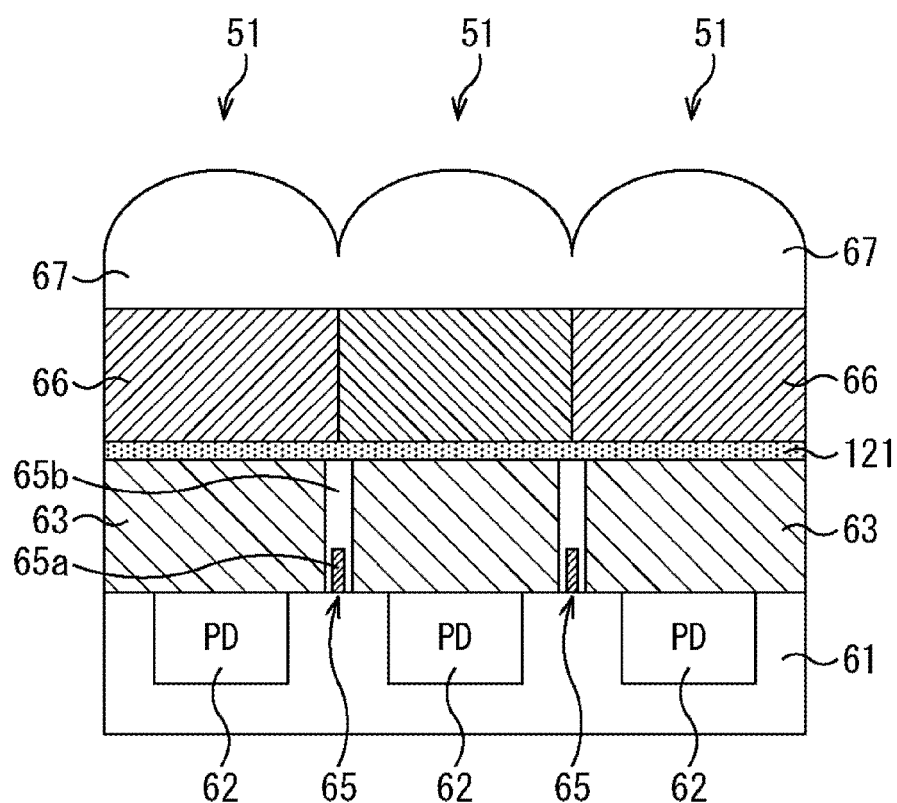
FIG. 50 is a cross-sectional view illustrating still another configuration example of the pixel.
Figure 52:
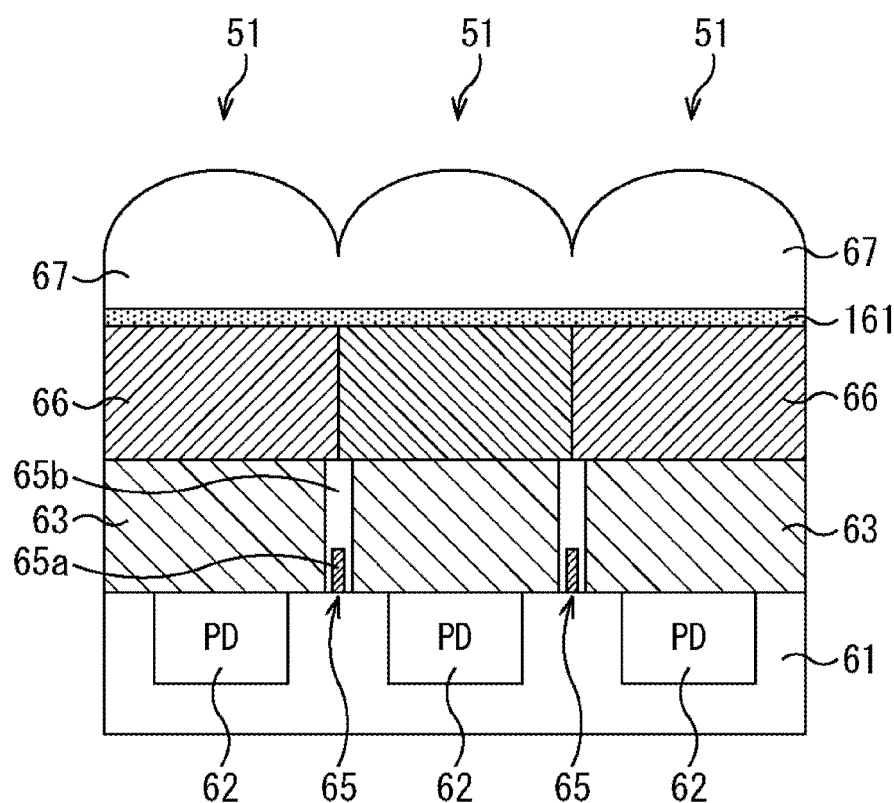
FIG. 52 is a cross-sectional view illustrating still another configuration example of the pixel.

Note that it is also possible to combine the structure of FIG. 51 or 52 with each of the structures of FIGS. 49 and 50.

5. Application Example of the Present Technology

The present technology can be applied not only to a CMOS image sensor but also to a charge coupled device (CCD) image sensor.

In a case where the present technology is applied to a CMOS image sensor, the CMOS image sensor can adopt a front-illuminated structure or a back-illuminated structure.

(Structure Example of Front-Illuminated Solid-State Imaging Apparatus)

Figure 53:
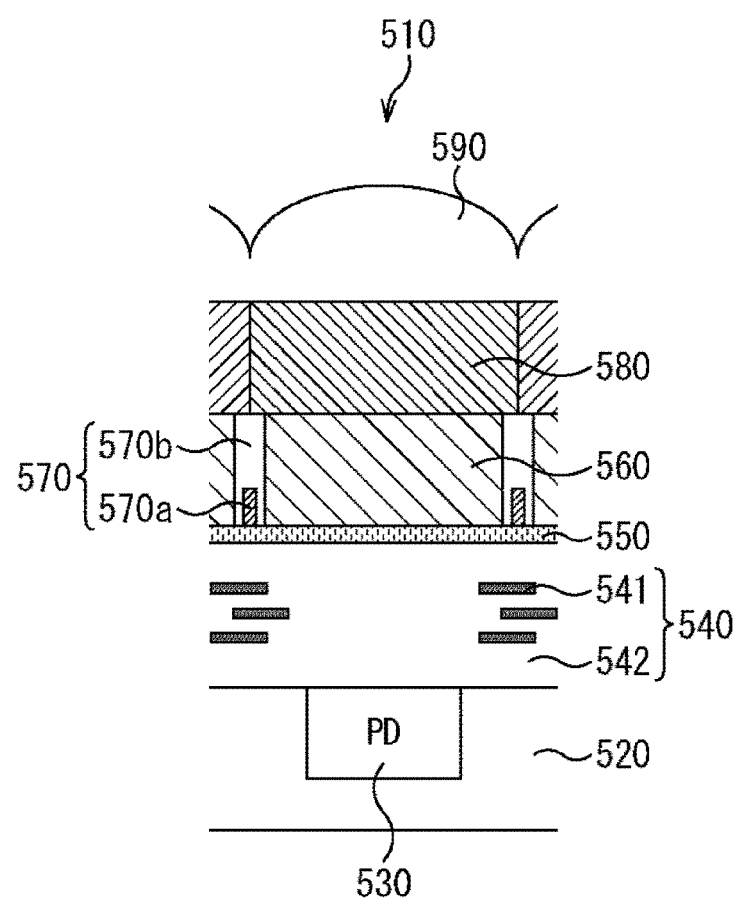
FIG. 53 is a cross-sectional view illustrating a configuration example of a front-illuminated solid-state imaging apparatus to which the present technology is applied.

FIG. 53 is a cross-sectional view illustrating a structure example of a front-illuminated solid-state imaging apparatus.

As illustrated in FIG. 53, in the front-illuminated solid-state imaging apparatus, a photodiode (PD) 530 is formed on a semiconductor substrate 520 for each of pixels 510. The PD 530 receives incident light incident from a front (upper surface in the drawing) side of the semiconductor substrate 520. On the semiconductor substrate 520, a wiring layer 540 is disposed.

The wiring layer 540 includes wiring 541 and an insulating layer 542 and is formed such that the wiring 541 is electrically connected to each element in the insulating layer 542. The wiring layer 540 is a so-called multilayered wiring layer and formed by alternately laminating an interlayer insulating film constituting the insulating layer 542 and the wiring 541 a plurality of times.

On the wiring layer 540, a planarizing film 550 is formed. On the planarizing film 550, an infrared cut filter 560 is formed as a first optical filter layer. On the infrared cut filter 560, a color filter 580 having spectral characteristics corresponding to each of the pixels 510 is formed as a second optical filter layer. On the color filter 580, a microlens 590 is formed. Note that a color filter is formed as the first optical filter layer in a case where the pixel 510 is constituted as an infrared light pixel.

Furthermore, each of the pixels 510 has a separation wall 570 separating the first optical filter layer for each of the pixels. The separation wall 570 includes a metal film 570a including W, Al, or the like, and an Si oxide film 570b including SiO2, SiN, or the like. In the drawing, the separation walls 570 are formed in a lattice shape so as to be interposed between the plurality of pixels 510 when the solid-state imaging apparatus is viewed from the upper surface side.

Figure 54:
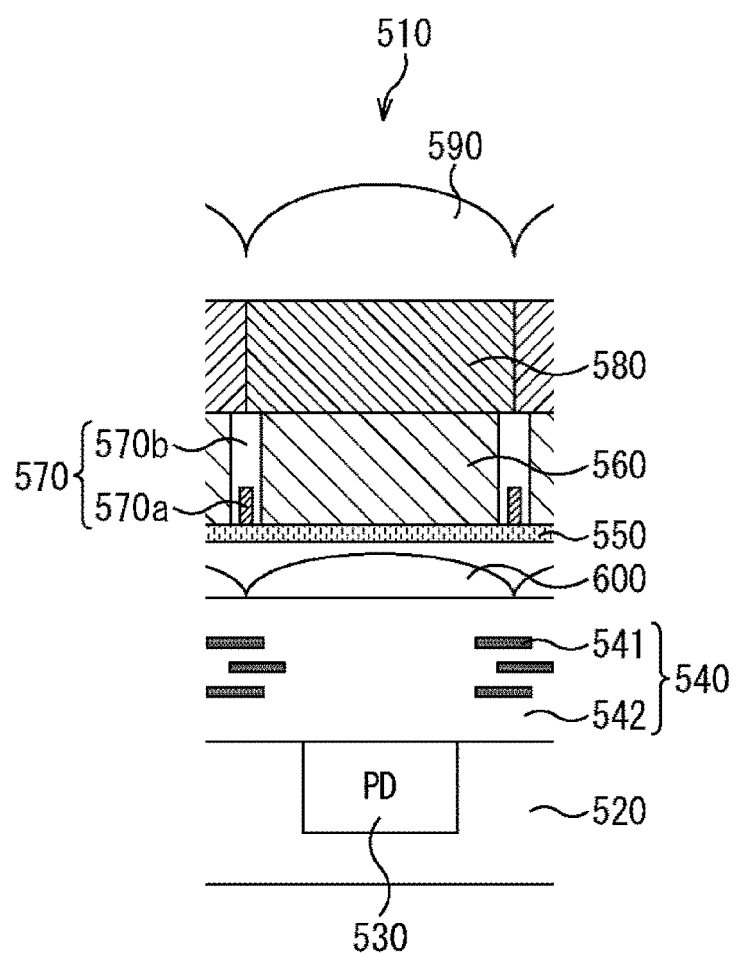
FIG. 54 is a cross-sectional view illustrating another configuration example of the front-illuminated solid-state imaging apparatus.

In the front-illuminated solid-state imaging apparatus, as illustrated in FIG. 54, an intralayer lens 600 may be disposed between the wiring layer 540 and the planarizing film 550.

(Structure Example of Back-Illuminated Solid-State Imaging Apparatus)

Figure 55:
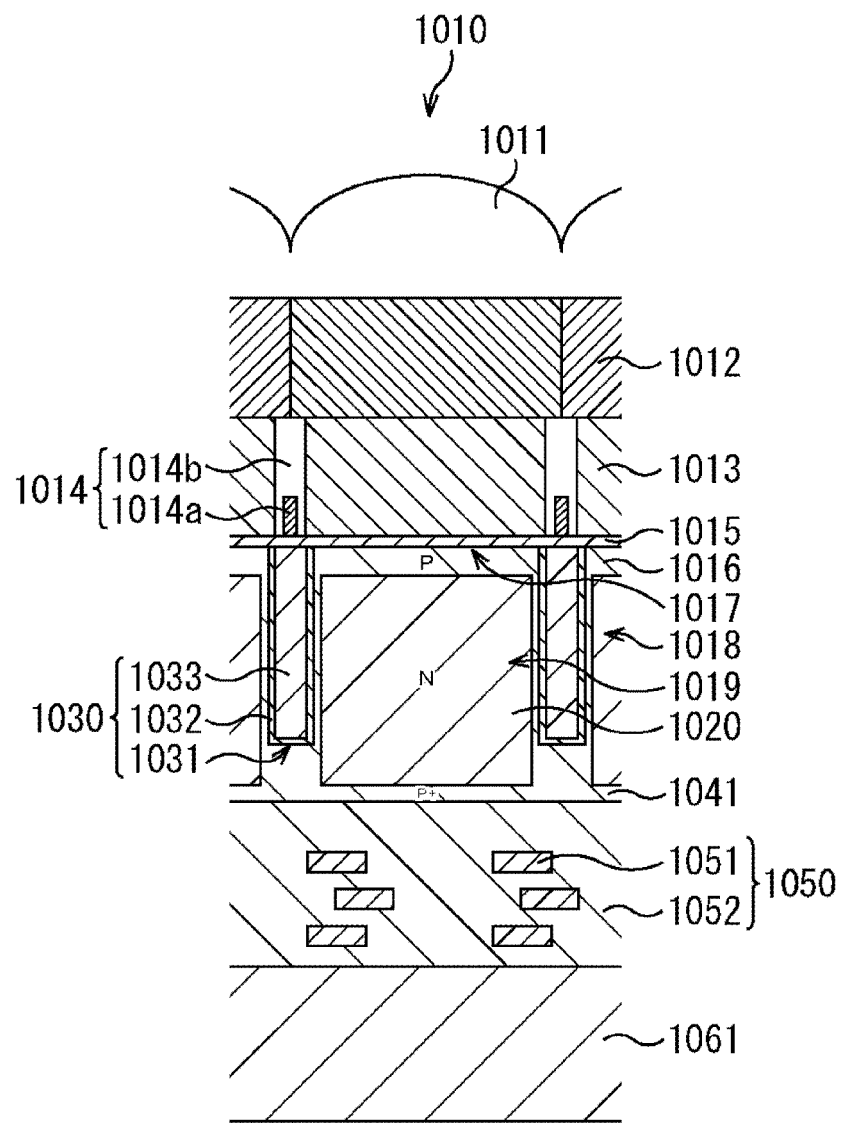
FIG. 55 is a cross-sectional view illustrating a configuration example of a back-illuminated solid-state imaging apparatus to which the present technology is applied.

FIG. 55 is a cross-sectional view illustrating a structure example of a back-illuminated solid-state imaging apparatus.

As illustrated in FIG. 55, in the back-illuminated solid-state imaging apparatus, a PD 1019 formed for each of pixels 1010 receives incident light incident from a back (upper surface in the drawing) side of a semiconductor substrate 1018.

On the upper surface side of the semiconductor substrate 1018, an insulating film 1015 such as a silicon oxide film is formed. On the insulating film 1015, an infrared cut filter 1013 is formed as a first optical filter layer. On the infrared cut filter 1013, a color filter 1012 having spectral characteristics corresponding to each of the pixels 1010 is formed as a second optical filter layer. On the color filter 1012, a microlens 1011 is formed. Note that a color filter is formed as the first optical filter layer in a case where the pixel 1010 is constituted as an infrared light pixel.

Furthermore, each of the pixels 1010 has a separation wall 1014 separating the first optical filter layer for each of the pixels. The separation wall 1014 includes a metal film 1014a including W, Al, or the like, and an Si oxide film 1014b including SiO2, SiN, or the like. In the drawing, the separation walls 1014 are formed in a lattice shape so as to be interposed between the plurality of pixels 1010 when the solid-state imaging apparatus is viewed from the upper surface side.

In the PD 1019, for example, an n-type semiconductor region 1020 is formed as a charge accumulation region for accumulating charges (electrons). In the PD 1019, the n-type semiconductor region 1020 is disposed in p-type semiconductor regions 1016 and 1041 of the semiconductor substrate 1018. The p-type semiconductor region 1041 having a higher impurity concentration than the back (upper surface) side is disposed on a front (lower surface) side of the semiconductor substrate 1018 in the n-type semiconductor region 1020. That is, the PD 1019 has a hole-accumulation diode (HAD) structure, and the p-type semiconductor regions 1016 and 1041 are formed so as to suppress generation of a dark current at each interface between the upper surface side and the lower surface side of the n-type semiconductor region 1020.

In the semiconductor substrate 1018, a pixel separation unit 1030 electrically separating the plurality of pixels 1010 from each other, and the PD 1019 is disposed in a region partitioned by the pixel separation units 1030. In the drawing, the pixel separation units 1030 are formed, for example, in a lattice shape so as to be interposed between the plurality of pixels 1010 when the solid-state imaging apparatus is viewed from the upper surface side, and the PD 1019 is formed in a region partitioned by the pixel separation units 1030.

In each of the PDs 1019, an anode is grounded. In the solid-state imaging apparatus, a signal charge (for example, an electron) accumulated in the PD 1019 is read through a transfer transistor (MOS PET) (not illustrated) and the like, and output to a vertical signal line (VSL) (not illustrated) as an electric signal. Note that the transistor is appropriately referred to as Tr in the following description.

A wiring layer 1050 is disposed on a surface (lower surface) opposite to the back surface (upper surface) of the semiconductor substrate 1018.

The wiring layer 1050 includes wiring 1051 and an insulating layer 1052 and is formed such that the wiring 1051 is electrically connected to each element in the insulating layer 1052. The wiring layer 1050 is a so-called multilayered wiring layer and formed by alternately laminating an interlayer insulating film constituting the insulating layer 1052 and the wiring 1051 a plurality of times.

A support substrate 1061 is disposed on a surface of the wiring layer 1050 on the opposite side to the side on which the PD 1019 is disposed. For example, a substrate including a silicon semiconductor having a thickness of several hundred μm is disposed as the support substrate 1061.

The pixel separation unit 1030 includes a groove portion 1031, a fixed charge film 1032, and an insulating film 1033.

The fixed charge film 1032 is formed so as to cover the groove portion 1031 partitioning the plurality of pixels 1010 from each other on the back (upper surface) side of the semiconductor substrate 1018.

Specifically, the fixed charge film 1032 is disposed so as to cover an inner surface of the groove portion 1031 formed on the back (upper surface) side of the semiconductor substrate 1018 with a fixed thickness. In addition, an insulating film 1033 is disposed (filled) so as to be embedded in the groove portion 1031 covered with the fixed charge film 1032.

Here, the fixed charge film 1032 is formed using a high dielectric substance having a negative fixed charge such that a positive charge (hole) accumulation region is formed at an interface with the semiconductor substrate 1018 to suppress generation of a dark current. Since the fixed charge film 1032 is formed so as to have a negative fixed charge, an electric field is applied to the interface with the semiconductor substrate 1018 by the negative fixed charge, and a positive charge (hole) accumulation region is formed.

The fixed charge film 1032 can include, for example, a hafnium oxide film (HfO2 film). Furthermore, the fixed charge film 1032 can also be formed so as to include at least one of oxides of, for example, hafnium, zirconium, aluminum, tantalum, titanium, magnesium, yttrium, lanthanoid elements, and the like.

The present technology can be applied to the above-described solid-state imaging apparatus.

(Configuration Example of Laminated Solid-State Imaging Apparatus)

Figure 56:
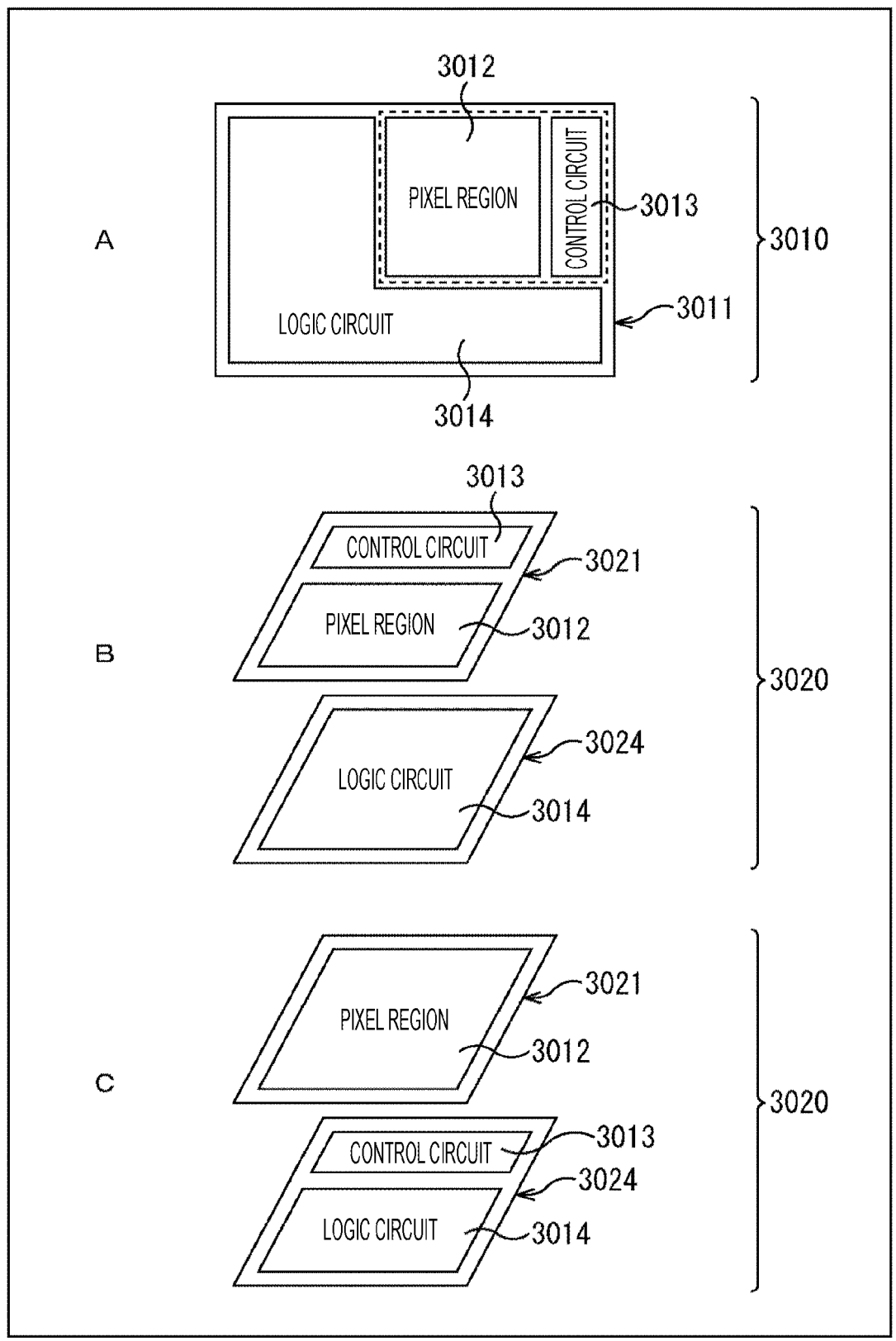
FIG. 56 is a diagram illustrating an outline of a configuration example of a laminated solid-state imaging apparatus to which the present technology can be applied.

FIG. 56 is a diagram illustrating an outline of a configuration example of a laminated solid-state imaging apparatus to which the present technology can be applied.

A of FIG. 56 illustrates a schematic configuration example of a non-laminated solid-state imaging apparatus. As illustrated in A of FIG. 56, a solid-state imaging apparatus 3010 includes one die (semiconductor substrate) 3011. On this die 3011, a pixel region 3012 in which pixels are arranged in an array, a control circuit 3013 that performs driving of a pixel and other various controls, and a logic circuit 3014 for signal processing are mounted.

B and C of FIG. 56 illustrate schematic configuration examples of a laminated solid-state imaging apparatus. As illustrated in B and C of FIG. 56, in a solid-state imaging apparatus 3020, two dies of a sensor die 3021 and a logic die 3024 are laminated and electrically connected to each other to be constituted as a single semiconductor chip.

In B of FIG. 56, the pixel region 3012 and the control circuit 3013 are mounted on the sensor die 3021, and the logic circuit 3014 including a signal processing circuit that performs signal processing is mounted on the logic die 3024.

In C of FIG. 56, the pixel region 3012 is mounted on the sensor die 3021, and the control circuit 3013 and the logic circuit 3014 are mounted on the logic die 3024.

Figure 57:
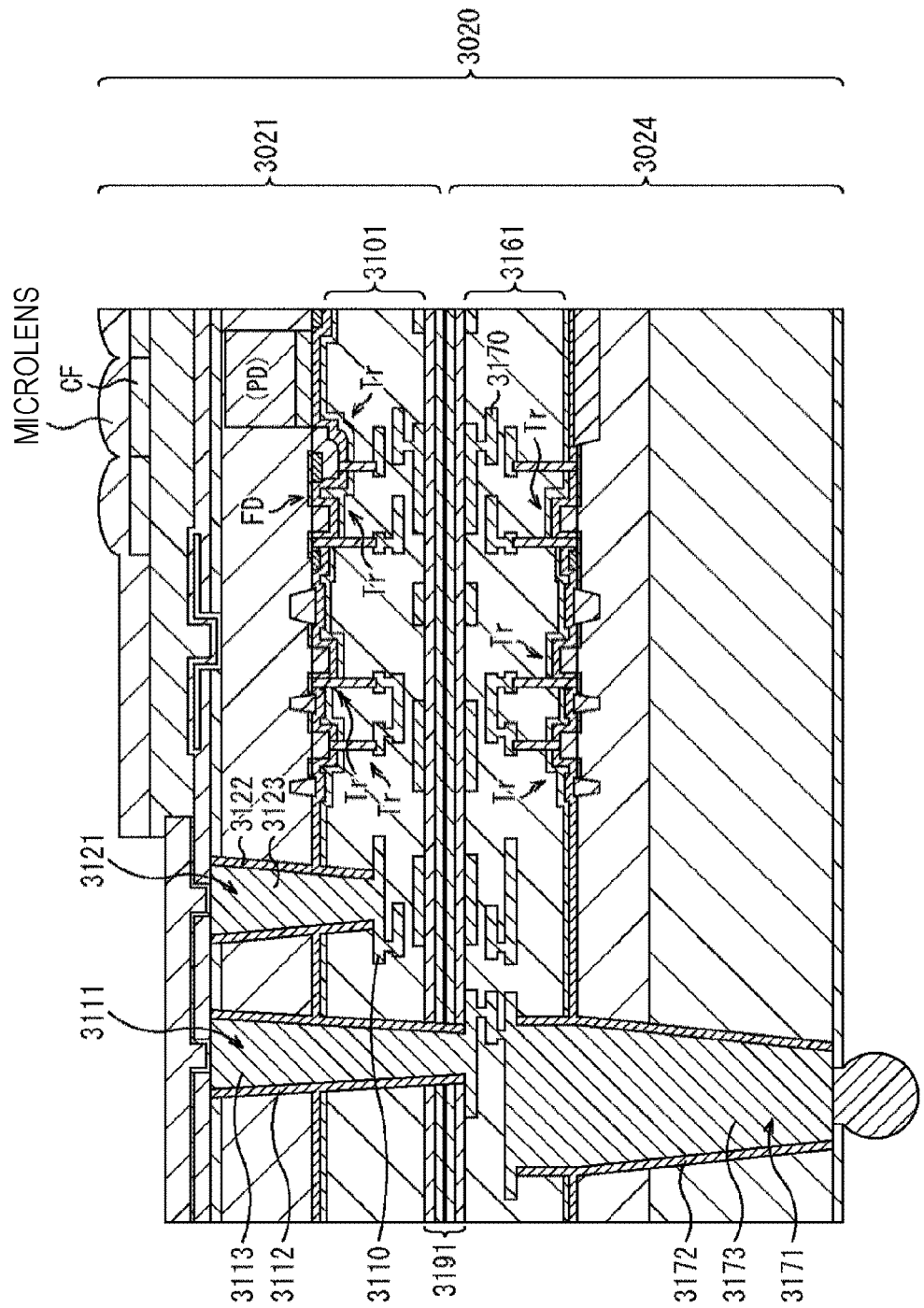
FIG. 57 is a cross-sectional view illustrating a first configuration example of the laminated solid-state imaging apparatus.

FIG. 57 is a cross-sectional view illustrating a first configuration example of the laminated solid-state imaging apparatus 3020.

In the sensor die 3021, a photodiode (PD) constituting a pixel to be the pixel region 3012, a floating diffusion (FD), a Tr (MOS FET), a Tr to be the control circuit 3013, and the like are formed. Moreover, in the sensor die 3021, a wiring layer 3101 having a multilayered wiring 3110, in this example, having three-layered wiring 3110, is formed. Note that the control circuit 3013 (Tr to be the control circuit 3013) can be constituted not in the sensor die 3021 but in the logic die 3024.

In the logic die 3024, a Tr constituting the logic circuit 3014 is formed. Moreover, in the logic die 3024, a wiring layer 3161 having a multilayered wiring 3170, in this example, having three-layered wiring 3170, is formed. Furthermore, a connection hole 3171 in which an insulating film 3172 is formed on an inner wall surface is formed in the logic die 3024, and a connection conductor 3173 to be connected to the wiring 3170 or the like is embedded in the connection hole 3171.

The sensor die 3021 and the logic die 3024 are bonded to each other such that the wiring layers 3101 and 3161 thereof face each other to constitute a laminated solid-state imaging apparatus 3020 in which the sensor die 3021 and the logic die 3024 are laminated. On the surface to which the sensor die 3021 and the logic die 3024 are bonded, a film 3191 such as a protective film is formed.

In the sensor die 3021, a connection hole 3111 is formed which passes through the sensor die 3021 from the back side (side on which light is incident on PD) (upper side) of the sensor die 3021 and reaches the wiring 3170 as the uppermost layer of the logic die 3024. Moreover, in the sensor die 3021, a connection hole 3121 reaching the wiring 3110 as the first layer from the back side of the sensor die 3021 is formed close to the connection hole 3111. An insulating film 3112 is formed on an inner wall surface of the connection hole 3111, and an insulating film 3122 is formed on an inner wall surface of the connection hole 3121. Then, connection conductors 3113 and 3123 are embedded in the connection holes 3111 and 3121, respectively. The connection conductor 3113 is electrically connected to the connection conductor 3123 on the back side of the sensor die 3021. As a result, the sensor die 3021 is electrically connected to the logic die 3024 through the wiring layer 3101, the connection hole 3121, the connection hole 3111, and the wiring layer 3161.

Figure 58:
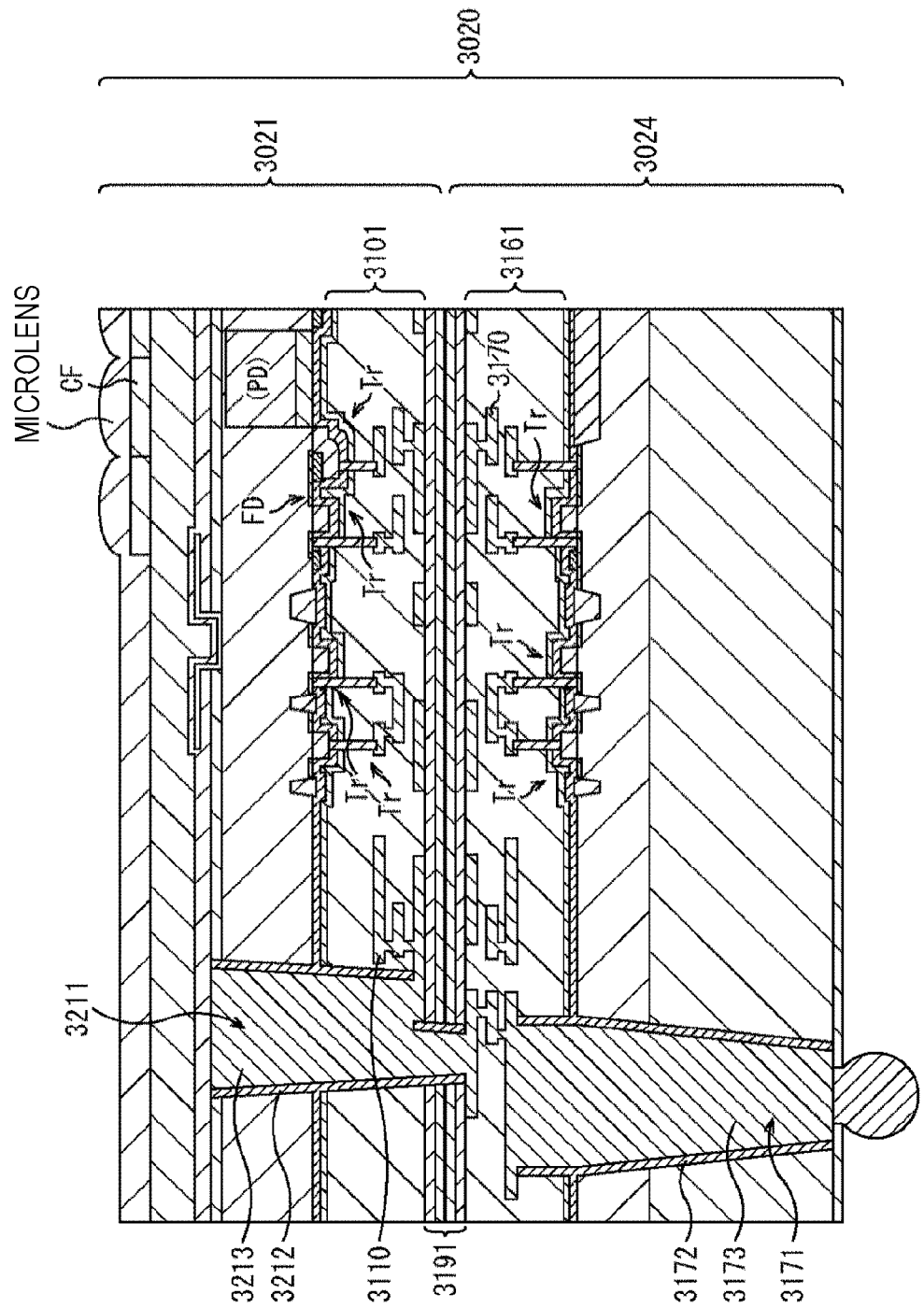
FIG. 58 is a cross-sectional view illustrating a second configuration example of the laminated solid-state imaging apparatus.

FIG. 58 is a cross-sectional view illustrating a second configuration example of the laminated solid-state imaging apparatus 3020.

In the second configuration example of the solid-state imaging apparatus 3020, one connection hole 3211 formed in the sensor die 3021 electrically connects the sensor die 3021 (wiring layer 3101 of the sensor die 3021 (wiring 3110 of the wiring layer 3101)) to the logic die 3024 (wiring layer 3161 of the logic die 3024 (wiring 3170 of the wiring layer 3161)).

In other words, in FIG. 58, the connection hole 3211 is formed so as to pass through the sensor die 3021 from the back side of the sensor die 3021, reach the wiring 3170 as the uppermost layer of the logic die 3024, and reach the wiring 3110 as the uppermost layer of the sensor die 3021. An insulating film 3212 is formed on an inner wall surface of the connection hole 3211, and a connection conductor 3213 is embedded in the connection hole 3211. In the example of FIG. 57 described above, the sensor die 3021 and the logic die 3024 are electrically connected to each other by the two connection holes 3111 and 3121. However, in the example of FIG. 58, the sensor die 3021 and the logic die 3024 are electrically connected to each other by the one connection hole 3211.

Figure 59:
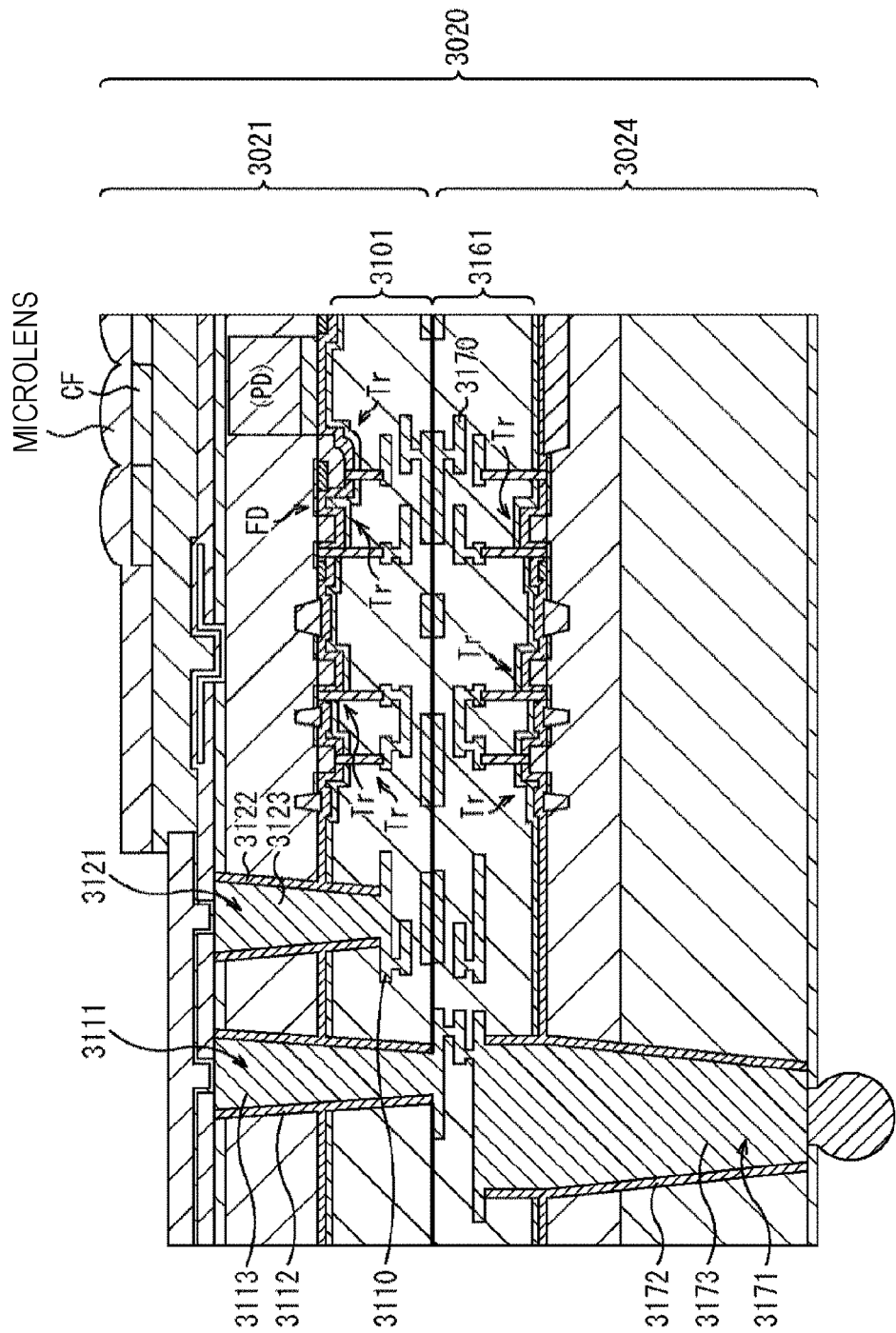
FIG. 59 is a cross-sectional view illustrating a third configuration example of the laminated solid-state imaging apparatus.

FIG. 59 is a cross-sectional view illustrating a third configuration example of the laminated solid-state imaging apparatus 3020.

The solid-state imaging apparatus 3020 of FIG. 59 is different from the case of FIG. 57 in which the film 3191 such as a protective film is formed on the surface where the sensor die 3021 and the logic die 3024 are bonded to each other in that the film 3191 such as a protective film is not formed on the surface where the sensor die 3021 and the logic die 3024 are bonded to each other.

The solid-state imaging apparatus 3020 of FIG. 59 is constituted by overlapping the sensor die 3021 and the logic die 3024 with each other such that the wiring 3110 and the wiring 3170 are brought into direct contact with each other, and heating the sensor die 3021 and the logic die 3024 while applying a required load to directly bond the wiring 3110 and the wiring 3170 to each other.

Figure 60:
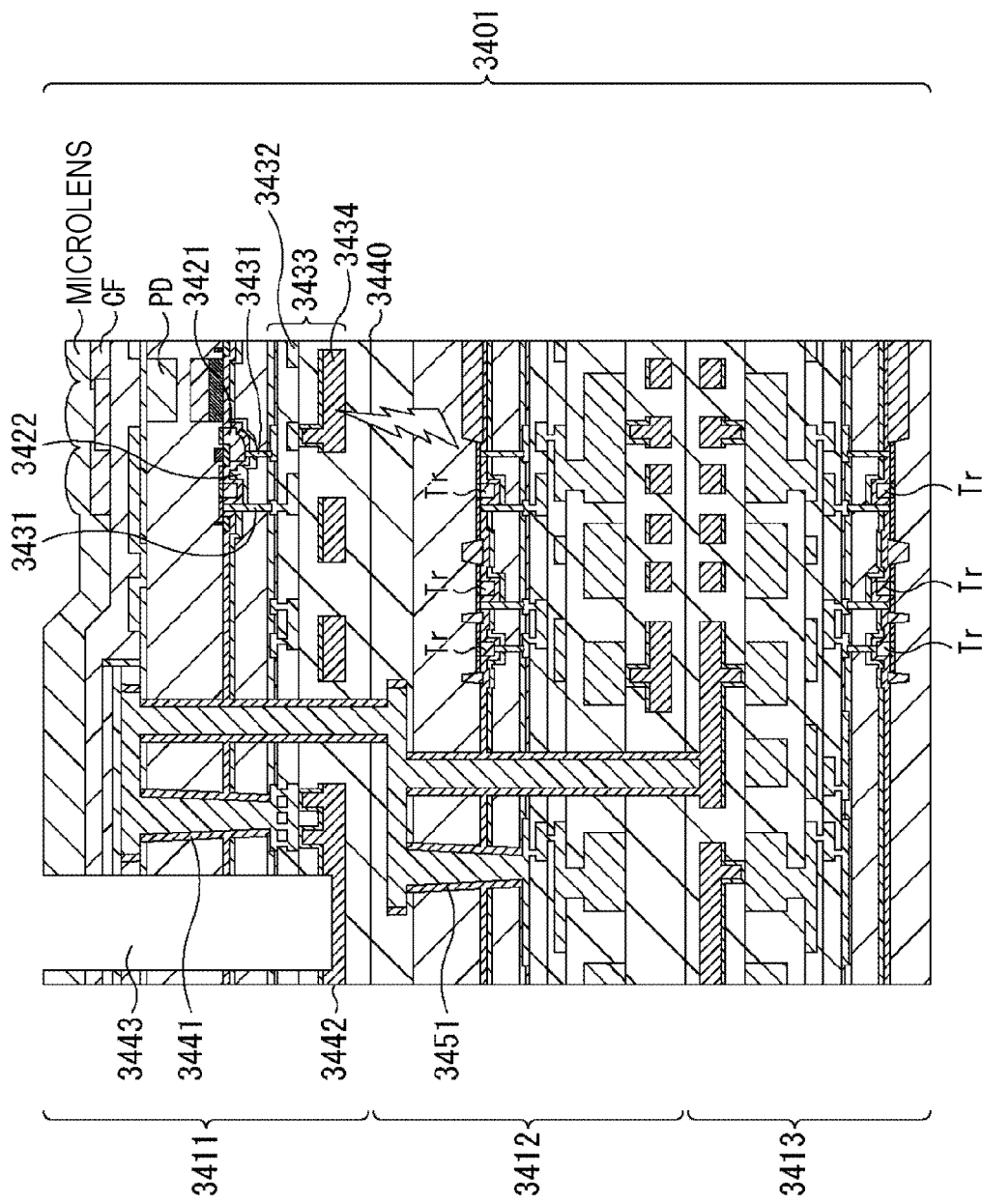
FIG. 60 is a cross-sectional view illustrating another configuration example of the laminated solid-state imaging apparatus to which the present technology can be applied.

FIG. 60 is a cross-sectional view illustrating another configuration example of the laminated solid-state imaging apparatus to which the present technology can be applied.

In FIG. 60, a solid-state imaging apparatus 3401 has a three-layered laminated structure in which three dies of a sensor die 3411, a logic die 3412, and a memory die 3413 are laminated.

The memory die 3413 includes, for example, a memory circuit that stores data temporarily required in signal processing performed by the logic die 3412.

In FIG. 60, the logic die 3412 and the memory die 3413 are laminated in this order under the sensor die 3411. However, the logic die 3412 and the memory die 3413 may be laminated in the reverse order, in other words, in the order of the memory die 3413 and the logic die 3412 under the sensor die 3411.

Note that, in FIG. 60, in the sensor die 3411, a PD to be a photoelectric conversion unit of a pixel and a source/drain region of a pixel Tr are formed.

A gate electrode is formed around the PD via a gate insulating film, and a pixel Tr 3421 and a pixel Tr 3422 are formed by the gate electrode and a pair of source/drain regions.

The pixel Tr 3421 adjacent to the PD is a transfer Tr, and one of the pair of source/drain regions forming the pixel Tr 3421 is an FD.

Furthermore, an interlayer insulating film is formed in the sensor die 3411, and a connection hole is formed in the interlayer insulating film. A connection conductor 3431 connected to the pixel Tr 3421 and the pixel Tr 3422 is formed in the connection hole.

Moreover, a wiring layer 3433 having multilayered wiring 3432 connected to the connection conductors 3431 is formed in the sensor die 3411.

Furthermore, an aluminum pad 3434 to be an electrode for external connection is formed in the lowermost layer of the wiring layer 3433 of the sensor die 3411. In other words, the aluminum pad 3434 is formed at a position closer to a bonding surface 3440 to the logic die 3412 than the wiring 3432 in the sensor die 3411. The aluminum pad 3434 is used as one end of wiring relating to input and output of a signal with the outside.

Moreover, a contact 3441 used for electrical connection with the logic die 3412 is formed in the sensor die 3411. The contact 3441 is connected to a contact 3451 of the logic die 3412 and also to an aluminum pad 3442 of the sensor die 3411.

In addition, a pad hole 3443 is formed so as to reach the aluminum pad 3442 from the back side (upper side) of the sensor die 3411 in the sensor die 3411.

The present technology can also be applied to the above-described solid-state imaging apparatus. Note that only one color filter (CF) is illustrated as an optical filter layer in FIGS. 57 to 60, but actually, a first optical filter layer and a second optical filter layer disposed on the first optical filter layer are formed.

(Configuration Example of Solid-State Imaging Apparatus Sharing a Plurality of Pixels)

Figure 61:
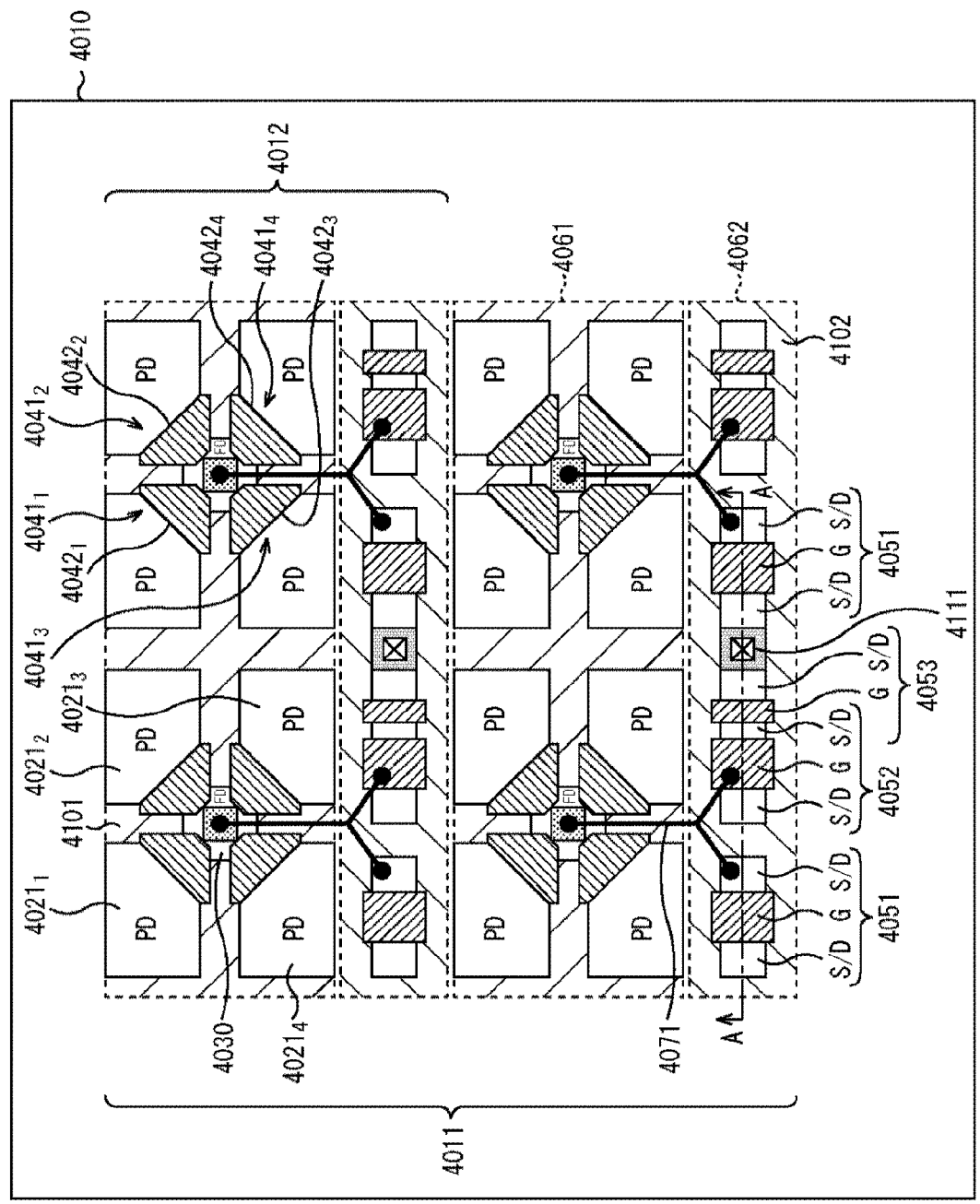
FIG. 61 is a plan view illustrating a first configuration example of a solid-state imaging apparatus sharing a plurality of pixels to which the present technology can be applied.
Figure 62:
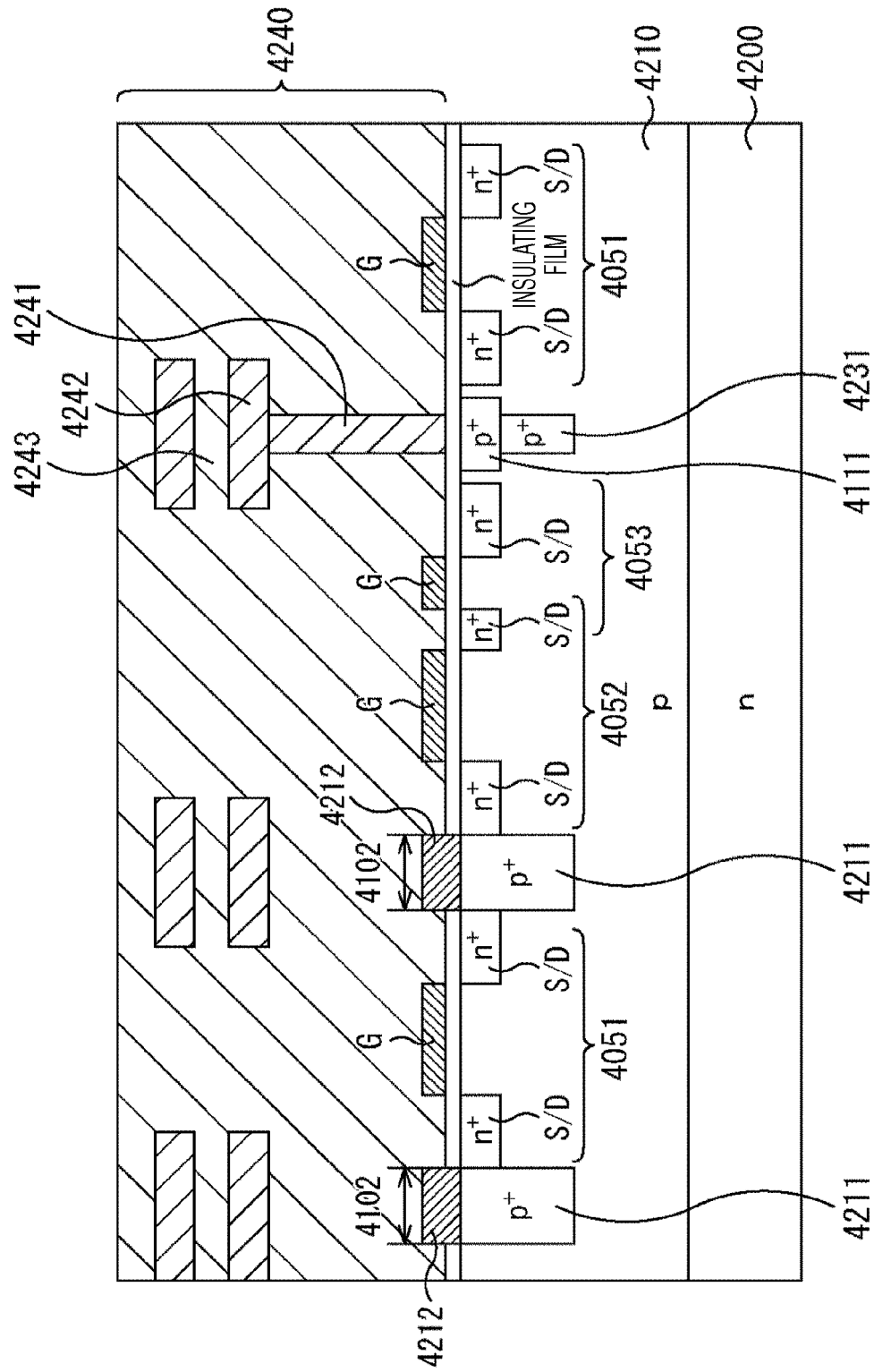
FIG. 62 is a cross-sectional view illustrating the first configuration example of the solid-state imaging apparatus sharing a plurality of pixels to which the present technology can be applied.

FIG. 61 is a plan view illustrating a first configuration example of a solid-state imaging apparatus sharing a plurality of pixels to which the present technology can be applied. FIG. 62 is a cross-sectional view taken along line A-A of FIG. 61.

A solid-state imaging apparatus 4010 has a pixel region 4011 in which pixels are arranged in a two-dimensional array. The pixel region 4011 is constituted by using a total of four pixels of horizontal 2 pixels×vertical 2 pixels as a shared pixel unit 4012 sharing a pixel Tr (MOS FET) and the like, and arranging the shared pixel units 4012 in a two-dimensional array.

The four pixels of the shared pixel unit 4012 sharing four pixels of horizontal 2 pixels×vertical 2 pixels include photodiodes (PDs) 4021₁, 4021₂, 4021₃, and 4021₄, respectively, and share one floating diffusion (FD) 4030. Furthermore, the shared pixel unit 4012 includes a transfer Tr 4041$i$ for the PD 4021$i$ (here, 1, 2, 3, or 4), and a reset Tr 4051, an amplification Tr 4052, and a selection Tr 4053 as shared Trs shared by the four pixels.

The FD 4030 is disposed at the center surrounded by the four PDs 4021₁ to 4021₄. The FD 4030 is connected to a source/drain region S/D as a drain of the reset Tr 4051 and a gate G of the amplification Tr 4052 via wiring 4071. The transfer Tr 4041$i$ includes a gate 4042$i$ disposed between the PD 4021₁ for the transfer Tr 4041₁ and the FD 4030 close to the PD 4021₁, and operates according to a voltage applied to the gate 4042$i$.

Here, a region including the PDs 4021₁ to 4021₄, the FD 4030, and the transfer Trs 4041₁ to 4041₄ of the shared pixel unit 4012 in each row is referred to as a PD forming region 4061. Furthermore, among the pixels Trs of the shared pixel unit 4012 in each row, a region including the reset Tr 4051, the amplification Tr 4052, and the selection Tr 4053 shared by the four pixels is referred to as a Tr forming region 4062. The Tr forming region 4062 and the PD forming region 4061 continuous in a horizontal direction are alternately disposed in a vertical direction of the pixel region 4011.

Each of the reset Tr 4051, the amplification Tr 4052, and the selection Tr 4053 is constituted by a pair of source/drain regions S/D and a gate G. One of the pair of source/drain regions S/D functions as a source, and the other functions as a drain.

For example, as illustrated in the cross-sectional view of FIG. 62, the PDs 4021₁ to 4021₄, the FD 4030, the transfer Trs 4041₁ to 4041₄, the reset Tr 4051, the amplification Tr 4052, and the selection Tr 4053 are formed in a p-type semiconductor region (p-well) 4210 formed in an n-type semiconductor substrate 4200.

As illustrated in FIG. 61, a pixel separation unit 4101 is formed in the PD forming region 4061, and an element separation unit 4102 is formed in the Tr forming region 4062 (region including the Tr forming region 4062). For example, as illustrated in FIG. 62, the element separation unit 4102 includes a p-type semiconductor region 4211 disposed in a p-type semiconductor region 4210 and an insulating film (for example, silicon oxide Film) 4212 disposed on a surface of the p-type semiconductor region 4211. The pixel separation unit 4101 (not illustrated) can be constituted similarly.

A well contact 4111 for applying a fixed voltage to the p-type semiconductor region 4210 is formed in the pixel region 4011. The well contact 4111 can be constituted as a p-type semiconductor region which is an impurity diffusion region disposed on a surface of the p-type semiconductor region 4231 disposed in the p-type semiconductor region 4210. The well contact 4111 is a p-type semiconductor region having a higher impurity concentration than the p-type semiconductor region 4231. The well contact 4111 (and the lower p-type semiconductor region 4231) also serves as the element separation unit 4102, and is formed between the shared Trs (reset Tr 4051, amplification Tr 4052, and selection Tr 4053) of the shared pixel unit 4012 horizontally adjacent to each other. The well contact 4111 is connected to required wiring 4242 of a wiring layer 4240 via a conductive via 4241. A required fixed voltage is applied from the wiring 4242 to the p-type semiconductor region 4210 through the conductive via 4241 and the well contact 4111. The wiring layer 4240 is formed by disposing multilayered wiring 4242 via an insulating film 4243. On the wiring layer 4240, a color filter (CF) and a microlens (not illustrated) are formed via a planarizing film.

Figure 63:
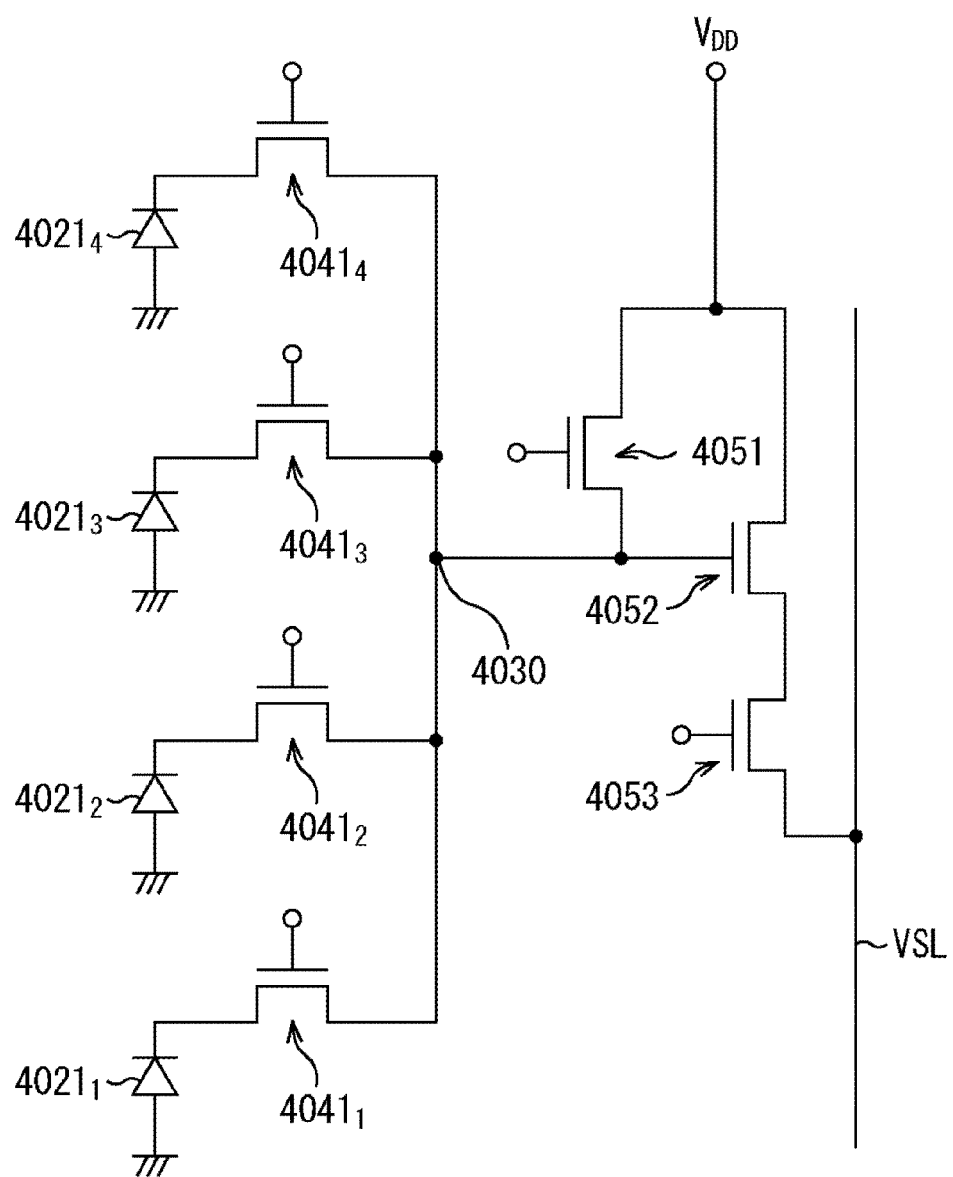
FIG. 63 is a diagram illustrating an example of an equivalent circuit of a shared pixel unit sharing four pixels.

FIG. 63 is a diagram illustrating an example of an equivalent circuit of the shared pixel unit 4012 sharing four pixels. In the equivalent circuit of the shared pixel unit 4012 sharing four pixels, the four PDs 40211 to 40214 are connected to sources of the corresponding four transfer Trs 40411 to 40414, respectively. A drain of each transfer Tr 4041$i$ is connected to a source of the reset Tr 4051. A drain of each transfer Tr 4041$i$ is the common FD 4030. The FD 4030 is connected to a gate of the amplification Tr 4052. A source of the amplification Tr 4052 is connected to a drain of the selection Tr 4053. A drain of the reset Tr 4051 and a drain of the amplification Tr 4052 are connected to a power supply VDD. A source of the selection Tr 4053 is connected to a vertical signal line (VSL).

Figure 64:
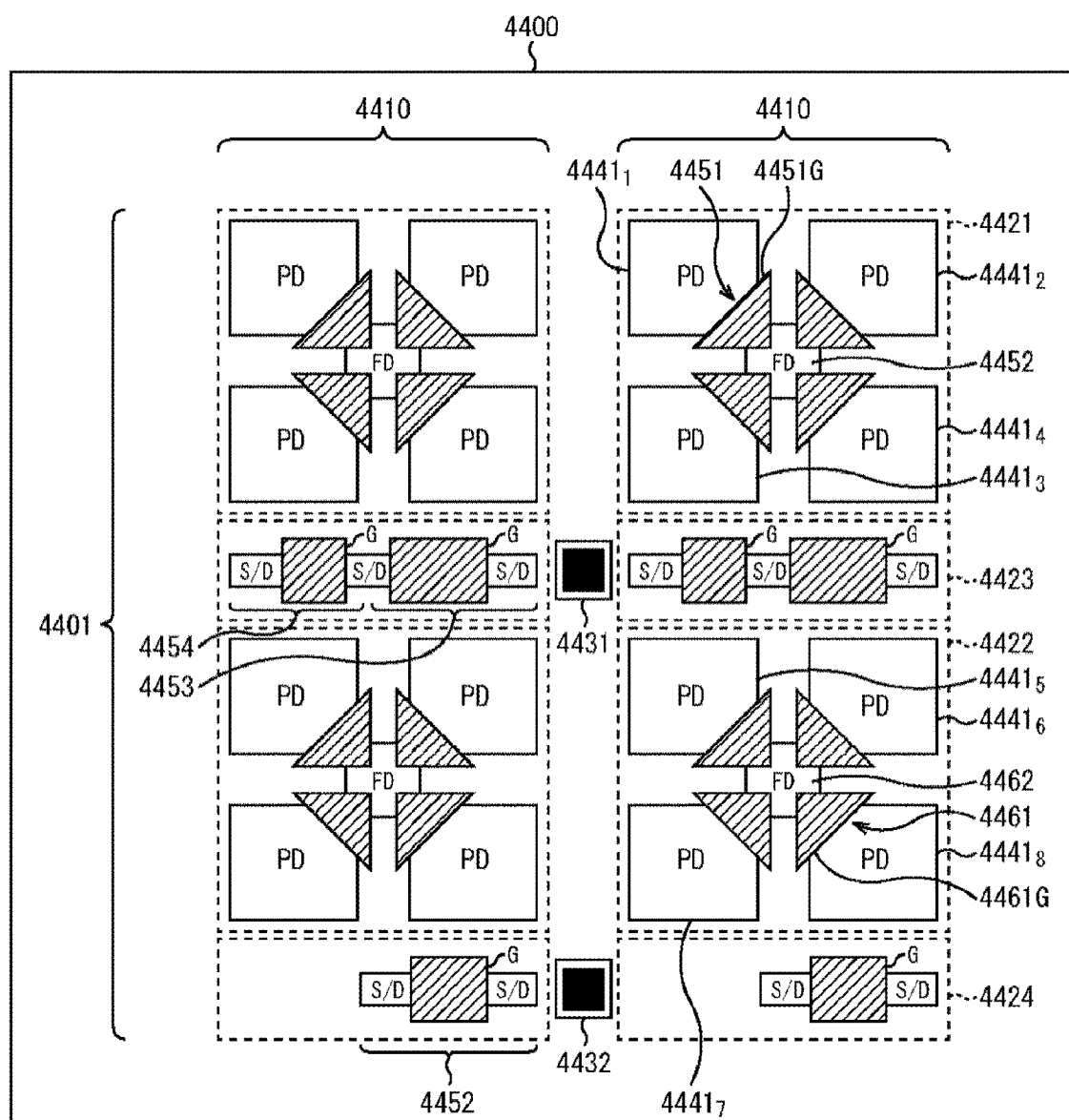
FIG. 64 is a plan view illustrating a second configuration example of the solid-state imaging apparatus sharing a plurality of pixels to which the present technology can be applied.

FIG. 64 is a plan view illustrating a second configuration example of the solid-state imaging apparatus sharing a plurality of pixels to which the present technology can be applied.

A solid-state imaging apparatus 4400 has a pixel region 4401 in which pixels are arranged in a two-dimensional array. The pixel region 4401 is constituted by using a total of eight pixels of horizontal 2 pixels×vertical 4 pixels as a shared pixel unit 4410, and arranging the shared pixel units 4410 in a two-dimensional array.

The shared pixel unit 4410 sharing eight pixels of horizontal 2 pixels×vertical 4 pixels includes a first light receiving unit 4421 and a second light receiving unit 4422. The first light receiving unit 4421 and the second light receiving unit 4422 are arranged in a longitudinal direction (y direction) in the shared pixel unit 4410.

The first light receiving unit 4421 includes PDs 44411, 44412, 44413, and 44414 arranged in horizontal 2 pixels× vertical 2 pixels, four transfer Trs 4451 corresponding to the PDs 44411 to 44414, respectively, and an FD 4452 shared by the PDs 44411 to 44414. The FD 4452 is disposed at the center of the PDs 44411 to 44414.

The second light receiving unit 4422 includes PDs 44415, 44416, 44417, and 44418 arranged in horizontal 2 pixels× vertical 2 pixels, four transfer Trs 4461 corresponding to the PDs 44415 to 44418, respectively, and an FD 4462 shared by the PDs 44415 to 44418. The FD 4462 is disposed at the center of the PDs 44415 to 44418.

The transfer Tr 4451 includes a gate 4451G disposed between the PD 44411 for the transfer Tr 4451 and the FD 4452, and operates according to a voltage applied to the gate 4451G. Similarly, the transfer Tr 4461 includes a gate 4461G disposed between the PD 4441$i$ for the transfer Tr 4461 and the FD 4462, and operates according to a voltage applied to the gate 4461G.

Furthermore, the shared pixel unit 4410 includes a first Tr group 4423 and a second Tr group 4424. In the first Tr group 4423 and the second Tr group 4424, a reset Tr 4452, an amplification Tr 4453, and a selection Tr 4454 shared by eight pixels of the shared pixel unit 4410 are separately disposed. In FIG. 64, the amplification Tr 4453 and the selection Tr 4454 are disposed in the first Tr group 4423, and the reset Tr 4452 is disposed in the second Tr group 4424.

The first Tr group 4423 is disposed between the first light receiving unit 4421 and the second light receiving unit 4422. The second Tr group 4424 is disposed in a region of the second light receiving unit 4422 on the side opposite to the disposition side of the first Tr group 4423 in a peripheral region of the second light receiving unit 4422.

Note that the first light receiving unit 4421 and the second light receiving unit 4422 are formed in a lateral direction (x direction).

Furthermore, each of the reset Tr 4452, the amplification Tr 4453, and the selection Tr 4454 is constituted by a pair of source/drain regions S/D and a gate G. One of the pair of source/drain regions S/D functions as a source, and the other functions as a drain.

The pair of source/drain regions S/D and the gate G constituting the reset Tr 4452, the amplification Tr 4453, and the selection Tr 4454 are disposed in a lateral direction (x direction). The gate G constituting the reset Tr 4452 is disposed in a region substantially facing the lower right PD 44418 of the second light receiving unit 4422 in a longitudinal direction (y direction).

A first well contact 4431 and a second well contact 4432 are disposed between the two shared pixel units 4410 horizontally adjacent to each other. The first light receiving unit 4421, the second light receiving unit 4422, the first Tr group 4423, and the second Tr group 4424 are formed in a semiconductor region as a predetermined well region formed in a Si substrate. The first well contact 4431 and the second well contact 4432 are contacts electrically connecting a predetermined well region to internal wiring of the solid-state imaging apparatus 4400. The first well contact 4431 is disposed between the first Tr groups 4423 of the two shared pixel units 4410 horizontally adjacent to each other. The second well contact 4432 is disposed between the second Tr groups 4424 of the two shared pixel units 4410 horizontally adjacent to each other.

Furthermore, parts in the shared pixel unit 4410 are electrically connected to each other so as to satisfy a connection relationship according to the equivalent circuit sharing four pixels illustrated in FIG. 63.

The present technology can also be applied to the above-described solid-state imaging apparatus.

Note that the present technology is not limited to application to a solid-state imaging apparatus, but can also be applied to an imaging apparatus. Here, the imaging apparatus refers to a camera system such as a digital still camera or a digital video camera, or an electronic device having an imaging function, such as a mobile phone. Note that there is a case where a module form mounted on an electronic device, that is, a camera module is used as an imaging apparatus.

6. Configuration Example of Electronic Device

Here, a configuration example of the electronic device to which the present technology is applied will be described with reference to FIG. 65.

Figure 65:
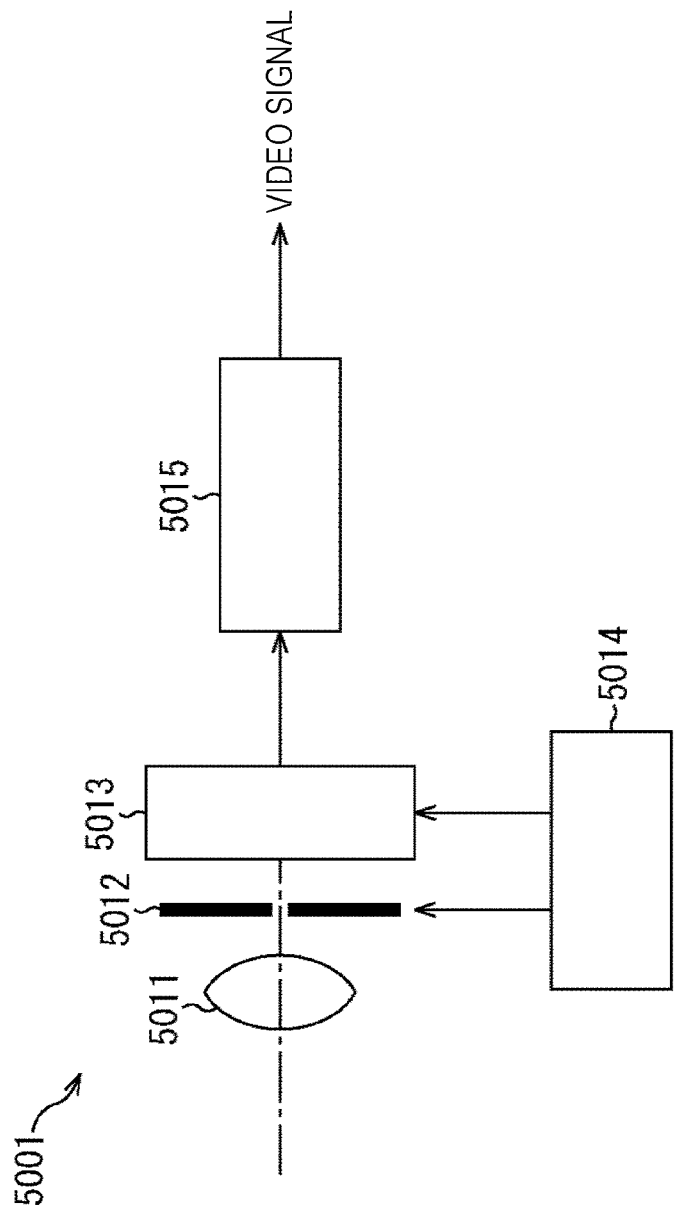
FIG. 65 is a block diagram illustrating a configuration example of an electronic device of the present technology.

An electronic device 5001 illustrated in FIG. 65 includes an optical lens 5011, a shutter apparatus 5012, an image sensor 5013, a driving circuit 5014, and a signal processing circuit 5015. FIG. 65 illustrates an embodiment in a case where the above-described solid-state imaging apparatus 31 of the present technology is disposed in an electronic device (digital still camera) as the image sensor 5013.

The optical lens 5011 forms an image of image light (incident light) from a subject on an imaging surface of the image sensor 5013. As a result, a signal charge is accumulated in the image sensor 5013 for a certain period of time. The shutter apparatus 5012 controls a light irradiation period and a light-shielding period for the image sensor 5013.

The driving circuit 5014 supplies a driving signal to the shutter apparatus 5012 and the image sensor 5013. A driving signal supplied to the shutter apparatus 5012 is a signal for controlling shutter operation of the shutter apparatus 5012. A driving signal supplied to the image sensor 5013 is a signal for controlling signal transfer operation of the image sensor 5013. The image sensor 5013 transfers a signal by a driving signal (timing signal) supplied from the driving circuit 5014. The signal processing circuit 5015 performs various types of signal processing on a signal output from the image sensor 5013. A video signal which has been subjected to signal processing is stored in a storage medium such as a memory or is output to a monitor.

The electronic device 5001 of the present embodiment can suppress color separation and deterioration of S/N in the image sensor 5013, and as a result, can provide an electronic device capable of obtaining a high-quality image.

7. Use Example of Image Sensor

Finally, a use example of an image sensor to which the present technology is applied will be described.

Figure 66:
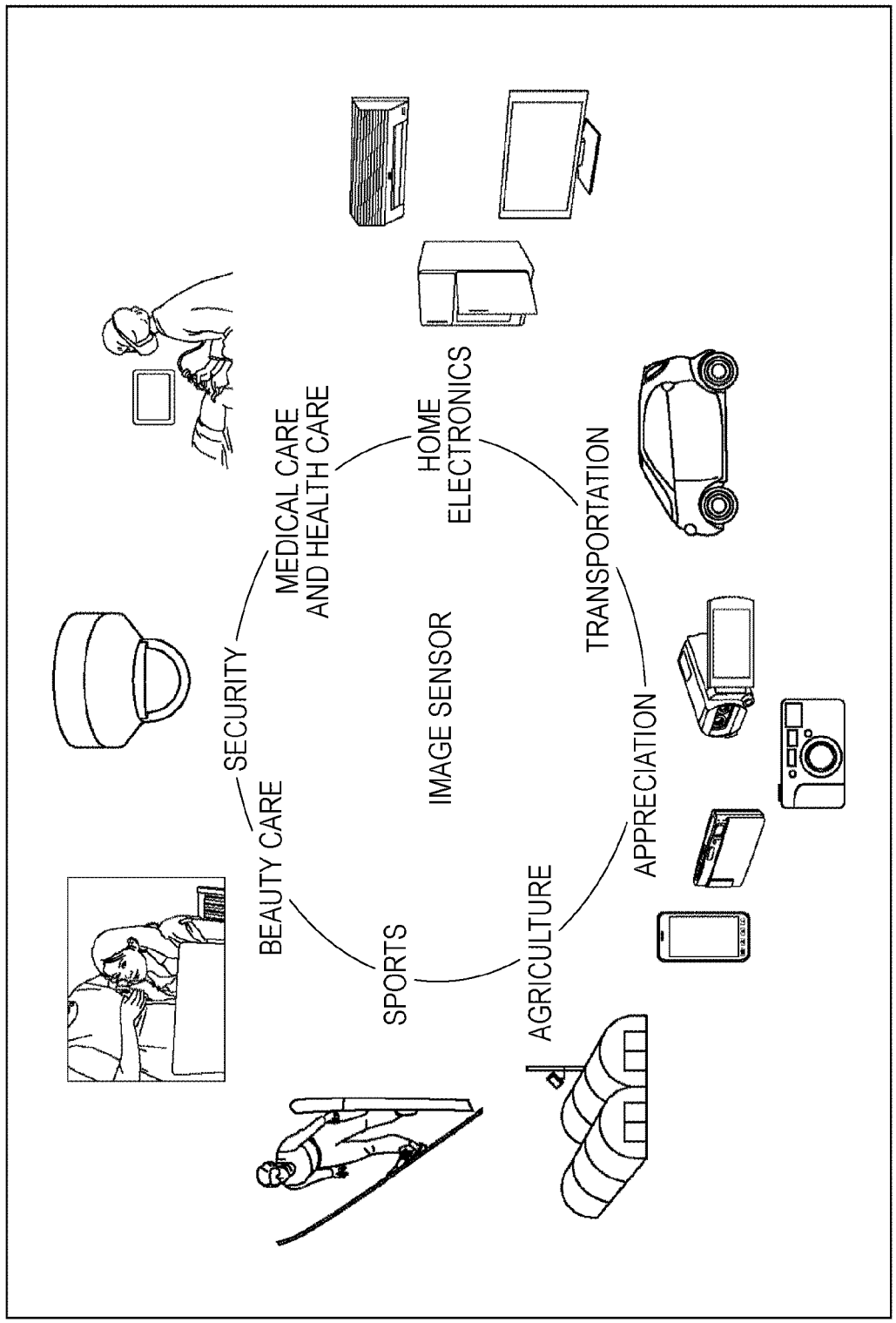
FIG. 66 is a diagram illustrating a use example of using an image sensor.

FIG. 66 is a diagram illustrating a use example of the above-described image sensor.

The above-described image sensor can be used, for example, in various cases of sensing light such as visible light, infrared light, ultraviolet light, or an X-ray as described below.

- An apparatus for imaging an image used for appreciation, such as a digital camera or a portable device with a camera function
- An apparatus used for transportation, such as a vehicle-mounted sensor for imaging the front, the back, the surrounding, the inside, or the like of an automobile for safe driving such as automatic stop, for recognition of a driver's condition, and the like, a surveillance camera for monitoring a running vehicle and a road, or a measuring sensor for measuring a distance between vehicles or the like
- An apparatus used for home electronics, such as a television set, a refrigerator, or an air conditioner for imaging a gesture of a user and operating a device according to the gesture
- An apparatus used for medical care and health care, such as an endoscope or an apparatus for receiving infrared light for angiography
- An apparatus used for security, such as a surveillance camera for crime prevention or a camera for personal authentication
- An apparatus used for beauty care, such as a skin measurement device for imaging a skin or a microscope for imaging a scalp
- An apparatus used for sports, such as an action camera or a wearable camera for sports and the like
- An apparatus used for agriculture, such as a camera for monitoring a condition of a field and a crop

8. Application Example to Endoscopic Surgery System

The technology according to the present disclosure (present technology) can be applied to various products. For example, the technology according to the present disclosure may be applied to an endoscopic surgical system.

Figure 67:
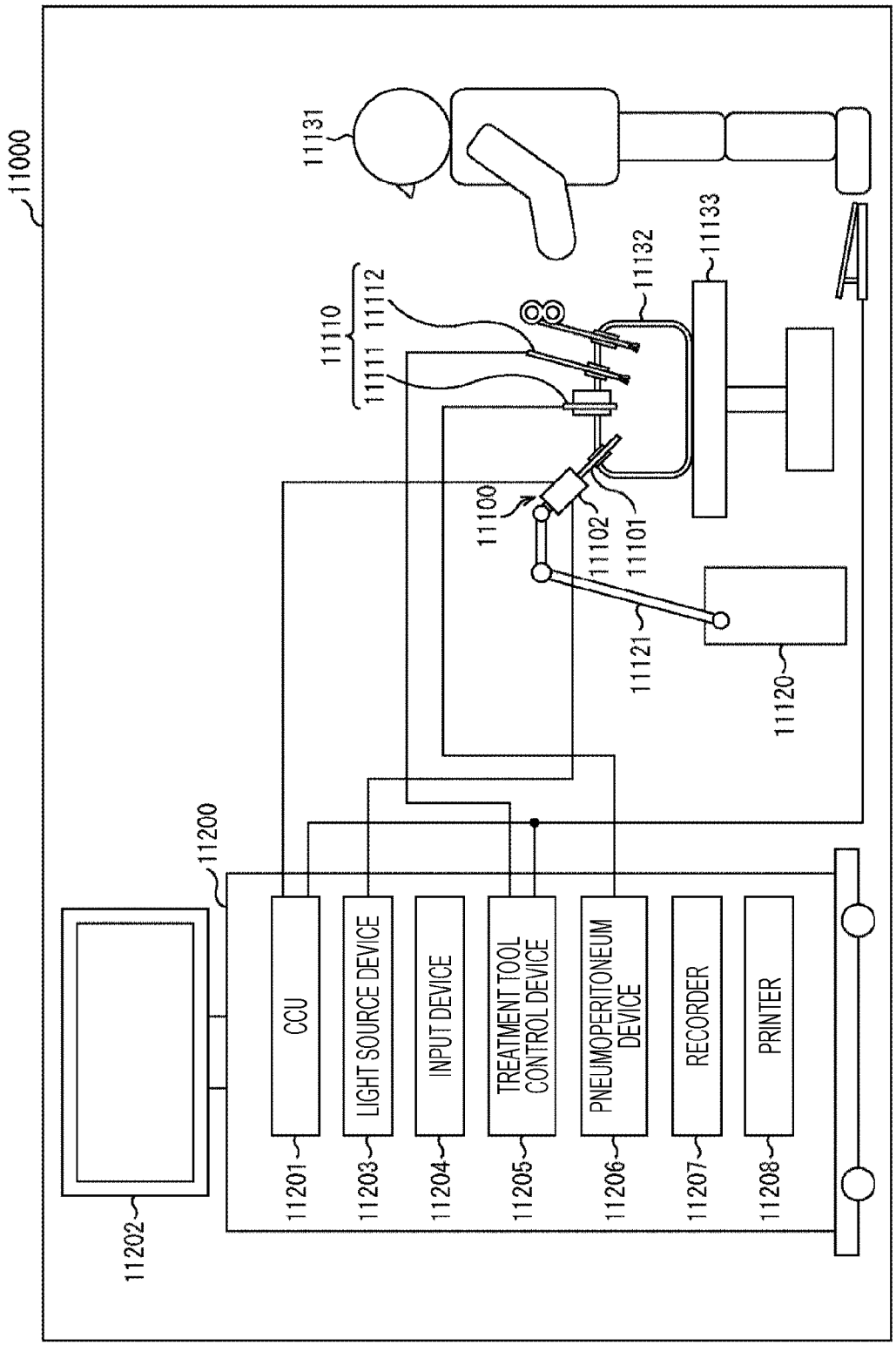
FIG. 67 is a diagram illustrating an example of a schematic configuration of an endoscopic surgical system.

FIG. 67 is a diagram illustrating an example of a schematic configuration of an endoscopic surgical system to which the technology according to the present disclosure (the present technology) can be applied.

FIG. 67 illustrates a situation in which a surgeon (physician) 11131 is performing surgery on a patient 11132 on a patient bed 11133 using an endoscopic surgical system 11000. As illustrated in the drawing, the endoscopic surgical system 11000 includes an endoscope 11100, another surgical tool 11110 such as a pneumoperitoneum tube 11111 or an energy treatment tool 11112, a support arm device 11120 for supporting the endoscope 11100, and a cart 11200 on which various devices for endoscopic surgery are mounted.

The endoscope 11100 includes a lens barrel 11101 to be inserted into a body cavity of the patient 11132 in a region of a predetermined length from a tip thereof, and a camera head 11102 connected to a proximal end of the lens barrel 11101. In the illustrated example, the endoscope 11100 configured as a so-called rigid mirror including the rigid lens barrel 11101 is illustrated, but the endoscope 11100 may be configured as a so-called flexible mirror including a flexible lens barrel.

At the tip of the lens barrel 11101, an opening into which an objective lens is fitted is disposed. A light source device 11203 is connected to the endoscope 11100. Light generated by the light source device 11203 is guided to the tip of the lens barrel by a light guide extended inside the lens barrel 11101, and is emitted toward an observation target in a body cavity of the Patient 11132 via the objective lens. Note that the endoscope 11100 may be a direct view mirror, a perspective view mirror, or a side view mirror.

An optical system and an imaging element are disposed inside the camera head 11102. Reflected light (observation light) from an observation target is converged on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), and the like, and integrally controls operations of the endoscope 11100 and the display device 11202. Moreover, the CCU 11201 receives an image signal from the camera head 11102, and performs, on the image signal, various image processing for displaying an image based on the image signal, such as development processing (demosaic processing), for example.

The display device 11202 displays an image based on an image signal subjected to image processing by the CCU 11201 under the control of the CCU 11201.

The light source device 11203 includes a light source such as a light emitting diode (LED), for example, and supplies irradiation light for imaging a surgical site or the like to the endoscope 11100.

An input device 11204 is an input interface to the endoscopic surgical system 11000. A user can input various kinds of information and instructions to the endoscopic surgical system 11000 via the input device 11204. For example, the user inputs an instruction or the like to change imaging conditions (type of irradiation light, magnification, focal length, and the like) by the endoscope 11100.

A treatment tool control device 11205 controls driving of the energy treatment tool 11112 for cauterizing and cutting a tissue, sealing a blood vessel, or the like. A pneumoperitoneum device 11206 feeds a gas into a body cavity via the pneumoperitoneum tube 11111 in order to inflate the body cavity of the patient 11132 for the purpose of securing a field of view by the endoscope 11100 and securing a working space of a surgeon. A recorder 11207 is a device capable of recording various kinds of information regarding surgery. A printer 11208 is a device capable of printing various kinds of information regarding surgery in various formats such as a text, an image, and a graph.

Note that the light source device 11203 for supplying irradiation light used for imaging a surgical site to the endoscope 11100 may include an LED, a laser light source, or a white light source constituted by a combination thereof, for example. In a case where the white light source is constituted by a combination of RGB laser light sources, the output intensity and the output timing of each color (each wavelength) can be controlled with high precision, and therefore adjustment of a white balance of an imaged image can be performed by the light source device 11203. Furthermore, in this case, by irradiating an observation target with laser light from each of the RGB laser light sources in a time division manner and controlling driving of an imaging element of the camera head 11102 in synchronization with the irradiation timing, it is also possible to image an image corresponding to each of RGB in a time division manner. According to this method, a color image can be obtained without disposing a color filter in the imaging element.

Furthermore, driving of the light source device 11203 may be controlled so as to change the intensity of light output at predetermined time intervals. By controlling driving of the imaging element of the camera head 11102 in synchronization with the timing of the change of the intensity of the light to acquire an image in a time division manner and synthesizing the image, a high dynamic range image without so-called blocked up shadows or blown out highlights can be generated.

Furthermore, the light source device 11203 may be configured so as to be able to supply light in a predetermined wavelength band corresponding to special light observation. In the special light observation, for example, by irradiation with light in a narrower band than irradiation light (in other words, white light) at the time of ordinary observation using wavelength dependency of light absorption in a body tissue, a predetermined tissue such as a blood vessel of a mucosal surface layer is imaged at a high contrast, that is, so-called narrow band imaging is performed. Alternatively, in the special light observation, fluorescence observation for obtaining an image by fluorescence generated by irradiation with excitation light may be performed. In the fluorescence observation, it is possible to observe fluorescence from a body tissue (autofluorescence observation) by irradiating the body tissue with excitation light, or to obtain a fluorescent image by injecting a reagent such as indocyanine green (ICG) into a body tissue and irradiating the body tissue with excitation light corresponding to a fluorescence wavelength of the reagent, for example. The light source device 11203 can be configured so as to be able to supply narrow band light and/or excitation light corresponding to such special light observation.

Figure 68:
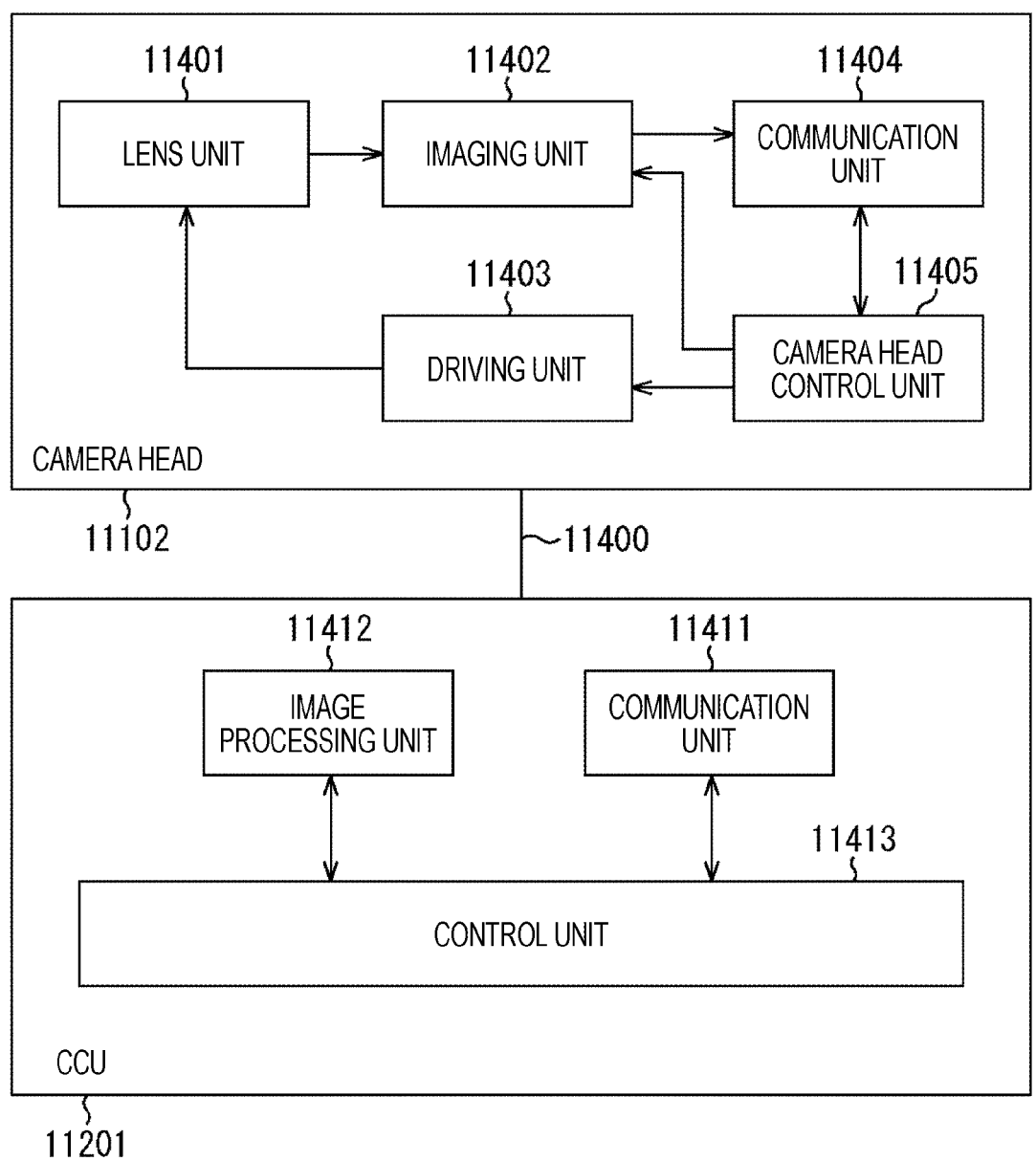
FIG. 68 is a block diagram illustrating examples of functional configurations of a camera head and a CCU.

FIG. 68 is a block diagram illustrating examples of functional configurations of the camera head 11102 and the CCU 11201 illustrated in FIG. 67.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a 11413. The camera head and the CCU 11201 are communicably connected to each other by a transmission cable 11400.

The lens unit 11401 is an optical system disposed at a connecting portion with the lens barrel 11101. Observation light taken in from a tip of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging unit 11402 may include one imaging element (so-called single plate type) or a plurality of imaging elements (so-called multiplate type). In a case where the imaging unit 11402 includes multiplate type imaging elements, for example, an image signal corresponding to each of RGB may be generated by each imaging element, and a color image may be obtained by synthesizing these image signals. Alternatively, the imaging unit 11402 may include a pair of imaging elements for acquiring an image signal for each of the right eye and the left eye corresponding to three-dimensional (3D) display. By performing the 3D display, the surgeon 11131 can grasp the depth of a living tissue in a surgical site more accurately. Incidentally, in a case where the imaging unit 11402 includes multiplate type imaging elements, a plurality of lens units 11401 can be disposed corresponding to the respective imaging elements.

Furthermore, the imaging unit 11402 is not necessarily disposed in the camera head 11102. For example, the imaging unit 11402 may be disposed just behind an objective lens inside the lens barrel 11101.

The driving unit 11403 includes an actuator, and moves a zoom lens and a focus lens of the lens unit 11401 by a predetermined distance along an optical axis under control of the camera head control unit 11405. As a result, the magnification and the focus of an image imaged by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal includes information regarding imaging conditions such as information indicating designation of a frame rate of an imaged image, information indicating designation of an exposure value at the time of imaging, and/or information indicating designation of the magnification and the focus of an imaged image, for example.

Note that the imaging conditions such as the frame rate, the exposure value, the magnification, and the focus may be appropriately designated by a user, or may be automatically set by the control unit 11413 of the CCU 11201 on the basis of an acquired image signal. In the latter case, the endoscope 11100 has a so-called auto exposure (AR) function, a so-called auto focus (AF) function, and a so-called auto white balance (AWB) function.

The camera head control unit 11405 controls driving of the camera head 11102 on the basis of a control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Furthermore, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal which is RAW data transmitted from the camera head 11102.

The control unit 11413 performs various kinds of control concerning imaging of a surgical site or the like by the endoscope 11100 and display of an imaged image obtained by imaging a surgical site or the like. For example, the control unit 11413 generates a control signal for controlling driving of the camera head 11102.

Furthermore, the control unit 11413 causes the display device 11202 to display an imaged image of a surgical site or the like on the basis of an image signal subjected to image processing by the image processing unit 11412. In this case, the control unit 11413 may recognize various objects in the imaged image using various image recognition techniques. For example, by detecting the shape, color, and the like of an edge of an object included in the imaged image, the control unit 11413 can recognize a surgical tool such as forceps, a specific living body part, bleeding, a mist at the time of using the energy treatment tool 11112, and the like. When the display device 11202 displays the imaged image, the control unit 11413 may cause the display device 11202 to superimpose and display various kinds of surgical support information on the image of the surgical site using the recognition result. The surgical support information is superimposed and displayed, and presented to the surgeon 11131. This makes it possible to reduce a burden on the surgeon 11131 and makes it possible for the surgeon 11131 to reliably perform surgery.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, communication is performed by wire using the transmission cable 11400, but communication between the camera head 11102 and the CCU 11201 may be performed wirelessly.

An example of the endoscopic surgical system to which the technology according to the present disclosure can be applied has been described above. The technology according to the present disclosure can be applied to the imaging unit 11402 of the camera head 11102 among the above-described configurations. Specifically, the solid-state imaging apparatus 31 of FIG. 3 can be applied to the imaging unit 10402. Application of the technology according to the present disclosure to the imaging unit 11402 makes it possible to suppress occurrence of color mixing between visible light pixels and between a visible light pixel and an infrared light pixel, and to suppress color separation and deterioration of S/N. Therefore, for example, in an endoscopic examination, even in a case where an observation image of visible light and an observation image of infrared light are imaged at the same time, a clearer surgical site image can be obtained. Therefore, a surgeon can confirm the surgical site reliably.

Note that the endoscopic surgical system has been described as an example here. However, the technology according to the present disclosure may also be applied to, for example, a microscopic surgery system or the like.

9. Application Example to Mobile Body

Moreover, the technology according to the present disclosure (the present technology) can be applied to various products. For example, the technology according to the present disclosure may be achieved as an apparatus mounted on any type of mobile body such as an automobile, an electric vehicle, a hybrid electric vehicle, a motorcycle, a bicycle, a personal mobility, an airplane, a drone, a ship, or a robot.

Figure 69:
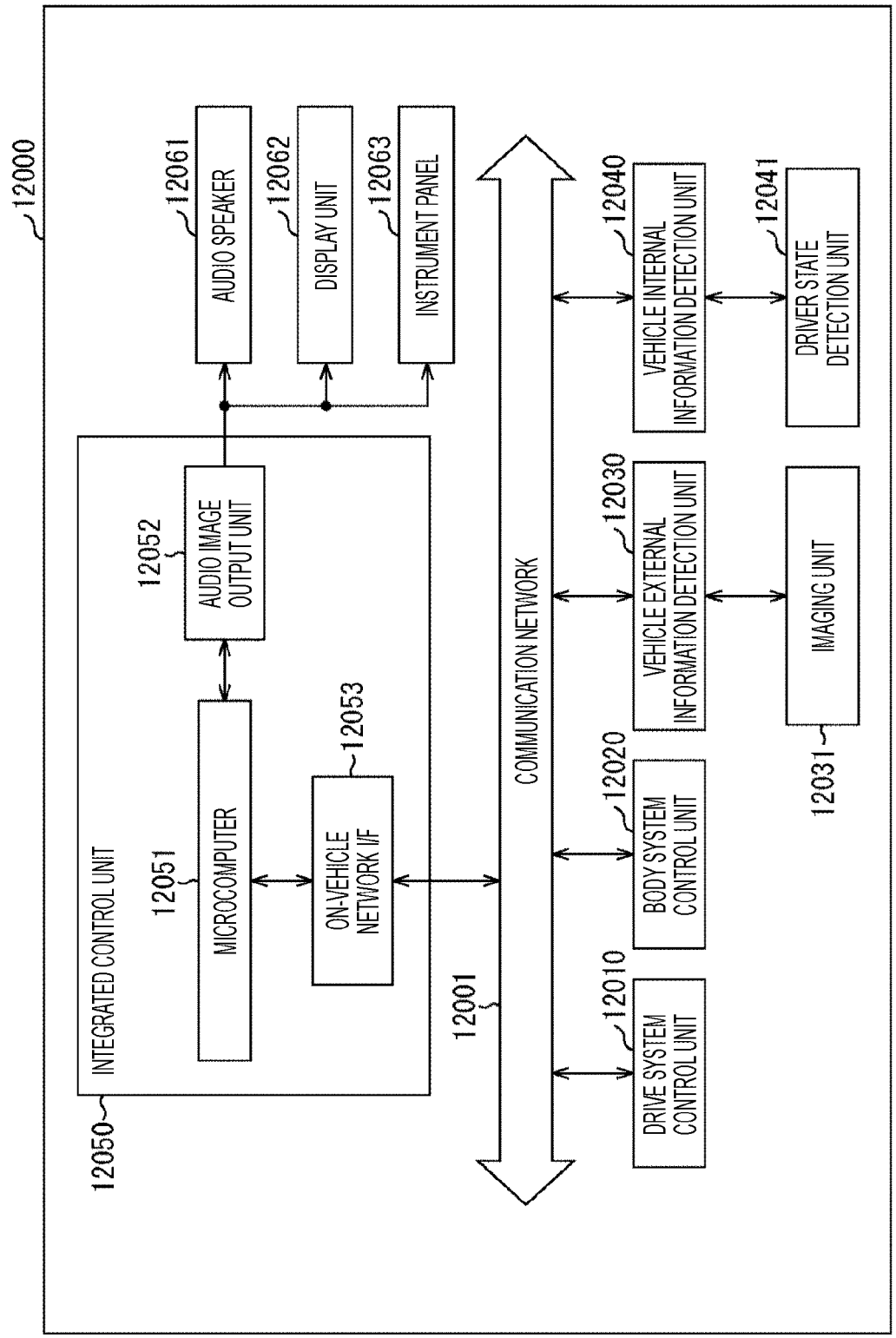
FIG. 69 is a block diagram illustrating an example of a schematic configuration of a vehicle control system.

FIG. 69 is a block diagram illustrating an example of a schematic configuration of a vehicle control system which is an example of a mobile body control system to which the technology according to the present disclosure can be applied.

A vehicle control system 12000 includes a plurality of electronic control units connected to one another via a communication network 12001. In the example illustrated in FIG. 69, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio image output unit 12052, and an on-vehicle network interface (I/F) 12053 are illustrated.

The drive system control unit 12010 controls an operation of a device related to a drive system of a vehicle according to various programs. For example, the drive system control unit 12010 functions as a control device of a driving force generating device for generating a driving force of a vehicle such as an internal combustion engine or a driving motor, a driving force transmitting mechanism for transmitting a driving force to wheels, a steering mechanism for adjusting a rudder angle of a vehicle, a braking device for generating a braking force of a vehicle, or the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, to the body system control unit 12020, a radio wave transmitted from a portable device substituted for a key or signals of various switches can be input. The body system control unit 12020 receives input of the radio wave or signals and controls a door lock device, a power window device, a lamp, and the like of a vehicle.

The vehicle external information detection unit 12030 detects information outside a vehicle on which the vehicle control system 12000 is mounted. For example, to the vehicle external information detection unit 12030, an imaging unit 12031 is connected. The vehicle external information detection unit 12030 causes the imaging unit 12031 to image an image outside a vehicle and receives an imaged image. The vehicle external information detection unit 12030 may perform object detection processing or distance detection processing of a person, a car, an obstacle, a sign, a character on a road surface, or the like on the basis of the received image.

The imaging unit 12031 is a light sensor for receiving light and outputting an electric signal corresponding to the amount of light received. The imaging unit 12031 can output an electric signal as an image or output the electric signal as distance measurement information. Furthermore, the light received by the imaging unit 12031 may be visible light or invisible light such as infrared light.

The vehicle internal information detection unit 12040 detects information inside a vehicle. To the vehicle internal information detection unit 12040, for example, a driver state detection unit 12041 for detecting the state of a driver is connected. The driver state detection unit 12041 includes, for example, a camera for imaging a driver. The vehicle internal information detection unit 12040 may calculate the degree of fatigue or the degree of concentration of a driver or may determine whether the driver is dozing off on the basis of detection information input from the driver state detection unit 12041.

The microcomputer 12051 can calculate a control target value of a driving force generating device, a steering mechanism, or a braking device on the basis of information inside and outside a vehicle, acquired by the vehicle external information detection unit 12030 or the vehicle internal information detection unit 12040, and can output a control command to the drive system control unit 12010. For example, the microcomputer 12051 can perform cooperative control aiming at realizing a function of advanced driver assistance system (ADAS) including collision avoidance or impact mitigation of a vehicle, following travel based on inter-vehicle distance, vehicle speed maintenance travel, vehicle collision warning, vehicle lane departure warning, and the like.

Furthermore, the microcomputer 12051 can perform cooperative control aiming at, for example, automatic driving that autonomously travels without depending on driver's operation by controlling a driving force generating device, a steering mechanism, a braking device, or the like on the basis of information around a vehicle, acquired by the vehicle external information detection unit 12030 or the vehicle internal information detection unit 12040.

Furthermore, the microcomputer 12051 can output a control command to the body system control unit 12020 on the basis of vehicle external information acquired by the vehicle external information detection unit 12030. For example, the microcomputer 12051 can perform cooperative control aiming at antiglare such as switching from high beam to low beam by controlling a headlamp according to the position of a preceding vehicle or an oncoming vehicle detected by the vehicle external information detection unit 12030.

The audio image output unit 12052 transmits at least one of an audio output signal or an image output signal to an output device capable of visually or audibly notifying a passenger of a vehicle or the outside of the vehicle of information. In the example of FIG. 69, as the output device, an audio speaker 12061, a display unit 12062, and an instrument panel 12063 are illustrated. The display unit 12062 may include an on-board display and/or a head-up display, for example.

Figure 70:
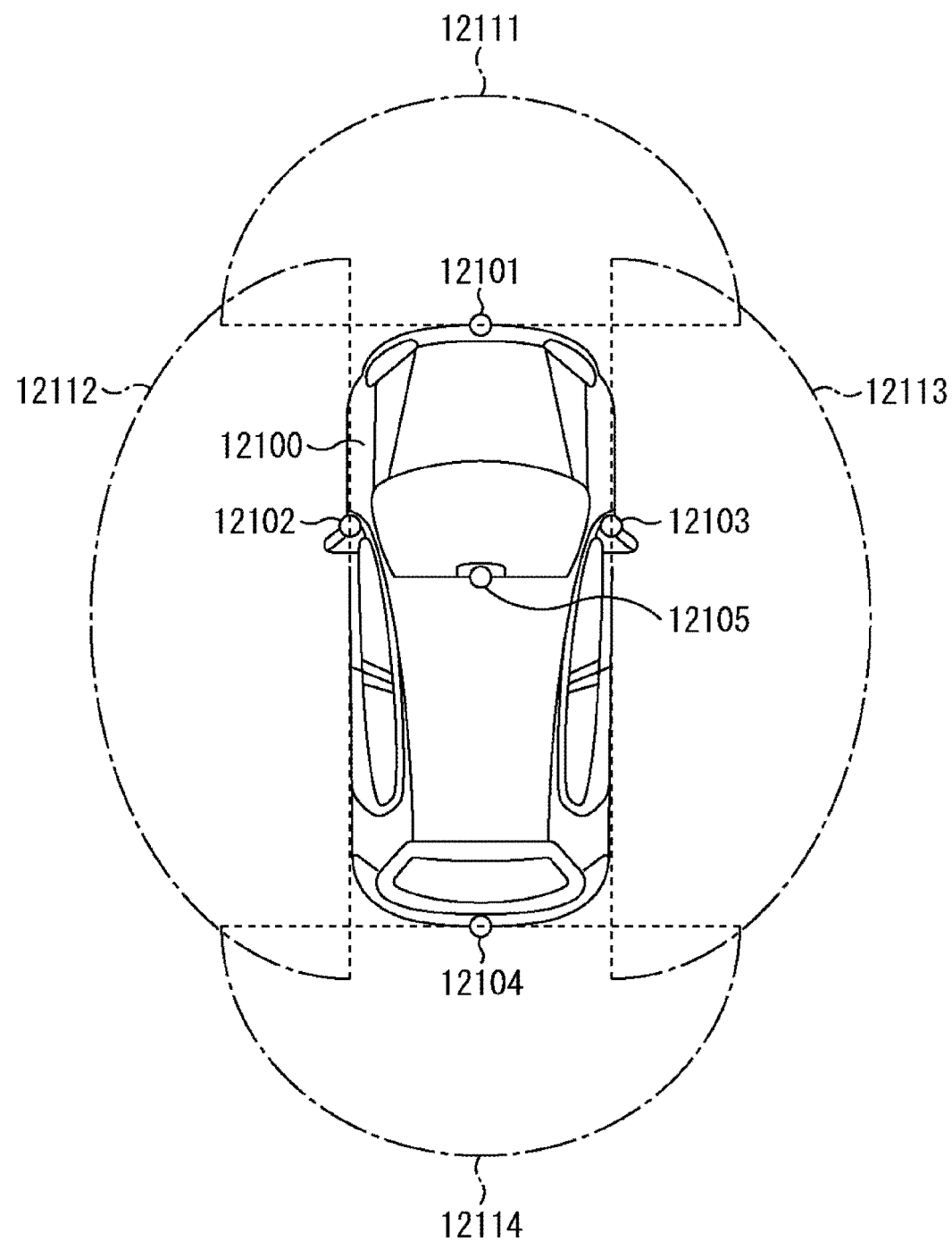
FIG. 70 is an explanatory diagram illustrating examples of installation positions of a vehicle external information detection unit and an imaging unit.

FIG. 70 is a diagram illustrating an example of an installation position of the imaging unit 12031.

In FIG. 70, the vehicle 12100 includes imaging units 12101, 12102, 12103, 12104, and 12105 as the imaging unit 12031.

The imaging units 12101, 12102, 12103, 12104, and 12105 are disposed, for example, in a front nose, a side mirror, a rear bumper, and a back door of the vehicle 12100, in an upper portion of a front glass in a passenger compartment, and the like. The imaging unit 12101 disposed in a front nose and the imaging unit 12105 disposed in an upper portion of a front glass in a passenger compartment mainly acquire images in front of the vehicle 12100. The imaging units 12102 and 12103 disposed in side mirrors mainly acquire images on sides of the vehicle 12100. The imaging unit 12104 disposed in a rear bumper or a back door mainly acquires an image behind the vehicle 12100. The front images acquired by the imaging units 12101 and 12105 are mainly used for detecting a preceding vehicle, a pedestrian, an obstacle, a traffic signal, a traffic sign, a lane, or the like.

Note that FIG. 70 illustrates examples of imaging ranges of the imaging units 12101 to 12104. An imaging range 12111 indicates an imaging range of the imaging unit 12101 disposed in a front nose. Imaging ranges 12112 and 12113 indicate imaging ranges of the imaging units 12102 and 12103 disposed in side mirrors, respectively. An imaging range 12114 indicates an imaging range of the imaging unit 12104 disposed in a rear bumper or a back door. For example, by superimposing image data imaged by the imaging units 12101 to 12104 on one another, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 determines a distance to each three-dimensional object in the imaging range 12111 to 12114 and a temporal change (relative speed with respect to the vehicle 12100) of the distance on the basis of the distance information obtained from the imaging units 12101 to 12104, and can thereby particularly extract a three-dimensional object which is the nearest three-dimensional object on a traveling path of the vehicle 12100 and is traveling at a predetermined speed (for example, 0 km/h or more) in substantially the same direction as the vehicle 12100 as a preceding vehicle. Moreover, the microcomputer 12051 can set an inter-vehicle distance to be secured in advance in front of the preceding vehicle, and can perform automatic brake control (including following stop control), automatic acceleration control (including following start control), and the like. In this way, it is possible to perform cooperative control aiming at, for example, automatic driving that autonomously travels without depending on driver's operation.

For example, the microcomputer 12051 classifies three-dimensional object data related to a three-dimensional object into a two-wheeled vehicle, a regular vehicle, a large vehicle, a pedestrian, and another three-dimensional object such as a telegraph pole on the basis of the distance information obtained from the imaging units 12101 to 12104 and extracts data, and can use the extracted data for automatic avoidance of an obstacle. For example, the microcomputer 12051 identifies an obstacle around the vehicle 12100 as an obstacle that a driver of the vehicle 12100 can see and an obstacle that is difficult to see. Then, the microcomputer 12051 judges a collision risk indicating a risk of collision with each obstacle. When the collision risk is higher than a set value and there is a possibility of collision, the microcomputer 12051 can perform driving assistance for avoiding collision by outputting an alarm to a driver via the audio speaker 12061 or the display unit 12062, or performing forced deceleration or avoiding steering via the drive system control unit 12010.

At least one of the imaging units 12101 to 12104 may be an infrared camera for detecting an infrared ray. For example, the microcomputer 12051 can recognize a pedestrian by determining whether or not a pedestrian exists in imaged images of the imaging units 12101 to 12104. Such recognition of a pedestrian is performed by, for example, a procedure of extracting characteristic points in imaged images of the imaging units 12101 to 12104 as infrared cameras and a procedure of performing pattern matching processing on a series of characteristic points indicating an outline of an object and determining whether or not a pedestrian exists. If the microcomputer 12051 determines that a pedestrian exists in imaged images of the imaging units 12101 to 12104 and recognizes a pedestrian, the audio image output unit 12052 controls the display unit 12062 such that the display unit 12062 superimposes and displays a rectangular contour line for emphasis on the recognized pedestrian. Furthermore, the audio image output unit 12052 may control the display unit 12062 such that the display unit 12062 displays an icon or the like indicating a pedestrian at a desired position.

An example of the vehicle control system to which the technology according to the present disclosure can be applied has been described above. The technology according to the present disclosure can be applied to the imaging unit 12031 (at least one of the imaging units 12101 to 12104) among the above-described configurations. Specifically, the solid-state imaging apparatus 31 of FIG. 3 can be applied to the imaging unit 12031. Application of the technology according to the present disclosure to the imaging unit 12031 makes it possible to suppress occurrence of color mixing between visible light pixels and between a visible light pixel and an infrared light pixel, and to suppress color separation and deterioration of S/N. Therefore, even if the imaging unit 12031 has a function of acquiring distance information, a more easily viewable imaged image can be obtained. Therefore, fatigue of a driver can be reduced.

Note that embodiments of the present technology are not limited to the above-described embodiments, and various modifications can be made to them without departing from the scope of the present technology.

Moreover, the present technology can have the following configurations.

(1)

A solid-state imaging apparatus including a plurality of pixels arranged in a pixel region, in which
each of the pixels has:
a first optical filter layer disposed on a photoelectric conversion unit;
a second optical filter layer disposed on the first optical filter layer; and
a separation wall separating at least a part of the first optical filter layer for each of the pixels, and
either the first optical filter layer or the second optical filter layer in at least one of the pixels is formed by an infrared cut filter, while the other is formed by a color filter.

(2)

The solid-state imaging apparatus according to (1), in which
the infrared cut filter includes an organic material to which an organic or inorganic color material is added.

(3)

The solid-state imaging apparatus according to (2), in which
the infrared cut filter has such spectral characteristics that the transmittance is 20% or less in a wavelength region of 700 nm or more.

(4)

The solid-state imaging apparatus according to (3), in which
the infrared cut filter has such spectral characteristics that an absorption maximum wavelength is present in a wavelength region of 700 nm or more.

(5)

The solid-state imaging apparatus according to any one of (1) to (4), in which
the infrared cut filter is also formed in a region other than the pixel region.

(6)

The solid-state imaging apparatus according to any one of (1) to (5), in which
the separation wall is formed by at least one of a metal film and a Si oxide film.

(7)

The solid-state imaging apparatus according to (6), in which
the separation wall includes an organic resin having a refractive index equal to or lower than that of the color filter.

(8)

The solid-state imaging apparatus according to (6), in which
the separation wall includes an organic resin containing a filler.

(9)

The solid-state imaging apparatus according to any one of (6) to (8), in which
the height of the separation wall is at least 100 nm or more.

(10)

The solid-state imaging apparatus according to any one of (1) to (9), in which
the pixels further include another separation wall separating the photoelectric conversion unit for each of the pixels.

(11)

The solid-state imaging apparatus according to (10), in which
the other separation wall is formed integrally with the separation wall.

(12)

The solid-state imaging apparatus according to any one of (1) to (11), including only visible light pixels as the plurality of pixels.

(13)

The solid-state imaging apparatus according to any one of (1) to (11), including a visible light pixel and an infrared light pixel as the plurality of pixels, in which
either the first optical filter layer or the second optical filter layer in the visible light pixel is formed by an infrared cut filter, while the other is formed by a color filter.

(14)

The solid-state imaging apparatus according to (13), in which
each of the first optical filter layer and the second optical filter layer of the infrared light pixel is formed by a color filter that transmits infrared light.

(15)

The solid-state imaging apparatus according to (14), in which
the two color filters in the infrared light pixel have such spectral characteristics that the transmittance is 20% or less in a wavelength region of 400 to 700 nm, and the transmittance is 80% in a wavelength region of 700 nm or more.

(16)

The solid-state imaging apparatus according to (15), in which
the first optical filter layer and the second optical filter layer are color filters of the same type.

(17)

The solid-state imaging apparatus according to (15), in which
the first optical filter layer and the second optical filter layer are color filters of different types.

(18)

A method for manufacturing a solid-state imaging apparatus including a plurality of pixels arranged in a pixel region,
each of the pixels having:
a first optical filter layer disposed on a photoelectric conversion unit;
a second optical filter layer disposed on the first optical filter layer; and
a separation wall separating at least a part of the first optical filter layer for each of the pixels,
the method including:
forming the separation wall;
forming the first optical filter layer; and
forming the second optical filter layer, in which
either the first optical filter layer or the second optical filter layer in at least one of the pixels is formed by an infrared cut filter, while the other is formed by a color filter.

(19)

An electronic device including a solid-state imaging apparatus including a plurality of pixels arranged in a pixel region, in which
each of the pixels has:
a first optical filter layer disposed on a photoelectric conversion unit;
a second optical filter layer disposed on the first optical filter layer; and
a separation wall separating at least a part of the first optical filter layer for each of the pixels, and
either the first optical filter layer or the second optical filter layer in at least one of the pixels is formed by an infrared cut filter, while the other is formed by a color filter.

REFERENCE SIGNS LIST

31 Solid-state imaging apparatus
32 Pixel
33 Pixel region
51 Visible light pixel
52 Infrared light pixel
61 Semiconductor substrate
62 Photoelectric conversion unit
63 Infrared light cut filter
64 Color filter
65 Separation wall
66 Color filter
67 Microlens
301 Image processing apparatus
313 Image sensor
5001 Electronic device
5013 Image sensor

What is claimed is:

1. A solid-state imaging apparatus comprising a plurality of pixels arranged in a pixel region, wherein
each of the pixels has:
a first optical filter layer disposed on a photoelectric conversion unit;
a second optical filter layer disposed on the first optical filter layer;
a separation wall separating at least a part of the first optical filter layer for each of the pixels without separating the photoelectric conversion units and without separating the second optical filter layer from each other for each of the pixels,
wherein the separation wall comprises a metal core with a height smaller than a height of an oxide film provided within the separation wall; and
either the first optical filter layer or the second optical filter layer in at least one of the pixels is formed by an infrared cut filter, while another is formed by a color filter.

2. The solid-state imaging apparatus according to claim 1, wherein
the infrared cut filter includes an organic material to which an organic or inorganic color material is added.

3. The solid-state imaging apparatus according to claim 2, wherein
the infrared cut filter has such spectral characteristics that a transmittance is 20% or less in a wavelength region of 700 nm or more.

4. The solid-state imaging apparatus according to claim 3, wherein
the infrared cut filter has such spectral characteristics that an absorption maximum wavelength is present in a wavelength region of 700 nm or more.

5. The solid-state imaging apparatus according to claim 1, wherein
the infrared cut filter is also formed in a region other than the pixel region.

6. The solid-state imaging apparatus according to claim wherein
the separation wall includes an organic resin having a refractive index equal to or lower than that of the color filter.

7. The solid-state imaging apparatus according to claim wherein
the separation wall includes an organic resin containing a filler.

8. The solid-state imaging apparatus according to claim wherein
a height of the separation wall is at least 100 nm or more.

9. The solid-state imaging apparatus according to claim 1, comprising only visible light pixels as the plurality of pixels.

10. The solid-state imaging apparatus according to claim 1, comprising a visible light pixel and an infrared light pixel as the plurality of pixels, wherein
either the first optical filter layer or the second optical filter layer in the visible light pixel is formed by an infrared cut filter, while the other is formed by a color filter.

11. The solid-state imaging apparatus according to claim 10, wherein
each of the first optical filter layer and the second optical filter layer of the infrared light pixel is formed by a color filter that transmits infrared light.

12. The solid-state imaging apparatus according to claim 11, wherein
the two color filters in the infrared light pixel have such spectral characteristics that a transmittance is 20% or less in a wavelength region of 400 to 700 nm, and a transmittance is 80% in a wavelength region of 700 nm or more.

13. The solid-state imaging apparatus according to claim 12, wherein
the first optical filter layer and the second optical filter layer are color filters of a same type.

14. The solid-state imaging apparatus according to claim 12, wherein
the first optical filter layer and the second optical filter layer are color filters of different types.

15. A method for manufacturing a solid-state imaging apparatus including a plurality of pixels arranged in a pixel region, each of the pixels having:
a first optical filter layer disposed on a photoelectric conversion unit;
a second optical filter layer disposed on the first optical filter layer; and
a separation wall separating at least a part of the first optical filter layer for each of the pixels without separating the photoelectric conversion units and without separating the second optical filter layer from each other for each of the pixels,
wherein the separation wall comprises a metal core with a height smaller than a height of an oxide film provided within the separation wall,
the method comprising:
forming the separation wall;
forming the first optical filter layer; and
forming the second optical filter layer, wherein
either the first optical filter layer or the second optical filter layer in at least one of the pixels is formed by an infrared cut filter, while another is formed by a color filter.

16. An electronic device comprising a solid-state imaging apparatus including a plurality of pixels arranged in a pixel region, wherein
each of the pixels has:
a first optical filter layer disposed on a photoelectric conversion unit;
a second optical filter layer disposed on the first optical filter layer;
a separation wall separating at least a part of the first optical filter layer for each of the pixels without separating the photoelectric conversion units and without separating the second optical filter layer from each other for each of the pixels,
wherein the separation wall comprises a metal core with a height smaller than a height of an oxide film provided within the separation wall; and
either the first optical filter layer or the second optical filter layer in at least one of the pixels is formed by an infrared cut filter, while another is formed by a color filter.

17. The electronic device according to claim 16, wherein the infrared cut filter includes an organic material to which an organic or inorganic color material is added.

18. The electronic device according to claim 17, wherein the infrared cut filter has such spectral characteristics that a transmittance is 20% or less in a wavelength region of 700 nm or more.

19. The electronic device according to claim 18, wherein the infrared cut filter has such spectral characteristics that an absorption maximum wavelength is present in a wavelength region of 700 nm or more.

20. The electronic device according to claim 17, wherein the separation wall includes an organic resin containing a filler.

* * * * *

UNITED STATES PATENT AND TRADEMARK OFFICE
CERTIFICATE OF CORRECTION

| | | |
|---|---|---|
| PATENT NO. | : 11,069,730 B2 | Page 1 of 1 |
| APPLICATION NO. | : 16/326806 | |
| DATED | : July 20, 2021 | |
| INVENTOR(S) | : Sintaro Nakajiki and Yukihiro Sayama | |

It is certified that error appears in the above-identified patent and that said Letters Patent is hereby corrected as shown below:

In the Claims

Column 38, Lines 31-42, should read:
6. The solid-state imaging apparatus according to claim 1, wherein
the separation wall includes an organic resin having a refractive index equal to or lower than that of the color filter.

7. The solid-state imaging apparatus according to claim 1, wherein
the separation wall includes an organic resin containing a filler.

8. The solid-state imaging apparatus according to claim 1, wherein
a height of the separation wall is at least 100 nm or more.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*